United States Patent [19]
Matsuyama et al.

[11] Patent Number: 5,510,151
[45] Date of Patent: Apr. 23, 1996

[54] CONTINUOUS FILM-FORMING PROCESS USING MICROWAVE ENERGY IN A MOVING SUBSTRATE WEB FUNCTIONING AS A SUBSTRATE AND PLASMA GENERATING SPACE

[75] Inventors: Jinsho Matsuyama; Toshimitsu Kariya; Yasushi Fujioka; Tetsuya Takei; Katsumi Nakagawa, all of Nagahama; Masahiro Kanai; Hiroshi Echizen, both of Tokyo, all of Japan

[73] Assignee: Canon Kabushiki Kaisha, Tokyo, Japan

[21] Appl. No.: 943,991

[22] Filed: Sep. 11, 1992

Related U.S. Application Data

[63] Continuation of Ser. No. 542,512, Jun. 22, 1990, abandoned.

[30] Foreign Application Priority Data

Jun. 28, 1989 [JP] Japan .................................. 1-166230
Aug. 14, 1989 [JP] Japan .................................. 1-207851

[51] Int. Cl.$^6$ .................................................. C23C 16/00
[52] U.S. Cl. ............................ 427/509; 427/575; 427/58; 427/248.1
[58] Field of Search .............................. 427/509, 575, 427/58, 248.1

[56] References Cited

U.S. PATENT DOCUMENTS

| | | | |
|---|---|---|---|
| 3,814,983 | 6/1974 | Weissfloch et al. | 315/39 |
| 4,400,409 | 8/1983 | Izu et al. | 427/39 |
| 4,504,518 | 3/1985 | Ovshinsky et al. | 427/38 |
| 4,517,223 | 5/1985 | Ovshinsky et al. | 427/39 |
| 4,521,717 | 6/1985 | Kieser | 315/39 |
| 4,723,507 | 2/1988 | Ovshinsky et al. | 118/723 |
| 4,729,341 | 3/1988 | Fournier et al. | 427/39 |
| 4,740,385 | 4/1988 | Feuerstein et al. | 427/38 |
| 4,897,284 | 1/1990 | Arai et al. | 427/39 |
| 4,930,442 | 6/1990 | Iida et al. | 118/723 |
| 4,995,341 | 2/1991 | Matsuyama | 118/723 |

FOREIGN PATENT DOCUMENTS

| | | |
|---|---|---|
| 55-141729 | 11/1980 | Japan . |
| 57-133636 | 8/1982 | Japan . |
| 61-288074 | 12/1986 | Japan . |

OTHER PUBLICATIONS

"The performance of a microwave ion source immersed in a multicusp static magnetic field," M. Dahimene et al., J. Vac. Sci, Technol. B4(1), Jan./Feb. 1986, pp. 126–130.
"Low temperature oxidation of silicon using a microwave plasma disk source," T. Roppel et al., J. Vac. Sci. Technol. B4(1), Jan./Feb. 1986, pp. 295–298.

Primary Examiner—Benjamin L. Utech
Attorney, Agent, or Firm—Fitzpatrick, Cella, Harper & Scinto

[57] ABSTRACT

A microwave plasma CVD method for continuously forming a large area and length functional deposited film, the method comprises: continuously moving a substrate web in the longitudinal direction by paying out it by a pay-out mechanism and taking it up by a take-up mechanism; establishing a substantially enclosed film-forming chamber by curving and projecting the moving substrate web to form a columnar portion to be the circumferential wall of the film-forming chamber as the substrate is moving from the pay-out mechanism toward the take-up mechanism; introducing a film-forming raw material gas through a gas feeder into the film-forming chamber; and simultaneously, radiating a microwave energy in the film-forming chamber by using a microwave applicator, which is so designed that it can radiate a microwave energy in the direction parallel to the microwave propagating direction, to generate plasma in the film-forming chamber, thereby continuously forming a deposited film on the inner wall face of the continuously moving circumferential wall exposed to the plasma.

21 Claims, 22 Drawing Sheets

CONTINUOUS FILM-FORMING PROCESS USING MICROWAVE ENERGY IN A MOVING SUBSTRATE WEB FUNCTIONING AS A SUBSTRATE AND PLASMA GENERATING SPACE

This application is a continuation of application Ser. No. 07/542,512 filed Jun. 22, 1990 now abandoned.

FIELD OF THE INVENTION

The present invention relates to a process for continuously forming a large area functional deposited film by sustaining a substantially uniform microwave plasma over a large area to cause plasma reactions by which a film-forming raw material gas is excited and decomposed, and to an apparatus suitable for practicing said process. More particularly, the present invention relates to a process for continuously forming a large area functional deposited film of uniform thickness with a markedly improved gas utilization efficiency of a film-forming raw material gas and at a high deposition rate by microwave PCVD method and to an apparatus suitable for practicing said process. The process and the apparatus enable one to mass-produce large area thin film semiconductor devices such as photovoltaic device at a reduced cost.

BACKGROUND OF THE INVENTION

Along with a marked power generation in order to meet an increased demand for power supply in the recent years, problems of environmental pollution have become serious in the world.

In fact, for the generation of atomic power system which has been anticipated as a power generation system capable of replacing the steam-power generation system and which has been in operation in some places of the world, there were occurence where systems were broken down and caused radioactive contamination on living things including human. Because of this, there is a fear for further development of the generation of atomic power system. And there are some countries that have already prohibited any newly established atomic power plants.

Now, in the case of the generation of steam power, the amount of a fossil fuel represented by coal or petroleum consumed for generation of power in order to comply with the social demand for power supply has continuously increased. Along with this, the amount of exhaust fumes from the steam-power generation plants has continuously increased accordingly resulting in an increase in to the content of gases to cause a greenhouse effect such as carbon dioxide gas in the air. This results in providing an earth-warming phenomenon. In fact, the annual average temperature of the earth has been heightened in recent years. In order to prevent said earth-warming phenomenon from further developing, the International Energy Agency has proposed reducing the amount of carbon dioxide exhausted from the steam-power generation plant by as much as 20% of the current level by the year of 2005.

Against this background, there is a situation that the populations of the developing countries will continue to increase and along with this, a demand for power supply will be increased. In addition to this, it is expected that the manner of living in the developed countries will be further modernized with further developments in electronic instruments, and along with this, the amount of power consumption per person will be eventually increased.

In view of the above, the matter of power supply is now a subject to be internationally discussed in terms of the earth.

Under this situation, public attention has now focused on and various studies have been made on the power generation system using a solar cell since it has various advantages: it is a clean power generation system which is free of the foregoing problems relating to the radioactive contamination, earth-warming and environmental pollution; the sunlight to be used as its energy source reaches everywhere on the earth and it is not a problem for the energy source to be localized; and the power generation equipment can be simplified and a relatively high power generation efficiency can be attained.

Now, in order for the solar cell power generation system to be made such that it can supply a power in a quantity to satisfy the social demand, it is basically required that the solar cell to be used can provide a sufficiently high photoelectric conversion efficiency, it can stably exhibit the solar cell characteristics and it can be mass-produced.

In order to provide the average family with the power to be consumed, a solar cell capable of outputting a power of about 3 KW is necessary. In this case, the photoelectric conversion efficiency of the solar cell should be about 10%. The solar cell is required to have an area of about 30 $m^2$ in order to provide said power. And in the case where it is intended to satisfy the demands for power supply for 100,000 families, the solar cell is required to have an area of 3,000,000 $m^2$.

In view of this, public attention has been focused on an amorphous silicon solar cell which is prepared by depositing a semiconductor film such as an amorphous silicon semiconductor film on a relatively inexpensive substrate such as glass or metal sheet wherein glow charge is caused in a film-forming raw material gas such as silane gas, with the viewpoint that it can be mass-produced and it can be provided at a lower cost in comparison with a single crystal silicon solar cell. And various proposals have been made on said amorphous silicon solar cell.

In the case of the power generation system using a solar cell, there is usually such a system employed in which a plurality of unit modules are connected in series or in a row to be a unit from which a desired current or voltage can be obtained. For each of said plurality of modules, it is required that neither disconnection nor shunt circuit occur. It is further required that each of said plurality modules stably outputs an even current or voltage. In order to satisfy these requirements, each unit module is necessarily prepared to be such that its constituent semiconductor layer being a most important element be ensured of stably exhibiting uniform characteristics required therefor.

Further, in the viewpoint of making it easy to design the module and also in the view point of simplifying the process for assembling a plurality of unit modules to a unit, it is essential to provide a large area semiconductor film having an uniformity not only in thickness but also in quality and capable of exhibiting uniform semiconductor characteristics. These lead to enabling the mass-production of a solar cell and to great reduction in the production cost.

Now, in the solar cell, its constituent semiconductor layers, which are basically important constituent elements thereof, are conjugated to form a semiconductor junction such as pn junction or pin junction. These semiconductor junctions can be attained by stacking different semiconductor layers respectively having a different conduction type one from another, or by ion-implanting or thermally diffusing a dopant of a different conduction type into one of the constituent semiconductor layers of the same conduction type.

This situation is to be more detailed in the case of the foregoing amorphous silicon solar cell. It is known that glow discharge is caused in a gas mixture composed of a film-forming raw material gas such as silane gas ($SiH_4$) and a raw material gas capable of supplying an element to be a dopant such as phosphine ($PH_3$) or diborane ($B_2H_6$) to form a semiconductor film having a desired conduction type. When a plurality of semiconductor films respectively having a different conduction type are formed successively on a substrate in this manner, these semiconductor films are conjugated to form a desired semiconductor junction. In view of this, various proposals have been made that respective constituent semiconductor layers are separately formed in the respective independent film-forming chambers to stack them on a substrate to form a desired semiconductor junction between the each pair of the semiconductor layers stacked whereby obtaining an amorphous silicon solar cell.

For instance, the specification of U.S. Pat. No. 4,400,409 discloses a continuous plasma CVD apparatus wherein the so-called roll to roll system is employed. The continuous plasma CVD apparatus comprises a plurality of RF glow discharge regions through each of which regions a substrate web on which a film is to be formed being moved. The specification describes that said apparatus makes it possible to prepare an element having one or more semiconductor junctions by forming a semiconductor film of a desired conduction type on said substrate web in each of said plurality of RF glow discharge regions while moving said substrate web. The specification describes that a gas gate is provided between the adjacent glow discharge regions in order to prevent a raw material gas to be used in one glow discharge region from entering into the other glow discharge region. In more detail in this respect, said plurality of glow discharge regions are isolated one from the other by an isolation passage way provided with means for forming a cleaning gas stream of Ar, $H_2$, etc. It can be said that this roll to roll plasma CVD apparatus will be suitable for the mass-production of a semiconductor device. However, this roll to roll plasma CVD apparatus is problematic in the case of mass-producing a semiconductor device with a plurality of semiconductor junctions since each of the constituent semiconductor layers is formed by the plasma CVD method using a RF energy. There is a limit for continuously forming those constituent semiconductor layers at a high deposition rate while maintaining the characteristics desired for each of those constituent semiconductor layers. That is, even in the case of forming a thin semiconductor layer of, for example, about 5000 Å, it is necessary to always sustain a substantially uniform plasma over a large area. However in this roll to roll plasma CVD apparatus, there are many correlated film-forming parameters which are difficult to generalize and well-skilled technics are required to do so. In addition to this, there are still other unresolved problems for the roll to roll plasma CVD apparatus in that the decomposition rate and the utilization efficiency of a film-forming raw material gas are not sufficient and thus the product becomes unavoidably costly.

Japanese Unexamined Patent Publication Sho. 61(1986)-288074 discloses a roll to roll film-forming apparatus comprising a reaction chamber containing a hood-like curtaining portion of a flexible substrate web which is delivered by a pay-out mechanism and taken up by a take-up mechanism, said reaction chamber having a reaction space circumscribed by said hood-like curtaining portions and said reaction chamber being provided with at least an activation chamber isolated from said reaction chamber. The film formation by this apparatus is carried out by introducing active species formed in said activation chamber and if necessary, other film-forming raw material gas into said reaction space, wherein they are chemically reacted with the action of a heat energy to form a deposited film on the inner surface of said hood-like curtaining portion positioned in said reaction chamber. This roll to roll film-forming apparatus is advantageous in the viewpoints that the apparatus can be relatively compact and the deposition rate of a film to be formed may be improved because of using an active species in comparison with the known plasma CVD apparatus.

The film formation by this roll to roll film-forming apparatus utilizes chemical reaction to cause film-formation with the aid of a heat energy. Therefore, when the deposition rate of a film to be formed is desired to be heightened, it is necessary to increase not only the flow rate of an active species to be introduced into the reaction space but also the quantity of a heat energy to be supplied thereinto. However, it is extremely difficult to do so since there is a limit not only for the manner of generating a large amount of the active species in the activation chamber and sufficiently introducing the active species into the reaction space at a high flow rate without leakage but also for uniformly supplying a large quantity of the heat energy into the reaction space.

In recent years, a plasma CVD method using microwave glow discharge decomposition, namely, a microwave plasma CVD method (which will be hereinafter referred to as "MW-PCVD method") has been noticed on the industrial scale since the MW-PCVD method has various advantages which cannot be attained by the RF glow discharge decomposition method that it is possible to heighten the energy density, to effectively generate a plasma and to maintain the plasma in a desired state.

For instance, the specifications of U.S. Pat. Nos. 4,504,518 and 4,517,223 describe processes for forming deposited thin films on small area substrates in a microwave glow discharge plasma under a low pressure condition. These two patent specifications describe that because the processes are conducted under the low pressure condition, any of these processes makes it possible to obtain a high quality deposited film at a remarkably high deposition rate while eliminating not only polymerization of active species which gives negative effects to the characteristics of a film to be formed but also formation of powder such as polysilane in the plasma. However, any of these two patent specifications does not mention anything about uniform deposition of a film over a large area.

The specification of U.S. Pat. No. 4,729,341 discloses a low pressure microwave plasma CVD method and an apparatus suitable for practicing the same, wherein a photoconductive semiconductor thin film is deposited on a large area cylindrical substrate using a pair of radiative waveguide applicators in a high power process. However, the principles of large area film deposition are limited to cylindrical substrates for electrophotographic photoreceptors, and the teachings described therein are not directly transferable to planar substrates of large area. Further, the film-forming process is to be practiced in a batch system and the amount of film products obtained by one batch is limited. The specification does not teach anything about continuous film deposition on a large area planar substrate.

Now, there still remain various problems to be solved for large area film deposition by the MW-PCVD method because non-uniformity of a microwave energy is apt to occur in microwave plasma due to the wavelength of a microwave being short. For instance in this respect, there is an attempt to use a slow microwave structure in order to provide uniformity of the microwave energy. However, there is an inherent problem in the slow microwave structure in that there is the very rapid fall off of microwave coupling into the plasma as a function of distance transverse to the microwave applicator. In order to solve this problem, a proposal has been made that the spacing of the slow microwave structure from a substrate to be processed is varied to thereby make the energy density at the surface of the substrate uniform along the direction of movement of the substrate.

For example, such proposal can be found in the specification of U.S. Pat. No. 3,814,983 or the specification of U.S. Pat. No. 4,521,717. More particularly, the former patent specification discloses that it is necessary to incline the slow wave structure at a certain angle with respect to the substrate. However, inclination of the slow wave structure leads to an insufficient coupling of a microwave energy into the plasma.

The latter patent specification discloses the use of two slow wave structures in an anti-parallel arrangement but in parallel to the substrate. More particularly, the latter patent specification discloses: that it is desirable to set the two slow wave applicators at an angle to each other so that the planes normal to the medians of the applicators intersect at a straight line which extends parallel to the surfaces of the substrate to be processed and at right angles to the travel direction of the substrate; and that in order to avoid structive interference between the two slow wave applicators, it is desirable to displace the two slow wave applicators from each other traversly of the travel direction of the substrate by a distance equal to half of the space between the cross-bars of the waveguide.

There have been several proposals made in order to provide plasma uniformity and more particularly, energy uniformity as found, for example, in J. Vac. Sci. Tech. B-4 (January–February 1986) PP. 126–130 and PP. 295–298. These reports describe a microwave reactor called a microwave plasma disc source (MPDS) and that the plasma is in the shape of a disc or tablet, with a diameter that is a function of microwave frequency. More particularly, the reports describe that: the plasma disc source can be varied with the frequency of microwave; however, in the case of a microwave plasma disc source which is designed for operation at the normal microwave frequency of 2.45 GHz, the plasma confined diameter is about 10 centimeters at the most and the plasma volume is about 118 cm$^3$ at the most, thus this is far from a large surface area; in the case of a system designed for operation at the lower frequency of 915 MHz, the lower frequency source would provide a plasma diameter of approximately 40 cm with a plasma volume of 2000 cm$^3$; and the microwave plasma disc source can be scaled up to discharge diameters in excess of 1 m by operating at still lower frequencies, for example 40 MHz, however extreme expenses are required to establish such an apparatus which can perform this.

In order to effectively provide high density plasma using microwave, there have been manners proposal to establish the electron cyclotron resonance condition (namely, the ECR condition) by arranging electro-magnets around the cavity resonator as found in Japanese Unexamined Patent Publications Sho. 55(1980)-141729 and Sho. 57(1982)-133636. And at academic meetings, etc., methods have been reported of forming various semiconductor thin films by utilizing high density plasma and some microwave ECR plasma CVD apparatus capable of performing such methods have been commercialized.

However, it has been generally recognized in the technical field to which the invention pertains that it is technically difficult to form a deposited film uniformly over a large area substrate because of non-uniformity of plasma caused by the wavelength of microwave and also because of non-uniformity of magnetic field distribution due to the use of the magnets for the control of plasma. In the case where the microwave ECR plasma CVD apparatus is intended to scale up so that film deposition over a large area can be done, there are various problems to be solved before hand such that electro-magnets to be used are necessary to also be scaled up; means for preventing the apparatus from overheating is necessary to be provided; a special DC high power regulated supply is necessary to be provided; and the like.

Further, the deposited film obtained by the known microwave ECR plasma CVD method is usually inferior to the deposited film obtained by the known RF plasma CVD method with respect to the film property. Further in addition, in the case of forming a deposited film on a substrate by the microwave ECR plasma CVD method, there is a distinguishable difference with respect to the film deposition rate and the film property between the film formed in the space where the ECR condition is established and the film formed in the space where the ECR condition is not established, in the dispersed magnetic field space in other words. In view of this, the microwave ECR plasma CVD method is not suitable for the preparation of such a semiconductor device that is required to excel in quality and in uniformity with respect to the characteristics to be provided.

The foregoing U.S. Pat. Nos. 4,517,233 and 4,729,341 describe the necessity of maintaining very low pressures in order to provide high density plasmas. That is, they describe that the use of low pressures is necessary in order to obtain a high film deposition rate and/or high gas utilization efficiency.

However, any of the foregoing slow wave structure and electron cyclotron resonance method is not sufficient in order to maintain the relationships among high film deposition rate, high gas utilization efficiency, high power density and low pressure.

In view of what was, described above, there is an increased demand for eliminating the foregoing problems of the known microwave plasma CVD method and providing an improved microwave plasma CVD process which is free of such problems.

There is also another demand for providing a large area or lengthy thin semiconductor film excelling in quality and uniformity of characteristics which is desirably usable in not only solar cells but also in semiconductor devices such as TFTs, photoelectric conversion elements for contact image sensors, switching elements, image input line sensors, etc. at a reduced cost.

SUMMARY OF THE INVENTION

The principal object of the present invention is to eliminate the foregoing problems of the known microwave plasma CVD method and apparatus and to provide an improved microwave plasma CVD method and apparatus which enable to continuously deposit a semiconductor film uniformly over a large area substrate at a high deposition rate and which satisfies the foregoing demands.

Another object of the present invention is to provide an improved microwave plasma CVD method and apparatus which enables continuously depositing a high quality semiconductor film on a large area substrate web.

A further object of the present invention is to provide an improved microwave plasma CVD method and apparatus which enable to mass-produce a thin film semiconductor device with a high gas utilization efficiency at a reduced cost.

A further object of the present invention is to provide an improved microwave plasma CVD method and apparatus which enables providing uniform microwave plasma over a large area and volume and to continuously form a high quality large area semiconductor film having an uniform thickness, which stably exhibits the characteristics as desired and is usable in various semiconductor devices.

A further object of the present invention is to provide an improved microwave plasma CVD method and apparatus which enables continuously and stably forming a photovoltaic element on a lengthy substrate of relatively large width which provides a high photoelectric conversion efficiently with a high yield.

A further object of the present invention is to provide an improved method and apparatus which enables to stably and repeatedly maintaining the potential of microwave plasma to be formed over a large area and volume in an uniform state.

A further object of the present invention is to provide an improved method and apparatus which enables properly controlling the potential of microwave plasma in a desired state to continuously form a high quality semiconductor film which uniformly exhibits the characteristics as desired.

The present invention attains the above objects and includes an improved microwave plasma CVD method ("microwave plasma CVD method" will be hereinafter referred to as "MW-PCVD method") and an apparatus suitable for practicing said MW-PCVD method.

The MW-PCVD method according to the present invention comprises: continuously moving a substrate web delivered from a pay-out mechanism in the longitudinal direction toward a take-up mechanism; establishing a columnar film-forming space by curving said moving substrate web to form its circumferential wall as said substrate moving toward said take-up mechanism; introducing a film-forming raw material gas through a gas feed means into said film-forming space; simultaneously, radiating a microwave energy into said film forming space by a microwave applicator means capable of radiating a microwave energy in the direction parallel to the microwave propagating direction to generate microwave plasma in said film-forming space, whereby forming a deposited film on the inner wall face of said continuously moving circumferential wall to be exposed to said microwave plasma.

The MW-PCVD apparatus according to the present invention is suitable for practicing the above MW-PCVD method and it comprises: a substantially enclosed columnar film-forming chamber having a curved circumferential wall formed by curving and projecting a substrate web which is delivered by a pay-out mechanism and is moved in the longitudinal direction toward a take-up mechanism as said substrate is moving toward said take-up mechanism by a pair of means for curving said substrate web; a microwave applicator means capable of radiating a microwave energy into said film-forming chamber in the direction parallel to the microwave propagating direction and generating microwave plasma in said film-forming chamber; means for evacuating the inside of said film-forming chamber; and means for supplying a film-forming raw material gas into said film-forming chamber.

In the present invention, a substrate on which a film is to be formed comprises a large area and lengthy substrate web which is delivered by a pay-out mechanism, continuously moving in the longitudinal direction toward a take-up mechanism and taken up by said take-up mechanism, and said substrate web constitutes the circumferential wall of the film-forming space. In the film-forming space, a film-forming raw material gas is supplied and a microwave energy is applied in the width direction of said circumferential wall comprising said moving substrate web and in the direction parallel to the microwave propagating direction by the foregoing microwave applicator means to thereby generate microwave plasma, and the microwave plasma generated is confined within the film-forming space. Thus, a desirable high quality semiconductor film is uniformly and continuously formed on a large area and lengthy substrate.

Further, in the present invention, microwave plasma is stably and repeatedly generated in a desired state, and the microwave plasma generated is confined in a stable state within the film-forming space. Because of this, the gas utilization efficiency is markedly heightened.

According to the present invention, it is possible to uniformly and continuously form a high quality semiconductor film having a thickness as desired over a large area by varying the shape of the curved portion comprising the moving substrate web to be the circumferential wall of the film-forming space or the length of said curved portion or the moving speed of the substrate web.

According to the present invention, it is possible to continuously form a desirable high quality film having an uniform thickness and which stably exhibits the characteristics desired therefor on a large area and lengthy web substrate. Thus, it is possible to mass-produce a large area solar cell at a reduced cost.

According to the present invention, as a high quality semiconductor film can be continuously formed without suspending discharge, it is possible to mass-produce a multi-layered semiconductor device excelling in interface characteristics.

According to the present invention, film formation can be achieved under a low pressure condition while eliminating powder and polymeric formations in the microwave plasma. Thus, remarkable reduction in defects and extreme improvements in the film property and in the stability of said film property can be attained for a semiconductor film The rate of operation and the yield are heightened. As a result, it becomes possible to mass-produce an inexpensive solar cell having a high photoelectric conversion efficiency.

The solar cell to be prepared by the present invention stably exhibits a desirably high photoelectric conversion efficiency without deterioration even upon repeating use for a long period of time.

DETAILED DESCRIPTION OF THE INVENTION

Figure 1:
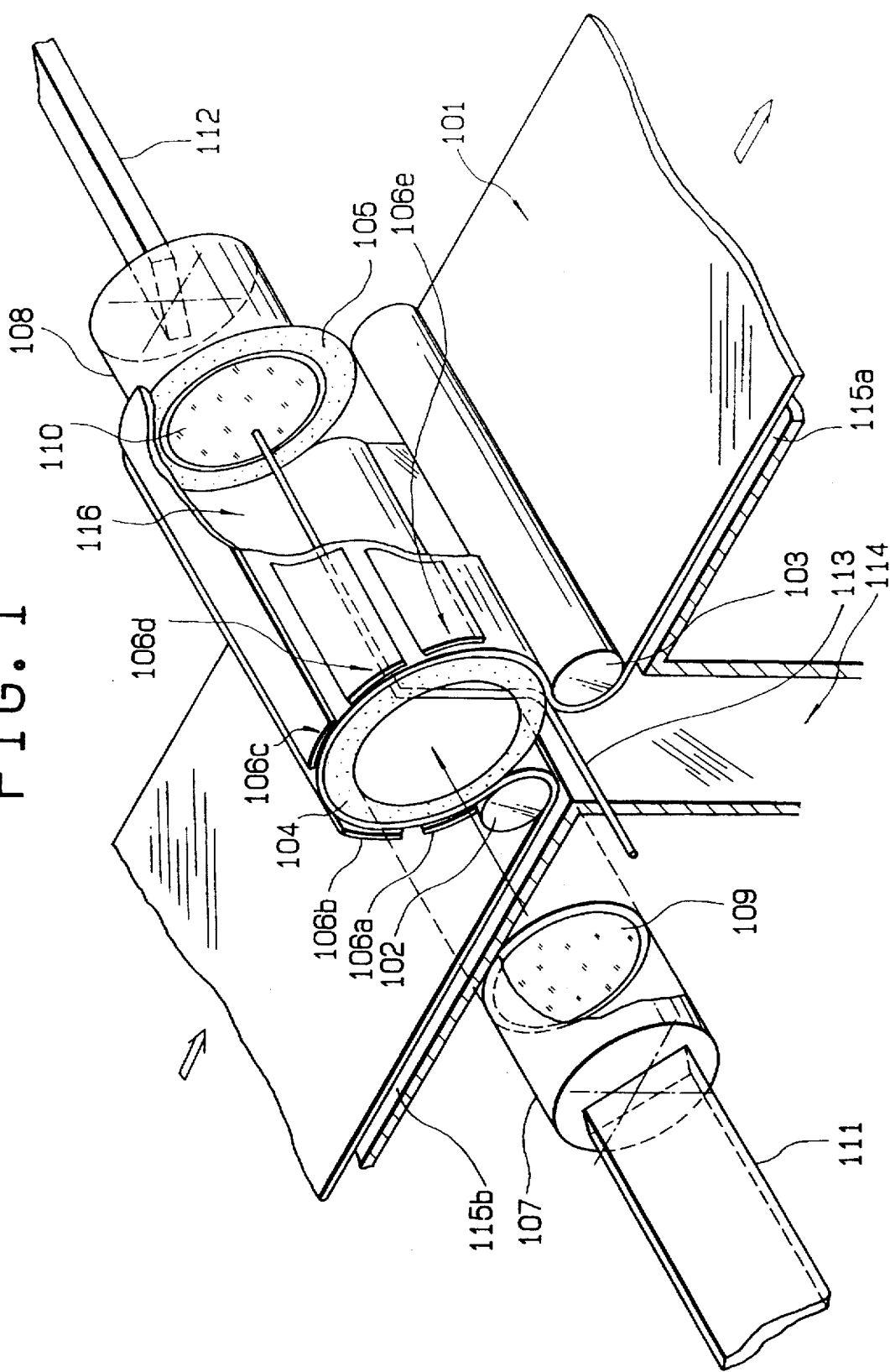
FIG. 1 is a schematic diagram illustrating the constitution of a first representative embodiment of the MW-PCVD apparatus according to the present invention.

The present inventors have made earnest studies for overcoming the foregoing various problems in the known MW-PCVD process and MW-PCVD apparatus for forming a deposited film and for attaining the objects of the present invention, and as a result, have obtained a knowledge that uniform microwave plasma can be provided in the width direction over a large area and lengthy substrate on which a film is to be formed.

In the experimental studies, the present inventors have made a film-forming chamber having a circumferential wall comprising a web member which is longitudinally moving between a pay-out mechanism and a take-up mechanism. That is, a SUS 430 BA (stainless steel) web member reeled on the pay-out mechanism was provided. The web member was paid out from the pay-out mechanism, longitudinally moved toward the take-up mechanism and taken up by the take-up mechanism.

As the web member moving from the pay-out mechanism was moving toward the take-up mechanism, the web member was curved to project a columnar portion so as to form a columnar chamber circumscribed by the curved web member of said columnar portion as the circumferential wall by using a first supporting and conveying roller which also serves to make the web member curved in the side of the pay-out mechanism, a pair of rotary rings each being capable of serving to support one side end of the curved web member and convey said web member and a second supporting and conveying roller which also serves to make the web member curved in the side of the take-up mechanism. A pair of microwave applicator means were provided to the columnar chamber such that they were situated opposite each other through the columnar space of the columnar chamber. Each of said pair of microwave applicator means was designed so as to radiate a microwave energy in the direction parallel to the microwave propagating direction. Then, a film-forming raw material gas was introduced into the columnar space of the columnar chamber. The inside of the columnar space was evacuated through the spacing between the foregoing two rollers and was maintained at a predetermined vacuum. Said pair of microwave applicator means were actuated to radiate a microwave energy in parallel to the circumferential wall of the columnar chamber. As a result, it was found that uniform microwave plasma was provided in the width direction of the web member constituting the circumferential wall of the columnar chamber.

As a result of further studies, the present inventors have obtained a further finding.

That is, a predetermined bias voltage was applied into the columnar space by a bias voltage applying means in the above case. As a result, it was found that uniform microwave plasma was provided as well as in the above case and the plasma potential could be properly controlled.

The present invention has been accomplished as a result of further studies based on these findings by the present inventors.

The present invention includes, as previously described, an improved MW-PCVD process for continuously forming a semiconductor deposited film on a large area and lengthy substrate and an improved MW-PCVD apparatus suitable for practicing said MW-PCVD process.

A first embodiment of the MW-PCVD method of the present invention comprises: continuously moving a substrate web in the longitudinal direction by paying out by a pay-out mechanism and taking it up by a take-up mechanism; establishing a substantially enclosed film-forming chamber by curving and projecting said moving substrate web to form a columnar portion to be the circumferential wall of said film forming chamber as the substrate web is moving from said pay-out mechanism toward said take-up mechanism; introducing a film-forming raw material gas through a gas feed means into said film-forming chamber; simultaneously, radiating a microwave energy in said film-forming chamber by using a microwave applicator means, which is so designed that it can radiate a microwave energy in the direction parallel to the microwave propagating direction, to generate microwave plasma in said film-forming chamber, whereby forming a deposited film on the inner wall face of said continuously moving circumferential wall which is exposed to said microwave plasma.

In the MW-PCVD process of the present invention, at the time of curving and projecting the moving substrate web to form the columnar portion, a first curving means and a second curving means are used. That is, the moving substrate web is curved by said first curving means while being supportingly moved in the upward direction in the side of the pay-out mechanism and is again curved by said second curving means while being supportingly moved toward the take-up mechanism in the side of the take-up mechanism, to thereby establish a projected columnar portion to be the circumferential wall of the film-forming chamber while leaving a spacing between the first curving portion by the first curving means and the second curving portion by the second curving means. The both side ends of the columnar portion are supported on respective rotary rings so as to establish and maintain a desired shape of the columnar portion thereby always providing a desirable columnar chamber having a columnar film-forming space.

The columnar chamber thus established is provided with at least a microwave applicator means. The microwave applicator means is connected to the columnar chamber through its side face portion such that a microwave energy is radiated into the film-forming space. In a preferred embodiment of this case, the microwave applicator means is perpendicularly connected to at least one of the two side faces of the columnar chamber such that a microwave energy is radiated into the columnar chamber in parallel to the circumferential wall. The radiation of the microwave energy into the film-forming space is conducted through a microwave transmissive member mounted to the top of the microwave applicator means. In a preferred embodiment, the microwave transmissive member also serves as the side wall member of the columnar chamber to hermetically enclose the film-forming space. In the case where said microwave applicator means is connected to each of the two side faces of the columnar chamber, they are arranged such that they are situated to be opposite each other through the film-forming space. In this case, it is important that the two microwave applicator means be arranged such that the microwave energy radiated from one microwave applicator means is not received by the other microwave applicator means. In any case, the columnar chamber is so structured that a microwave energy radiated into the film-forming space by the microwave applicator means is not leaked out of the columnar chamber.

The evacuation of the film-forming space is carried out through the foregoing spacing by an exhaust means.

As the substrate web on which a film is to be formed to be used in the MW-PCVD method of the present invention, it is desired to use an electroconductive substrate web or other substrate web applied with electroconductive treatment to the surface thereof on which a film is formed.

A second embodiment of the MW-PCVD process of the present invention is that the above first embodiment further includes the step of controlling the potential of the microwave plasma generated in the film-forming space as desired upon film formation by applying a bias voltage of DC, AC or pulsating current (hereinafter called "PC") into the film-forming space through a bias voltage applying means. The bias voltage applying means is provided to the columnar chamber such that at least a part thereof is in contacted with microwave plasma generated in the film-forming space.

Said part of the bias voltage applying means to be in contact with the microwave plasma is desired to have been applied with electroconductive treatment.

It is possible to make the bias voltage applying means such that it also serves as a film-forming raw material gas introducing means.

The bias voltage applying means may be a single bias bar or a plurality of bias bars.

Further, in the MW-PCVD process of the present invention, the potential of microwave plasma to be generated in the film-forming space may be controlled by a bias voltage applied through the substrate web constituting the circumferential wall of the columnar chamber. In this case, the gas introducing means comprising, for instance, a gas feed pipe is installed in the film-forming space while being electrically grounded such that at least part thereof is in contact with microwave plasma generated in the film-forming chamber.

As described above, the present invention also provides a MW-PCVD apparatus suitable for practicing the above MW-PCVD process.

A first embodiment of the MW-PCVD apparatus of the present invention comprises: at least a substantially enclosed columnar film-forming chamber having a curved circumferential wall formed by curving and projecting a substrate web as said substrate web is moving in the longitudinal direction from a pay-out mechanism to a take-up mechanism by a pair of rollers for supporting and curving said substrate web, said pair of rollers being arranged in parallel to each other while leaving a predetermined spacing between them in the longitudinal direction; at least a microwave applicator means being connected to at least one of the two side faces of said film-forming chamber so as to enable it to radiate a microwave energy into said film-forming chamber in the direction parallel to the microwave propagating direction and generate microwave plasma in said film-forming chamber; means for evacuating the inside of said film-forming chamber; means for introducing a film-forming raw material gas into said film-forming chamber; and means for heating or cooling said substrate web.

A second embodiment of the MW-PCVD apparatus is that the above first apparatus embodiment further comprises means for applying a bias voltage into the film-forming chamber.

In the MW-PCVD apparatus of the present invention, said pair of rollers for supporting and curving the substrate web comprise a first supporting and curving roller and a second supportingly curving roller. The substrate web which is delivered by the pay-out mechanism and is 1 moved in the longitudinal direction toward the take-up mechanism by the rotation of the take-up mechanism is supportingly curved and projected by the first supporting and curving roller while being supportingly moved upward in the side of the pay-out mechanism and is again curved by the second supporting and curving roller while being supportingly moved toward the take-up mechanism, to thereby establish a projected columnar portion be the circumferential wall of the film-forming chamber while leaving a predetermined spacing between the first curved portion provided by the first supporting and curving roller and the second curved portion provided by the second supporting and curving roller. With each of the two open side faces of the curved and projected columnar portion, there is provided a rotary ring such that the respective side ends of the columnar portion are supported on the respective rotary rings to establish and maintain a desired shape of the columnar portion to be the columnar film-forming chamber having a film-forming space. The microwave applicator means is connected through the side face to the columnar film-forming chamber such that a microwave energy is radiated into the film-forming space in parallel to the circumferential wall of the columnar film-forming chamber. The microwave applicator means comprises a microwave transmissive window made of a dielectric material and a rectangular or elliptical waveguide connected to said microwave transmissive window, said waveguide is extending from a microwave power source. Thus, the microwave applicator means is connected through its microwave transmissive window to the side face of the columnar film-forming chamber such that the microwave transmissive window also serves as the side wall of the columnar film-forming chamber to hermetically enclose said chamber. It is possible for each of the side faces of the columnar film-forming chamber to be provided with the foregoing microwave applicator means in this way. In this case, each of the pair of microwave applicator means is provided with a waveguide selected from the group consisting of a rectangular waveguide and an elliptical waveguide, extending from a microwave power source as previously described. And it is necessary for the pair of microwave applicator means to be oppositely arranged through the film-forming space of the film-forming chamber such that the setting angle of the waveguide to be connected to one of the microwave applicator means does not conform to the setting angle of the waveguide to be connected to the other microwave applicator means.

Particularly, it is necessary to design such that the face containing the major edge, the face containing the major axis, or the face containing said major edge and axis respectively of one of the waveguides is not in parallel to the face containing the major edge, the face containing the major axis, or the face containing said major edge and major axis respectively of the other waveguide.

A further consideration is necessary in this case. That is, the pair of waveguides are to be arranged such that the angle which is formed by the face containing the foregoing major edge and/or major axis and the face containing the two central axes of the foregoing pair of supporting and curving rollers does not result in becoming perpendicular.

The evacuating means is provided to the columnar film-forming chamber such that the film-forming space thereof is evacuated through the spacing provided between the foregoing pair of supporting and curving rollers.

In the second apparatus embodiment of the present invention, the bias voltage applying means is provided to the columnar film-forming chamber such that at least a part thereof is contacted with microwave plasma generated in the film-forming space. Said part of the bias voltage applying means to be in contact with the microwave plasma is desired to be such that it has been applied with electroconductive treatment. The bias voltage applying means may be one that can apply a bias voltage of DC, AC or PC. The bias voltage applying means can be designed such that it serves also as the means for introducing a film-forming raw material gas into the film-forming space.

The bias voltage applying means may be a single bar or a plurality of bias bars.

In an alternative, it is possible to install the gas introducing means comprising one or more gas feed pipes in the film-forming chamber while being electrically grounded, wherein a bias voltage is applied onto the substrate web constituting the circumferential wall of the film-forming chamber.

In the following, in explanation will be made about the experiments which were carried out by the present inventors in order to attain the foregoing object of the present invention.

The following experiments were made aiming at finding out desirable conditions for providing uniform microwave plasma over a large area in order to form a desirable large area semiconductor film.

Experiment 1

In this experiment, studies were made about the stability of microwave plasma and leakage of microwave out of the film-forming chamber due to a difference in the setting angle of a pair of waveguides 111, 112 using the MW-PCVD apparatus of Apparatus Enbodiment 2 which will be later described and in accordance with the procedures of Production Example 1 which will be later described.

Figure 10:
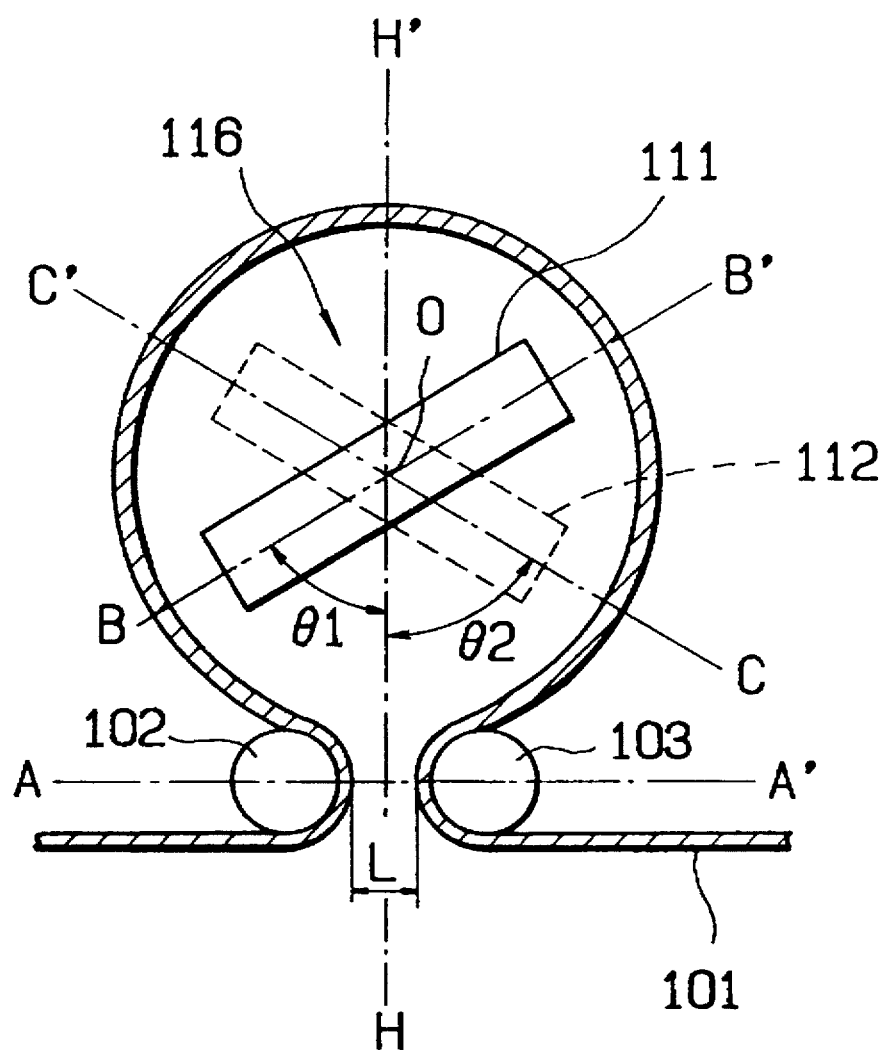
FIG. 10 is a schematic view for explaining the setting angle of the rectangular waveguide in the present invention.

FIG. 10 is a schematic explanatory view about the angle at which a pair of rectangular waveguides are set. In FIG. 10, each of the rectangular waveguide 111 shown by a true line and the other rectangular waveguide 112 shown by a dotted line is connected to the corresponding microwave applicator (not shown) provided to the side face of a film-forming chamber having a film-forming space 116, wherein the two microwave applicators are so arranged as to be opposite each other through the film-forming space. For instance, as shown in FIG. 10, the rectangular waveguide 111 is situated in the front and the rectangular waveguide 112 is situated in the back. The mark "0" stands for the center of the curved shape (which is the circumferential wall comprising a moving substrate web 101 of the film-forming chamber). The line A–A' stands for a face containing a central axis between a pair of supporting and curving rollers 102 and 103. The line H–H' stands for a face which is perpendicular to said A–A' face. The angle which is provided by a face B–B' in parallel to the face containing a major edge of the rectangular waveguide and the face H–H' is made to be $\Theta_1$. This angle $\Theta_1$ is considered as the setting angle of the rectangular waveguide 111. The angle which is formed by a face C–C' in parallel to the face containing a major edge of the rectangular waveguide 112 and the face H–H' is made to be $\Theta_2$. This angle $\Theta_2$ is considered as the setting angle of the rectangular waveguide 112. In the case where each of the angles $\Theta_1$ and $\Theta_2$ goes beyond 180°, the rectangular waveguides 111 and 112 become symmetric to the face H–H' in the case of less than 180°. Therefore, their arrangement relation is the same as in the case of less than 180°.

Likewise, when the angles $\Theta_1$ and $\Theta_2$ are replaced with each other, their arrangement relation is not changed.

Here, the distance between the portion of a substrate web supportingly curved by the roller 102 and the other portion of said substrate web curved by the roller 103 is made to be a spacing L.

Discharge was performed under the conditions shown in Table 1 while varying the angles $\Theta_1$ and $\Theta_2$ as shown in Table 2 to examine the stability of microwave plasma as generated and the situation of microwave leakage.

The examination of the microwave leakage was conducted by a microwave detector placed at the position being about 5 cm distant from the foregoing spacing between the two rollers 102 and 103.

The evaluated results obtained were as shown in Table 2. From the results shown in Table 2, the following findings were obtained.

That is, the stability of microwave plasma generated in the film-forming space and the situation of microwave leakage out of the film-forming chamber will be changed largely depending upon the angle of the microwave applicator to be set to the rectangular waveguide. More particularly, in the case where the angle $\Theta_1$ or $\Theta_2$ is 0°, the amount of microwave leaked is the largest and the state of discharge is undesirably unstable. In the case where the angle $\Theta_1$ or $\Theta_2$ is about 15°, although the amount of microwave leaked is relatively small, the state of discharge is still undesirably unstable. In the case where the angle $\Theta_1$ or $\Theta_2$ is more than 30°, microwave is not leaked and discharge is stably caused. However, when the angle which is formed by the angles $\Theta_1$ or $\Theta_2$ is 180° or 0°, that is, when the two faces respectively containing a major edge of the rectangular waveguide are parallel to each other, the noise of the microwave power source becomes great due to abnormal oscillation to cause unstable discharge notwithstanding the amount of microwave as leaked.

The discharge experiments were carried out in the case where the substrate web was not moved and also in the case where the substrate web was moved at a transportation speed of 1.2 m/min. There was no distinguishable difference with respect to the stability of discharge found between the two cases.

The foregoing experiments were carried out by changing the kind of the film-forming raw material gas, the flow rate of the film-forming raw material gas, the microwave power to be applied, the bias voltage to be applied, the internal diameter of the curved columnar chamber, and the inner pressure of the film-forming space. However, no distinguishable difference was found with respect to the stability of discharge and the amount of microwave leaked among these cases.

Experiment 2

In this experiment, studies were made about the stability of microwave plasma to be generated and the thickness distribution of a film to be formed using the same MW-PCVD apparatus used in Experiment 1 and by varying the spacing L shown in FIG. 10.

As for the spacing L, it was varied as shown in Table 3. Discharge was performed for about 10 minutes in every case under the conditions shown in Table 1, except that the inner pressure of the film-forming chamber was changed to those shown in Table 3 and the angles $\Theta_1$ and $\Theta_2$ were made 45°. It should be noted that said inner pressure was not purposely adjusted by the exhaust means but was caused because of the raise in conductance by enlarging the spacing L.

In any of the cases, the temperature controlling mechanisms 106a to 106e (See FIG. 1) were actuated to control the surface temperature of the substrate web 101 in the side of the film-forming space to about 250° C. and the substrate web 101 was moved at a transportation speed of 35 cm/min.

The evaluation of the discharge state was visually conducted. The evaluation of the film thickness distribution was conducted by measuring the film thickness at selected 10 positions in the width direction and also at plural positions with a 20 cm interval in the longitudinal direction by a film thickness gauge. The evaluated results obtained were as shown in Table 3.

From the results obtained in this experiment, the following facts were found. That is, (i) the inner pressure of the film-forming chamber can be changed by varying the spacing L without adjusting the exhaust means to cause a significant change in the thickness distribution of a film formed particularly in the width direction of the substrate web situated in the film-forming space of the film-forming chamber; (ii) even in the case where the rectangular waveguide is set at such angle that does not cause microwave leakage as described in Experiment 1, when the spacing L is made excessively large, it causes microwave leakage; and (iii) when the spacing L is adjusted to be preferably less than ½ or more preferably less than ¼ of the wavelength of microwave, the amount of microwave to be leaked through the spacing is maintained desirably small.

It was also found that the film thickness distribution in the longitudinal direction on the substrate web is maintained in a desirable state as long as the substrate web is continuously moved at a constant transportation speed.

Among the deposited film specimens Nos. 3 to 5 obtained in this experiment which provided good evaluation results as shown in Table 3, the specimen No. 4 provided the most satisfactory results for all the evaluation items and the deposition rate thereof was about 100 Å/sec. In addition, the gas utilization efficiency calculated from the amount of the film deposited on the substrate web versus the total amount of the film-forming raw material gases fed into the film-forming chamber was 55%.

It was further found that among the discharge conditions, changes in the microwave power, bias voltage, inside diameter of the columnar structure (the film-forming chamber), etc. cause slight changes in the film thickness distribution and the stability of discharge but do not lead to solving the substantive problems caused by the extent of the spacing L.

Experiment 3

In this experiment, studies were made about the stability of microwave plasma to be generated and the thickness distribution of a film to be formed upon varying the inside diameter of the curved structure (the film-forming chamber) in the same manner as in Experiment 1.

The inside diameter of the film-forming chamber was varied as shown in Table 4. Discharge was performed under the conditions shown in Table 1, wherein both the setting angle of the angle $\Theta_1$ and that of the angle $\Theta_2$ were made 45°. In each case, discharge was carried out for 10 minutes while maintaining the surface temperature of the substrate web situated in the film-forming space at 250° C. and while moving the substrate web at a transportation speed of 35 cm/min.

The evaluation of the discharge state was visually conducted. The evaluation of the film thickness distribution was conducted by measuring the film thickness at selected 10 positions in the width direction and at plural positions with a 20 cm interval in the longitudinal direction by a film thickness gauge.

The evaluated results obtained were as shown in Table 4.

From the results obtained in this experiment, the following facts were found. That is, (i) when the inside diameter of the film-forming chamber is changed while maintaining other discharge conditions unchanged upon film formation, the discharge state is accordingly changed to cause a significant change in the thickness distribution in the width direction of the substrate web for the film deposited on said web; (ii) the thickness distribution in the longitudinal direction for said film is satisfactory as long as it is moved at a constant transportation speed; and (iii) changes in the discharge parameters such as microwave power, bias voltage, pressure of the film-forming space, etc. among others provide influences to the thickness distribution of a film formed and also to the stability of discharge.

Experiment 4

In this experiment, studies were made mainly about the stability of microwave plasma to be generated upon varying the flow rate of a film-forming raw material gas to be fed and the power of a microwave energy to be applied into the film-forming space while maintaining the pressure of the film-forming space constantly at a predetermined value in the same manner as in Experiment 1.

The pressure of the film-forming space and the flow rate of the film-forming raw material gas were varied as shown in Table 5. Discharge was carried out under the conditions shown in Table 1, wherein both the setting angle of the angle $\Theta_1$ and that of the angle $\Theta_2$ were made 60°.

The evaluated results obtained were as shown in Table 5. In Table 5, the mark "⊙" shows the case where the discharge was stably maintained; the mark "o" shows the case where minute unevennesses were caused in the discharge but the discharge was maintained in a desirable acceptable state; and the mark "Δ" shows the case where distinguishable unevennesses were caused in the discharge but the discharge was maintained in a practically acceptable state.

From the result obtained, the following facts were found. That is, (i) when the power of a microwave energy to be applied into the film-forming space is reduced, the pressure of the film-forming space is reduced, or the flow rate of $H_2$ gas as one of the film-forming raw material gas is reduced, discharge becomes unstable or discharge sometimes is not caused; and (ii) on the other hand, when the power of said microwave energy is raised, said pressure is raised, or the flow rate of $SiH_4$ gas as the film-forming raw material gas is raised, desirable discharge is stably caused.

Further, the discharge experiments were carried out in the case where the substrate was not moved and also in the case where the substrate web was moved at a transportation speed of 1.2 m/min. As a result, there was not a distinguishable deference between the two cases.

Experiment 5

In this experiment, studies were made about the stability of microwave plasma to be generated and the thickness distribution of a film to be formed upon varying the width of the substrate web in the same manner as in Experiment 1.

The width of the substrate web was varied as shown in Table 6. As the rectangular waveguide, a rectangular waveguide of E1AJ, WR1-32 was used instead of the rectangular waveguide of E1AJ, WR1-26. Both the setting angle of the angle $\Theta_1$ and that of the angle $\Theta_2$ were made 60°. The remaining discharge conditions were made as shown in Table 1. In each case, discharge was carried out for 10 minutes while controlling the surface temperature of the substrate web situated in the film-forming chamber to 250° C. and while moving the substrate web at a transportation speed of 50 cm/min.

In the case of preparing each of Specimen Nos. 15 to 17 shown in Table 6, a single applicator was used. Likewise, in the case of preparing each of Specimen Nos. 18 to 21, a pair of applicators were used.

The evaluated results obtained with respect to the state of discharge and the film thickness distribution were as shown in Table 6.

From the results obtained in this experiment, the following facts were found. That is, (i) changes are caused in the stability of microwave plasma to be generated and the thickness distribution of a film to be formed on the substrate web when the width of the substrate web is varied; (ii) when a microwave energy is applied into the film-forming space only from one side of the film-forming chamber, the microwave plasma as generated becomes unstable and the film thickness distribution becomes undesirable; and (iii) when a microwave energy is applied into the film-forming chamber from the two sides of the film-forming chamber, those problems caused in the foregoing case (ii) can be eliminated.

As a result of further studies, it was found that certain influences effect the stability of microwave plasma to be generated and also to the film thickness distribution depending upon changes in some discharge parameters such as the kind of the film-forming raw material gas to be fed, the flow rate thereof, the power of a microwave energy to be applied, the bias voltage, the pressure of the film-forming space, etc.

Experiment 6

In this experiment, using the MW-PCVD apparatus having the constitution shown in FIG. 5 which is explained in Apparatus Embodiment 22 which will later be described, having a bias voltage applying means of the constitution shown in FIG. 15(a) in the isolating vessel 500 (see FIG. 5), studies were made about the controllability of microwave plasma to be generated and influences exerted on the potential of the microwave plasma and the quality of a film to be formed upon carrying out film formation onto a SUS 430 BA substrate web while changing the DC bias voltage applied onto a nickel-made bias voltage applying pipe 1503 which is capable of surving also as the gas feed pipe [see FIG. 15(a)].

The DC bias voltage was varied with an interval of 10 V in the range of from −300 V to +300. Both the setting angle of the angle $\Theta_1$ and that of the angle $\Theta_2$ were made 45°. In each case, discharge was carried out for 10 minutes under the conditions shown in Table 7, wherein the surface of the substrate web situated in the film-forming space was controlled to 250° C. and the substrate web was moved at a transportation speed of 60 cm/min.

Figure 16:
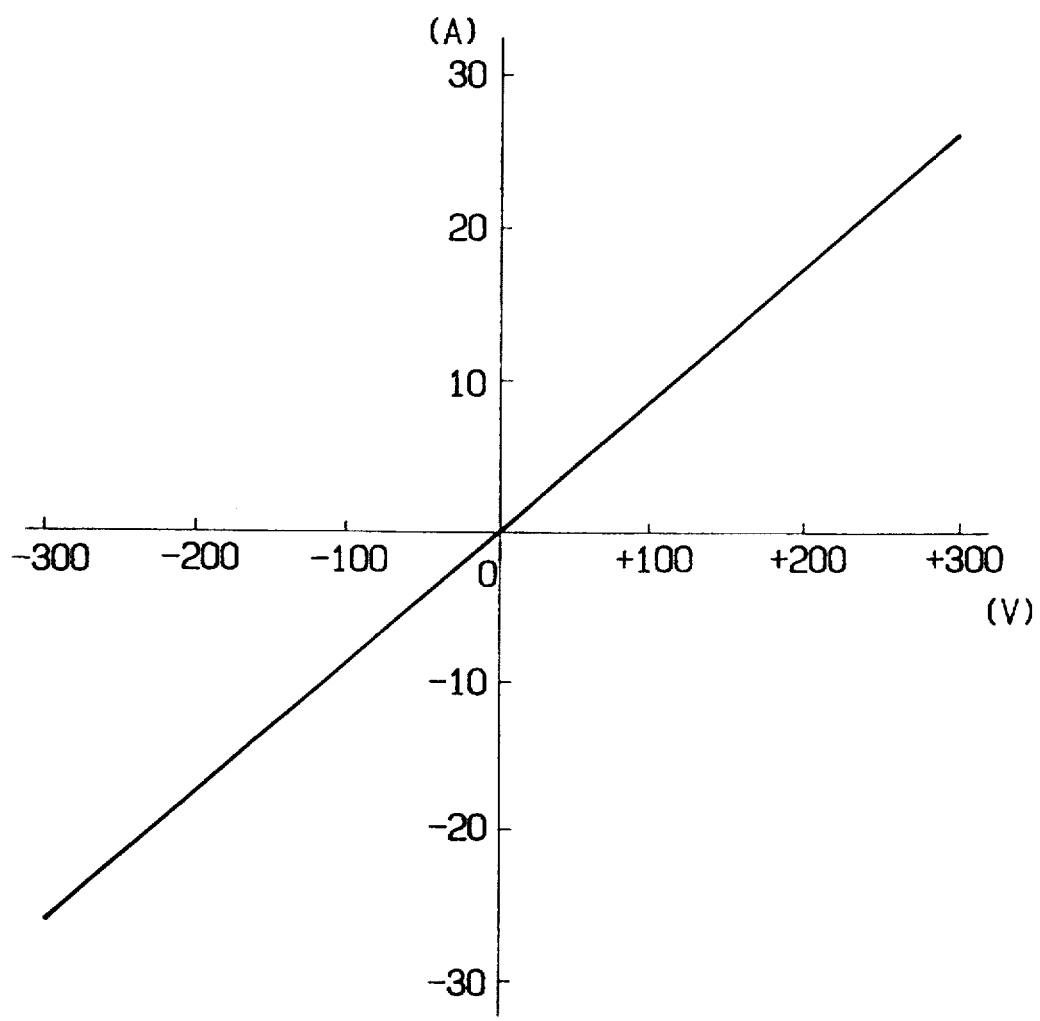
FIG. 16 is a graph of current-voltage characteristics at the time of applying a bias voltage which was obtained in the experiment of the present invention, which will be later described.

Firstly, the current-voltage characteristic was observed between the bias voltage applying pipe and the substrate web by a conventional method. The results obtained are expressed by a graph shown in FIG. 16. In FIG. 16, the X-axis shows the value of a bias voltage applied and the Y-axis shows the value of a bias current.

Figure 17:
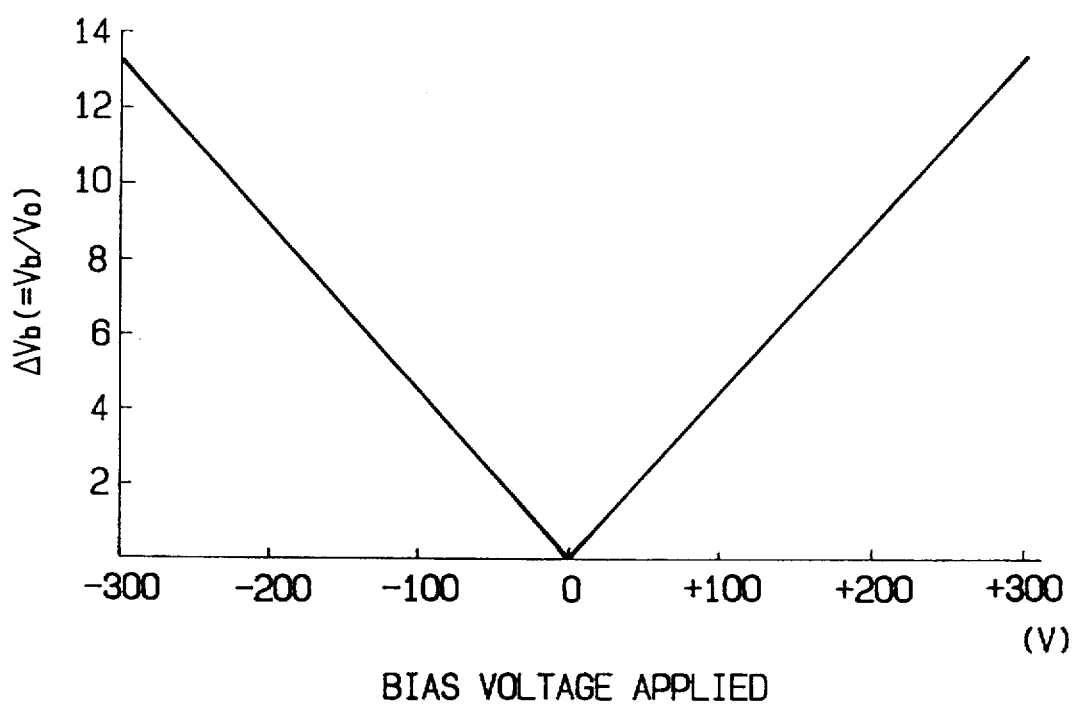
FIG. 17 is a graph of the rates of change in the plasma potential which was obtained in the experiment of the present invention, which will be later described.

Then, in accordance with a probing method using a single probe comprising a tungsten line of 0.3 mm in diameter and 3 mm in length (open part), a plasma potential Vb was measured upon application of a bias voltage to obtain the rate of change $\Delta Vb$ (=Vb/Vo) of the plasma potential Vb versus the plasma potential Vo obtained when no bias voltage was applied. The results obtained were collectively shown by the graph described in FIG. 17. Said single probe was placed near the central position of the film-forming space which is apart by about 5 cm from the inner wall face of the circumferential wall comprising the moving substrate web.

From the experimental results obtained in this experiment, the following facts were found. That is, (i) although certain changes are caused depending upon the kind of a raw material gas for discharge to be used and its flow rate, when a bias voltage of less than −200 V or more than 200 V is applied, abnormal discharge such as spark is caused in the film-forming space and it is difficult to maintain discharge in a stable state; (ii) however, when the discharge conditions are made constant the current-voltage characteristic shows an increasing linear relationship as the bias voltage increases and the plasma potential shows an increasing linear relationship too; and (iii) it is possible to stably and repeatedly control the plasma potential in a desired state by properly varying the value of a bias voltage to be applied.

Several experimental specimens of 5 mm×5 mm in size were cut off from the substrate web having a deposited film formed thereon, and they were subjected to observation of their surface state with the use of a superresolution low-accellation FE-SEM (trade name: S-900 type FE-SEM, product by Hitachi Ltd. ). As a result, the following facts were found. That is, as for the films formed with the application of a bias voltage in the range of from −300 V to +10 V, significant surface roughnesses of some hundreds to some thousands angstrom (Å) are found; as for the films formed with the application of a bias voltage in the range of from +10 V to 180 V, there is a tendency that the surface smoothness is improved as the value of the bias voltage to be applied is increased; as for the films formed with the application of a bias voltage exceeding +180 V, there is a tendency that the film surface starts roughening and the degree of the roughness is developed as the value of the bias voltage is increased; and as for the films formed with the application of a bias voltage exceeding +200 V, those films are accompanied with pin holes, and abnormal discharge is often caused during their formation.

In addition, the following facts were also found. That is, when the power of a microwave energy to be applied is maintained constant at a predetermined value, the inclination of the current-voltage characteristic becomes greater as the flow ratio of a raw material gas having a large ionization cross-section such as $SiH_4$ is increased, but said inclination becomes smaller as the flow ratio of a raw material gas having a small ionizing cross-section such as $H_2$ gas is increased.

Comparative Experiment 1

In this comparative experiment, the procedures of Experiment 6 were repeated, except for replacing the foregoing bias voltage applying pipe 1503 made of nickel by a newly provided bias voltage applying pipe made of aluminum which is capable of surving as a gas feed pipe.

The current-voltage characteristic was observed in the same manner as in Experiment 6. However, when the bias voltage was increased from zero volt to +60 V, the aluminum bias voltage applying pipe started deforming at the beginning stage and finally was melt-broken. Likewise, when a bias voltage applying pipe made of copper and a bias voltage applying pipe made of a brass were respectively used, the foregoing problem was also caused in any of the cases.

Further, a plurality of bias voltage applying pipes were provided respectively made of metals having a high melting point such as stainless steel, titanium, vanadium, niobium, tantalum, molybdenum, and tungusten and a bias voltage applying pipe made of alumina ceramic applied with a 800 µm thick nickel film to the surface thereof. And using each of them, the procedures of Experiment 6 were repeated. As a result, it was found in the case of using the stainless steel-made bias voltage applying pipe that said pipe started deforming with the application of a bias voltage exceeding +120 V and it was finally melt-broken.

As for the cases of the remaining bias voltage applying pipes, the measured results similar to those obtained in Experiment 6 were obtained in each of these cases without such problems as described above.

Comparative Experiment 2

The procedures of Experiment 6 were repeated, except that as the substrate web, polyethyleneterephthalate (PET) sheet of 0.8 mm in thickness was used instead of the SUS 430 BA thin sheet, to observe the current-voltage characteristic. As a result, it was found that the values of currents flown with the application of bias voltages either in the positive side or in the negative side were similar to those obtained in Experiment 6 but the voltage at which abnormal discharge started was near −100 V or +100. As a result of visually observing their states, the following facts were found. That is, spark was generated between the bias voltage applying pipe and the supportingly curving rollers for the substrate web; and this was caused by a so-called charge-up phenomenon not only due to the insulating substrate web but also due to the excessive current flown into said rollers being conductive.

In addition, the surface states of a plurality of film specimens formed on the foregoing insulating substrate web were observed in the same manner as in Experiment 6. As a result, it was found that the film specimens have a significant roughness of some hundreds to some thousands angstrom (Å) without depending upon the difference in the bias voltage applied upon film formation.

Comparative Experiment 3

The procedures of Experiment 6 were repeated, except that the position for the bias voltage applying pipe 1503 to be arranged in the film-forming space 116 (see FIG. 10) was varied to the positions 30 mm, 60 mm and 90 mm distant from the position "O" in the direction H–H', in the direction O–H, in the direction O–C and in the direction O–H' respectively.

In each case, the current-voltage characteristic was observed.

For the direction O–H', the case of 120 mm and the case of 150 m were observed in the same manner as the above.

As a result, the results obtained were similar to those obtained in Experiment 6 in any of the cases of 30 mm and 60 mm in the directions O–H', O–H, O–C and O–C'. In the cases of 90 mm in said directions, the voltage at which abnormal discharge commenced was somewhat different. But aside from this, the results obtained were similar to those obtained in Experiment 6. On the other hand, in any of the two cases of 120 mm and 150 mm in the direction O–H', a film-forming raw material gas was not sufficiently fed into the film-forming space and because of this, plasma was not stably generated. And no bias current was provided upon applying a bias voltage and it was impossible to control the plasma potential.

Experiment 7

In this experiment, using the same MW-PCVD apparatus as used in Experiment 6, studies were made about the controllability of microwave plasma to be generated and influences to be provided on the plasma potential and the quality of a film to be formed upon applying a bias voltage with a wave form and a frequency shown in Table 8 through the bias voltage applying pipe 1503. The same conditions as employed in Experiment 6 were employed in order to perform microwave plasma discharge to form a deposited film on the substrate web in the film-forming space.

As the bias voltage to be applied, those obtained by amplifying a variety of waveform outputs, which were provided by a function generation of HP 8116A (product by Hewlett-Packard Company), by a precision power amplifier (product by NF Circuit Design Block Co., Ltd.) or those outputted by a rectifying circuit device were applied onto the bias voltage applying pipe 1503 through a coaxial cable.

The discharge state, rate of change in the plasma potential and controllability of the plasma potential were evaluated. As a result, the evaluated results shown in Table were obtained.

From the results, it was found that the application of a bias voltage with a frequency in the relatively wide range provides a distinguishable effect.

Further, as a result of varying the maximum amplitude voltage ($V_{p-p}$), a tendency similar to that found in Experiment 6 was found wherein the DC voltage was varied. And abnormal discharge such as spark often occurred mainly because of increase of the maximum amplitude voltage ($V_{p-p}$).

From these experimental results, the following fact was found. That is, various kinds of bias voltages other than the DC bias voltage can be used for controlling the potential of microwave plasma to be generated in the film forming space; and said plasma potential be easily, stably and repeatedly can be controlled by applying such bias voltage onto the bias voltage applying pipe while properly varying the voltage thereof.

Experiment 8

Figure 15A:
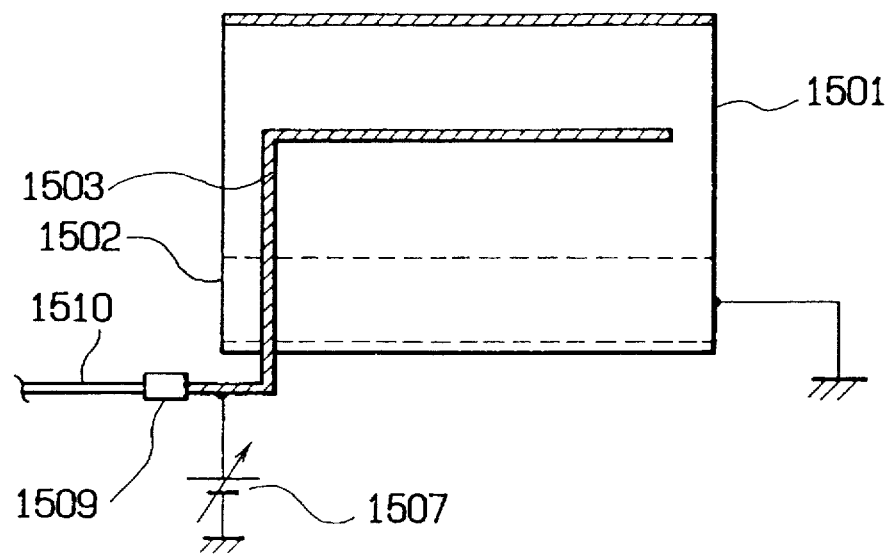
FIGS. 15(a), 15(b), 15(c), and 15(d) are schematic views respectively for illustrating a representative arrangement of the bias voltage applying means in the present invention.
Figure 15B:
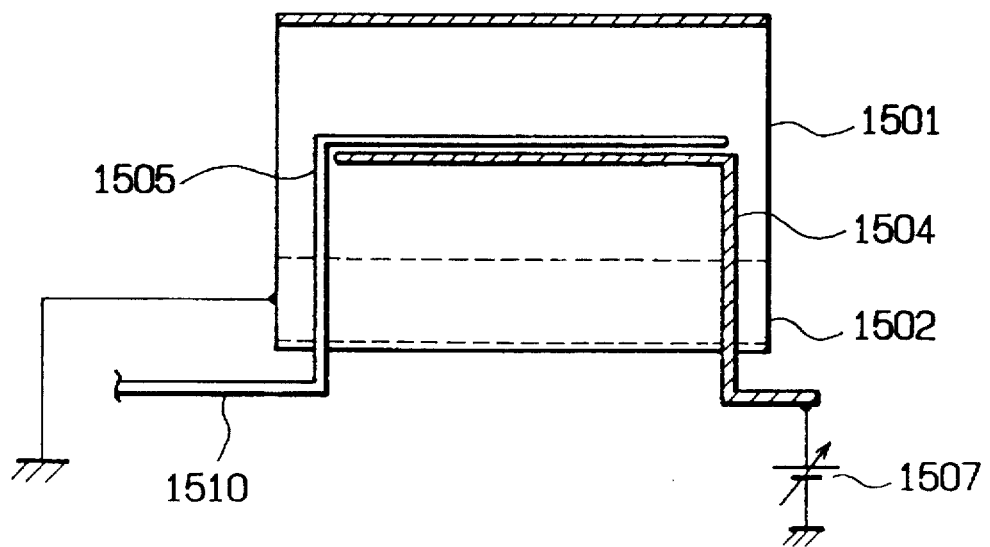

The procedures of Experiment 6 were repeated, except that the bias voltage applying means used in Experiment 6 was replaced by one shown in FIG. 15(b) which comprises a bias voltage applying bar 1504 independently provided in the film-forming chamber 1501, to examine the current-voltage characteristic.

As a result, the results similar to those obtained in Experiment 6 were obtained.

And, the following fact was found. That is, even in the case where the bias voltage applying bar 1504 and a gas feed pipe 1505 are independently and separately provided in the film-forming chamber [see FIG. 15(b)], it is possible to easily, stably and repeatedly control the potential of microwave plasma to be generated in the film-forming chamber by properly varying the bias voltage applied onto said bias bar.

Experiment 9

Figure 15C:
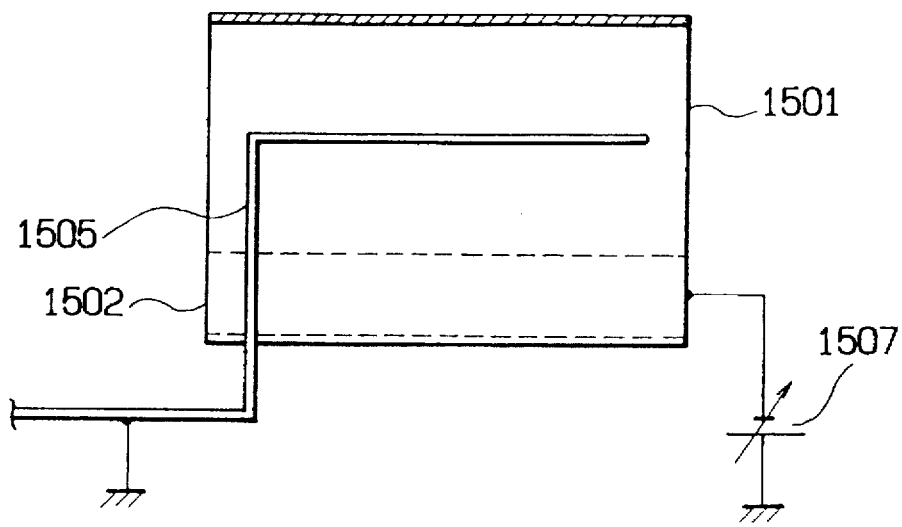

The procedures of Experiment 6 were repeated, except that the bias voltage applying means used in Experiment 6 was replaced by the constitution shown in FIG. 15(c) which comprises a earth pipe 1505 capable of surving as the gas feed pipe provided in the film-forming chamber 1501, to examine the current-voltage characteristics.

As a result, the results similar to those obtained in Experiment 6 were obtained.

And the following facts were found in comparison with the case of Experiment 6. That is, the voltage at which abnormal discharge such as spark is commenced is changed. When abnormal discharge occurs at connected portions between the moving substrate web and the two rotary rings by which the substrate web is supportingly conveyed; the bias voltage capable of contributing to provide a film to be formed on the moving substrate web with a smooth surface is of a negative polarity which is opposite to that in Experiment 6 and is in the range of from −10 V to −180 V, wherein plasma is maintained in a stable state; and the potential of microwave plasma to be generated in the film-forming space can be easily, stably and repeatedly controlled by using an earth pipe capable of surving as the gas feed pipe which is installed in the film-forming chamber.

Experiment 10

Figure 15D:
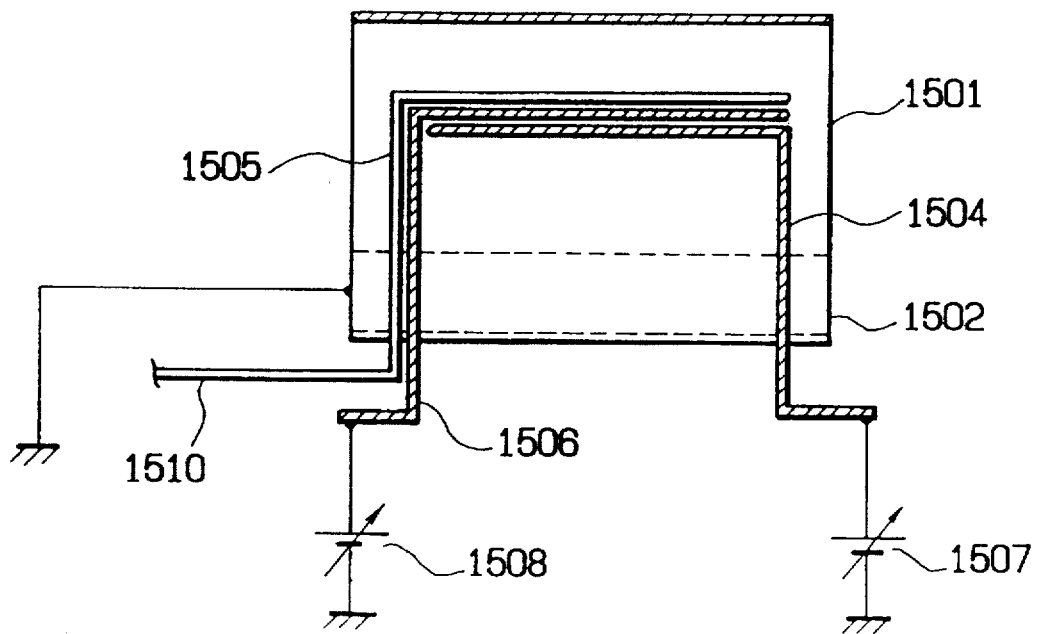

The procedures of Experiment 6 were repeated, except that the bias voltage applying means used in Experiment 6 was replaced by the constitution shown in FIG. 15(d) which comprises two bias voltage applying bars 1504 and 1506 being separately arranged in the film-forming chamber 1501 having a gas feed pipe 1505 being independently installed therein, to examine the current-voltage characteristic.

In this experiment, a DC bias voltage was applied onto the bias bar 1504 and concurrently, a DC bias voltage of ¼ of said bias voltage was applied to the bias bar 1506 upon film formation to examine the controllability of microwave plasma generated in the film-forming space, plasma potential and influences provided on a film to be formed.

As a result, the results similar to those obtained in Experiment 6 were obtained. And the following facts were found. That is, there was only slight abnormal discharge such as spark; the stability of plasma is improved; and the potential of microwave plasma can be easily, stably and repeatedly controlled.

Experiment 11

In this experiment, studies were made about the controllability of microwave plasma, plasma potential and influences over a film to be formed when the same bias voltages having various wave forms and frequencies as employed in Experiment 7 were respectively applied to the bias bar 1504 of the bias voltage applying means used in Experiment 10. In each case, discharge was performed under the same discharge conditions employed in Experiment 6.

In any case, abnormal discharge such as spark occurred slightly. The voltage at which abnormal discharge commences was lowered, the stability of microwave plasma was improved, and the results similar to those in Experiment 6 were obtained.

As a result, it was found that it is possible to easily, stably and repeatedly control the potential of microwave plasma during film formation by using a plurality of bias voltage applying bars being separately arranged in the film-forming chamber and independently applying a bias voltage onto each of the bars.

Experiments 12 and 13

The procedures of Experiments 8 and 9 were repeated, except that the same bias voltage as employed in Experiment 7 was employed in each case.

As a result, effects similar to those recognized in Experiments 8 and 9 were recognized.

As a result of further studies by the present inventors based on the results obtained by the foregoing experiments, the following items have been recognized.

Firstly, in the MW-PCVD method and the MW-PCVD apparatus of the present invention, it is difficult to establish the optimum condition which enables to stably maintain uniformity of microwave plasma on the basis of a single parameter, since the stability and uniformity of microwave plasma will be maintained in the complicatedly co-related organic situation of a plurality of parameters such as the shape of a microwave applicator, the kind of a waveguide which is connected to said applicator, arrangement of said waveguide, the gas pressure of the film-forming space upon film formation, the microwave power, the degree of microwave plasma to be confined, the shape and volume of the discharge space, etc.

The present inventors have found certain tendencies and conditions which enable to attain the purpose of maintaining the stability and uniformity of microwave plasma in order to continuously form a desirable semiconductor deposited film on a large area and lengthy substrate in the present invention.

That is, as for the inner pressure of the film-forming chamber upon film formation, it is preferably in the range of from 1.5 m Torr to 100 m Torr, more preferably in the range of from 3 m Torr to 50 m Torr.

As for the microwave power, it is preferably in the range of from 250×2 W to 3000×2 W, more preferably in the range of from 300×2 W to 1000×2 W.

As for the inside diameter of the projected and curved columnar portion (that is the film-forming chamber), it is preferably in the range of from 7 to 45 cm, more preferably in the range of from 8 to 35 cm. As for the width of the substrate web constituting the circumferential wall of the foregoing film-forming chamber, it is preferably about 60 cm, more preferably about 50 cm in the case of a pair of microwave applicators.

As previously described, when the amount of microwave to be leaked from the microwave plasma region becomes large, microwave plasma in said region becomes accordingly unstable.

Therefore, the foregoing spacing L to be provided between the two supportingly curved portions of the moving substrate web is a basically important factor in order to avoid occurrence of said problem.

In view of this, it is desired that the spacing L be made to be preferably less than ½ or more preferably less than ¼ of the wavelength of microwave.

In the present invention, in order to control the potential of microwave plasma in a desirable state upon film formation, it is desired to provide a bias voltage applying means in the film-forming chamber in which microwave plasma is to be confined and apply a bias voltage of DC, PC (pulsating current) or AC with an optional wave form and frequency and with a maximum amplitude voltage onto said bias voltage applying means. It is possible to make the bias voltage applying means such that it serves also as a gas feed means. It is a matter of course that a gas feed means can be independently provided in the film-forming chamber.

In the alternative, it is possible to control the potential of microwave plasma in a desirable state by applying a bias voltage onto the substrate web constituting the circumferential wall of the film-forming chamber in the present invention.

In a preferred embodiment of applying a bias voltage of DC, the voltage is preferably in the range of from +10 V to +180 V. In this case, a film formed on the substrate web excels in the film characteristics.

More detailed explanation is to be made about the MW-PCVD method and the MW-PCVD apparatus of the present invention.

In the MW-PCVD method of the present invention, the columnar circumferential wall of the film-forming chamber is formed by curving and projecting the moving substrate web by the initial supporting and curving means and the terminal supporting and curving means while leaving a predetermined spacing between said two curving means in the longitudinal direction as previously described. In order to uniformly generate and confine microwave plasma in the film-forming chamber, a microwave energy is radiated into said chamber in the direction parallel to the inner wall face of said chamber through the one or the two sides of said chamber such that said microwave energy is confined in said chamber.

In the case where the width of the substrate web is relatively narrow, microwave plasma generated in the film-forming chamber may be maintained in an uniform state even in the case of radiating a microwave energy into said chamber solely through the one side thereof. However, in the case where the width of the substrate web exceeds one wavelength of microwave, it is desired to radiate a microwave energy into the film-forming chamber through both the two sides thereof in view of maintaining the uniformity of microwave plasma. It is a matter of course that in order to maintain microwave plasma generated in the film-forming chamber in an uniform state, it is necessary for the microwave energy as introduced to be sufficiently propagated in the film-forming chamber. In this respect, the film-forming space of the film-forming chamber is desired to have a waveguide-like structure. And the inner wall of the circumferential wall of the film-forming chamber which comprises the moving substrate web is desired to have a desirable conductivity which permits a current with a desired current density to flow. For this purpose, the substrate web is preferred to be a member made of an electroconductive material. In any case, it is necessary for the surface of the substrate web situated in the film-forming space to be electroconductive. In the case of using an insulating web as the substrate web, the surface of said insulating member to be situated in the film-forming chamber is applied with an electroconductive coat.

The shape of each of the two sides of the columnar portion to be the film-forming chamber which is formed by curving and projecting the moving substrate web is preferred to be round. But, it may take other appropriate forms such as oval form, rectangular-like form, etc. In any case, the shape of each of the two sides of the columnar portion determine the entire form of the film-forming chamber to be provided and thus, the shape of one side and that of the other side are desired to be relatively gentle forms which are symmetrical with each other.

The form of the foregoing spacing L provided between the initial and terminal curved portions of the moving substrate web is desired to be of an even form but it may be of an uneven form.

In order to effectively propagate a microwave energy as applied to thereby stably and repeatedly generate microwave plasma and to maintain and control the microwave plasma in a desirable state in the film-forming space, it is desired that the transmission mode of microwave in the microwave applicator means is of a single mode.

Specifically, examples of such single mode are TE mode, $TE_{11}$ mode, $eH_1$ mode, $TM_{11}$ mode, $TM_{01}$ mode, etc. Of these modes, $TE_{10}$ mode, $TE_{11}$ mode and $eH_1$ mode are most desirable.

However, it is possible to use two or more of these modes in combination.

A microwave energy is transmitted through a waveguide capable of transmitting said microwave energy with the above mode into the microwave applicator means. Then, the microwave energy thus transmitted into the microwave applicator means is radiated through a microwave transmissive member (which is capable of serving a side wall of the film-forming chamber) hermetically provided to the top portion of said means into the film-forming space and at the same time, a film-forming raw material gas is fed through a gas feed means into the film-forming space, wherein the film-forming raw material gas is decomposed with the action of the microwave energy radiated to produce plasma thereby causing the formation of a deposited film on the inner wall face of the circumferential wall comprising the moving substrate web which is circumscribing the film-forming space.

The film-forming space is evacuated through the foregoing spacing L by means of an exhaust means containing a vacuum pump to bring said space to a predetermined vacuum upon film formation.

It is necessary for the size of the spacing L to be designed such that a sufficient exhaust conductance is always provided and the microwave energy radiated is not leaked out of the film-forming chamber.

In more detail in this connection, the microwave applicator means is provided to the film-forming chamber such that the direction of an electric field of the microwave transmitting in said microwave applicator means and the face containing the central axis of the initial supporting, and curving means (hereinafter referred to as "initial curving roller") and the central axis of the terminal supporting and curving means (hereinafter referred to as "terminal curving roller") are not in parallel with each other. This situation is also the same in the case where a plurality of microwave applicator means are provided to the film-forming chamber.

The maximum open width of the spacing L provided between the initial and terminal curving rollers in the longitudinal direction is desired to be preferably less than a length corresponding to ½ of the wavelength of microwave, more preferably less than a length corresponding to ¼ of the microwave wavelength. In the case where two microwave applicator means are oppositely provided to film-forming chamber, due care should be taken not to cause such a situation that the microwave energy radiated by one microwave applicator means is received by the other microwave applicator means and arrives at the microwave power source of said latter applicator to damage said power source, or effect negative influences such as causing abnormality of microwave oscillation. Particularly, the two microwave applicator means are necessary to be arranged such that the electric field directions of microwaves transmitting in the two microwave applicator means are not in parallel with each other.

In the case where a single microwave applicator means is provided to the film-forming chamber through its one side face, the remaining side face of said film-forming chamber is required to be so structured that microwave energy is not leaked therethrough.

For this purpose, the remaining side face is hermetically sealed with an electroconductive member, or it is covered with a metal mesh member or a punching metal having a plurality of perforations respectively with a size being preferably less ½ or more preferably less than ¼ of the wavelength of microwave.

There is a tendency for the microwave energy radiated into the film-forming space that, although depending upon the kind of a film-forming raw material gas as supplied, said microwave energy will be attenuated in the interrelation with the gas pressure (inner pressure) of the film-forming space as the distance from the microwave transmissive member (microwave transmissive window) increases. Therefore, in the case of using a substrate web having a relatively large width, in order to generate uniform microwave plasma in the width direction of the substrate web, it is desired to maintain the inner pressure at a sufficiently low value and to radiate a microwave energy into the film-forming chamber through the two sides thereof using at least two microwave applicator means oppositely arranged. In any case, the microwave applicator means is desired to be vertically provided to the side face of the film-forming chamber such that a microwave energy radiated into said film-forming chamber by said applicator means propagates in the direction parallel to the circumferential wall of said film-forming chamber. The microwave applicator is desired to be arranged at the position of the side face of the film-forming chamber which is equally distant from the circumferential wall thereof.

However, there is not any particular limitation for the position of the microwave applicator means to be arranged to the side face of the film-forming chamber in the case where the shape of the curved circumferential wall of the film-forming chamber is asymmetrical. And when a plurality of microwave applicator means are oppositely arranged, it is not always necessary that their central axes be on the same line.

The curved shape provided by the moving substrate web is desired to be always maintained constant without causing crease, slack, side-slippage, etc. by the initial and terminal curving rollers, so that the stability and uniformity of microwave plasma as generated can be maintained constant as desired.

It is possible to use one or more supporting means in order to secure the curved shape of the circumferential wall of the film-forming chamber. In more detail in this respect, it is possible to support the moving substrate web constituting the circumferential wall of the film-forming chamber by one or more supporting means provided in the side film-forming space and/or outside of the film-forming chamber.

In the case where such supporting means is provided in the side of the film-forming space, it is necessary to make the portion of the supporting means to be in contact with the face of the moving substrate web on which a film is to be formed small as much as possible. For instance, such supporting means is desired to be so provided that each of the side end portions of the moving substrate web is slidably supported by one or more supporting means.

As to the substrate web, it is desired to use such a web member that has sufficient flexibility capable of being desirably curved by each of the initial and terminal curving rollers to provide a desirable projected and curved shape (columnar shape) to be the circumferential wall of the film-forming chamber and capable of stably maintaining said columnar in a desired state.

Upon film formation, the film-forming raw material gas introduced into the film-forming chamber by the gas feed means is exhausted by the exhaust means to maintain the film-forming space at a desired pressure.

In the MW-PCVD method of the present invention, it is possible to apply a bias voltage into the film-forming space by using a bias voltage applying means, thereby controlling the potential of microwave plasma generated as desired, as previously described. In this case, the bias voltage applying means is desired to be provided such that at least a part thereof is to be in contact with microwave plasma generated in the film-forming space.

The bias voltage applying means may be so designed that it serves also as the gas feed means. In this case, it is necessary for the bias voltage applying means to be so structured that the gas supply system containing a gas reservoir, flow rate controller, gas feed pipings, etc. is electrically isolated from the bias voltage applying system so as not to cause damage to said gas supply system because of the bias voltage from the bias voltage applying system. The isolating of the two systems is desired to be positioned in the vicinity of the film-forming space.

In any case, the portion of the bias voltage applying means to be in contact with microwave plasma is desired to have been applied with conductive treatment so as to permit the application of a bias voltage therethrough. As for the material to be used for the conductive treatment, it is necessary to be such a material that does not cause deformation, damage, melt-breakage, etc. In a preferred embodiment, the portion of the bias voltage applying means is constituted by applying a coat of a metal having a high melting point on a metal or ceramic having a high melting point.

In the case where the bias voltage applying means is capable of also serving as the gas feed means is provided in the film-forming space, there is not any particular restriction as to position at which it is arranged as long as it is so arranged as to be in contact with microwave plasma generated with at least a part thereof because the microwave plasma functions as a nearly uniform conductor.

However, in the viewpoint of preventing occurrence of abnormal discharge, etc. it is desired that the bias voltage applying means be arranged at the position in the film-forming space which is apart by preferably more than 10 mm, more preferably more than 20 mm from the inner wall face of the circumferential wall.

As previously described, the bias voltage applying means may be comprised of a single bias bar or a plurality of bias bars.

In any of these cases, the same due consideration as in the case of the foregoing bias voltage applying means capable of serving also as the gas feed means should be made on the material constituting the bias bar and the position thereof to be arranged in the film-forming space. As to the gas feed means which is installed independently in the film-forming space, it is desirable that said gas feed means be made of a dielectric material with the view of preventing occurrence of abnormal discharge and providing uniform plasma potential in the film-forming space. However, in the case where a relatively low bias voltage is applied, there is not any particular restriction for the material to constitute the gas feed means.

In the case where a single bias bar or a sole bias voltage applying means capable of serving also as the gas feed means is installed in the film-forming space, it is possible to use a bias voltage of DC, PC, AC or two or more of these kinds in combination.

Likewise, in the case where a plurality of bias bars are used, it is possible to apply the same bias voltage or a different bias voltage onto each of those bias bars. In this case, it is also possible to use a bias voltage of DC, PC, AC or two or more of these kinds in combination. In the case where plural kinds of bias voltages are used together, desirable effects are provided that the range for the plasma potential to be able to be controlled is widened, the stability and reproducibility of microwave plasma are further improved, the characteristic of a film obtained is further improved and the resulting film becomes such that it is accompanied with extremely few defects.

Usable as the AC voltage are those having sine wave form, rectangular wave form, chopping wave form, pulse wave form, and combinations of two or more of these wave forms.

Usable as the PC voltage are those having wave forms comprising half-wave rectification or full-wave rectification of said AC voltage, lump wave form, etc.

For the DC voltage or the maximum amplitude voltage as the bias voltage to be applied, it should be determined depending upon the situation of providing a film to be formed with desired characteristics and also upon the situation of causing defects on said film. Said voltage may be maintained constant at a predetermined value from the beginning stage when film formation is started through the final stage where film formation is terminated. However, it is desired to continuously or periodically vary said voltage in order to control the characteristics of a film to be formed and to prevent occurrence of defects in said film. When abnormal discharge such as spark is caused in the film-forming chamber, the bias voltage is suddenly changed. In order to prevent occurrence of this situation, it is necessary to electrically detect said change, reduce the bias voltage or suspend the application thereof and return the bias voltage to the initial level. This process can be carried out manually. However, it is desired that an automatic controlling circuit is provided in the controlling circuit of the bias voltage applying means.

In the present invention, as previously described, the bias voltage applying means can be designed such that the substrate web constituting the circumferential wall of the film-forming chamber serves as said means. In this case, an earth electrode is provided in the film-forming chamber. The earth electrode may be designed such that it serves also as the gas feed means.

As for the substrate web to be used in the present invention, as previously described, web members respectively made of a conductive material or other web members respectively comprising an insulating member applied with a conductive film on the surface thereof may be optionally used. In any case, such substrate web is required to exhibit a conductivity capable of ensuring a sufficient current density at a temperature to which the substrate web is heated and maintained upon film formation. Preferable examples are webs of metals and webs of semiconductors.

The substrate web may be provided with regions respectively comprising an insulating material on the surface thereof in order to ease the process of dividing the substrate web having one or more semiconductor layers formed thereon into a plurality of elements.

In the case where the area of said insulating region is relatively large, the formation of a film while controlling the plasma potential is not done on said insulating region. However, in the case where the area of said insulating region is extremely small, almost the same film as formed on the conductive surface is formed also on such small insulating region.

In the MW-PCVD method of the present invention, there is an optimum condition for each of the fill-forming parameters in order to stably produce microwave plasma having a desirable uniformity thereby causing the formation of a desirable semiconductor film on the moving substrate web. However, it is difficult to generalize those film-forming parameters since the film-forming parameters such as the shape and volume of the film-forming chamber, the kind of a fill-forming raw material gas and the flow rate thereof, the inner pressure of the fill-forming chamber, the quantity of a microwave energy, matching of microwave, bias voltage, etc. are complicatedly interrelated in terms of organic relation.

The point by which the MW-PCVD method of the present invention is apparently distinguished from the known MW-PCVD method is that the circumferential wall of the film-forming chamber is constituted by a moving substrate web and a film is continuously on the inner face of said circumferential wall, wherein the substrate web functions as a structural member of the film-forming chamber. The function as the structural member means to physically and chemically isolate the atmospheric space for film formation i.e. the film-forming space from other atmospheric space which does not concern film formation. More particularly, it means to form an atmosphere having a different gas composition or a different state thereof, to control the direction of a gas flow, or to form an atmosphere having different pressure.

The MW-PCVD method is to continuously form a desirably uniform semiconductor deposited film on a large area and lengthy substrate web by supporting curving and projecting said substrate web while moving it to establish a columnar portion to be a film-forming chamber. The circumferential wall of the film-forming chamber is constituted by said substrate web being curved and projected, introducing a film-forming raw material gas into a film-forming space in the film-forming chamber, and, simultaneously, applying a microwave energy into said film-forming space while evacuating the film-forming space to thereby produce microwave plasma, confining said microwave plasma as it is produced, thereby continuously forming said semiconductor film on the inner surface of said circumferential wall comprising the moving substrate web. Thus, the substrate web itself functions as the structural member to isolate the film-forming space from the space which does not concern film formation and also function as a substrate on which a film is to be formed.

In this connection, the atmosphere isolated from the film-forming space is in such a state that the gas composition, the state thereof, the pressure, etc. are significantly different from those in the film-forming space.

On the other hand, in the known MW-PCVD method, the substrate on which a film is to be formed is placed on a substrate holder in a film-forming chamber and thus, the substrate functions as a member to deposit thereon a film-forming precursor produced in the film-forming chamber. It therefor does not function as the structural member as in the present invention. This is a marked point that apparently distinguishes the MW-PCVD method of the present invention from the known MW-PCVD method.

In the known RF plasma CVD method or sputtering method, a substrate on which a film is to be formed occasionally serves also as an electrode to cause and maintain discharge, but it does not work to sufficiently confine plasma. And the substrate in this case does not function as the structural member to sufficiently isolate the film-forming space from the other space which does not concern film formation as in the present invention.

Now, in the MW-PCVD method of the present invention, the gas composition and the state thereof in the space isolated from the film-forming space by the moving substrate web constituting the circumferential wall of the film-forming chamber are different from those in said film-forming space in order to perform film formation only in the film-forming space. For instance, the atmosphere of the space outside the film-forming space may be comprised of a gas which is not capable of contributing to the formation of a film or a gas containing the gas exhausted from the film-forming space. Upon film formation, as previously described, microwave plasma is confined in the film-forming space. In this case, it is important to prevent said microwave plasma from leaking outside the film-forming space in order to improve the stability and the reproducibility of microwave plasma in the film-forming space and to prevent a film from depositing on portions other than the substrate web. For this purpose, it is effective (a) to provide a difference between the pressure of the film-forming space and the pressure of the space outside the film-forming space, (b) to form a gas atmosphere comprising an inert gas having a small ionization cross-section or $H_2$ gas in the space outside the film-forming space or, (c) to purposely provide a means for preventing the leakage of microwave plasma from the film-forming space. In the case (c), as previously described, it is effective to seal the space connecting the film-forming space and the space outside the film-forming space with the foregoing conductive member. It is also effective to cover the foregoing space by the foregoing metal mesh or the foregoing punching board having a plurality of perforations.

When the pressure of the space outside the film-forming space is made substantially lower than the pressure of the film-forming space, or when the former pressure is made higher than the latter, the generation of microwave plasma in the space outside the film-forming chamber can be effectively prevented.

According to the MW-PCVD method as above described, it is possible to continuously form a desirable semiconductor deposited film having an uniform thickness and excelling in homogeneity on a large area and lengthy substrate with an improved gas utilization and with a high yield.

In the following, explanation is to be made about the MW-PCVD apparatus which is suitable for practicing the foregoing MW-PCVD method of the present invention.

As previously described, the basic constitution of the MW-PCVD apparatus of the present invention comprises: at least a substantially enclosed columnar film-forming chamber having a curved circumferential wall by curving and projecting a substrate web moving in the longitudinal direction from a pay-out mechanism to a take-up mechanism by a pair of rollers for supporting and curving said substrate web, said pair of rollers being arranged parallel to each other while leaving predetermined spacing between them in the longitudinal direction, said film-forming chamber having a film-forming space; at least a microwave applicator means connected to at least one of the two side faces of said film-forming chamber, said microwave applicator means being capable of radiating a microwave energy into said film-forming space in the direction parallel to said circumferential wall; means for evacuating said film-forming space; means for introducing a film-forming raw material into said film-forming space; and means for heating or cooling said substrate web. The MW-PCVD apparatus may further include means for applying a bias voltage into the film-forming space.

In the MW-PCVD apparatus of the present invention, the outside of the substrate web functioning as a structural member of the apparatus may be atmospheric air. However, in a preferred embodiment, said outside is enclosed by an appropriate enclosing means such that it is isolated from the open air. Particularly, the film-forming chamber may be isolated from the open air by means of a mechanically enclosing means with the use of O-ring, gasket, helicoflex, magnetic material, etc. In this case, the structure is made such that the substrate web can be continuously moved while being structurally sealed. Alternatively, there may be provided an enclosing vessel in the outside of the film-forming chamber which is capable of forming an atmosphere comprising a dilution gas which does not provide any negative influence to or provides a positive influence to a film to be formed in the film-forming chamber. There may also be provided other enclosing vessels in the outside of the film-forming chamber which is capable of vacuumizing said outside.

The MW-PCVD apparatus of the present invention may include a plurality of the foregoing film-forming chambers being horizontally arranged. In this case, the above enclosing vessel may be provided for each of those film-forming chamber. In the alternative, the foregoing enclosing may be provided such that it dominates all the film-forming chambers.

The MW-PCVD apparatus of the present invention may include one or more other film-forming apparatus. In this case, it is desired that every two apparatuses be connected by means of, for example, a gas gate means.

In the MW-PCVD apparatus of the present invention, the pressure of the outside of the film-forming chamber may be made to be either in a reduced pressure state or a pressured state. However, in order to prevent the circumferential wall comprising the moving substrate web of the film-forming chamber from deforming because of a difference caused between the pressure in the film-forming chamber and the pressure in the outside of said chamber, it is possible to provide an appropriate auxiliary structural member in the film-forming chamber. As such auxiliary member, there can be illustrated mesh members made of metal, ceramic or reinforced plastics. In this case, the auxiliary structural member comprising one of said mesh members is installed along the inner face of the circumferential wall in the film-forming chamber. In the case where the auxiliary structural mesh member is installed in this way in the film-forming chamber, the portions of the inner face of the circumferential wall shadowed by said mesh member are hardly exposed to microwave plasma and thus, there is only slight deposition of a film. In view of this, it is necessary to design said auxiliary structural mesh member such that it does not provide such shadowed portions on the inner face of the circumferential wall.

It is possible to design the auxiliary structural mesh member such that it rotates at the same speed as the substrate web moves upon film formation, to thereby purposely form a mesh pattern on said substrate web.

As previously described, it is desirable for the substrate web on which a film is to be deposited to be such that is neither deformed nor distorted because of a high temperature upon film-formation by MW-PCVD process, has a sufficient strength and is conductive. As such substrate web, there can be mentioned web members made of metals or alloys thereof such as stainless steel, aluminum, aluminum alloy, iron, iron alloy, copper, copper alloy, etc., web members made of combinations of two or more of these metals, and web members comprising any of said web members applied with a thin film of a different metal to the surface thereof by sputtering method, evaporation method or coating method, etc.

Other than these web members, there can also be illustrated heat-resistant sheets made of resins such as polyimide, polyamide, polyethyleneterephthalate, epoxy resins, etc. or other sheets made of compositions of said resins and glass fiber, carbon fiber, boron fiber, metal fiber, etc., which were respectively applied with a conductive film of a metal, alloy or transparent conductive oxide film such as ITO to their surface by a coating method, evaporation method, sputtering method, etc.

Any of these web members having a conductive surface may have an insulating film comprising $SiO_2$, $Si_3N_4$, $Al_2O_3$, AlN or one of said heat resistant region on part of the surface thereof.

The substrate web to be used in the present invention is desired to be as thin as possible as long as it can be desirably curved to provide a desirable curved columnar portion having a sufficient strength to constitute the circumferential wall of the film-forming chamber of the present invention, in view of cost, storage space, etc.

In general, the thickness of the substrate web is preferably in the range of from 0.01 to 5 mm, more preferably in the range of from 0.02 to 2 mm, and most preferably, in the range of from 0.05 to 1 mm.

As for the width of the substrate web, due consideration should be made that uniform microwave plasma be stably and repeatedly provided in the longitudinal direction (that is, in the width direction of the moving substrate web) in the film-forming chamber in which the circumferential wall being constituted by the moving substrate web and the shape of the columnar portion is stably maintained. In general, it is preferably in the range of from 5 to 100 cm and more preferably, in the range of from 10 to 80 cm.

Further, as for the length of the substrate web, there is not any particular restriction therefor.

In the MW-PCVD apparatus of the present invention, as previously described, it is basically required that the moving substrate web is desirably curved and projected to provide a columnar portion to be the circumferential wall of the film-forming chamber by an initial roller capable of initially curving and projecting the substrate web delivered from a pay-out mechanism while supporting and conveying said substrate web (hereinafter referred to as "initial roller") upward and a terminal roller capable of terminally curving the substrate web (hereinafter referred to as "terminal roller") while supporting and conveying the substrate web in the longitudinal direction toward to a take-up mechanism while leaving a spacing of a predetermined width in the longitudinal direction between the two rollers. The two side faces of the columnar portion are respectively provided with a supporting and conveying rotary ring to maintain the columnar portion in a desired state, wherein one of the two side end parts of the columnar portion is supported by one of the two rotary rings in such way that the substrate web is in contact with the surface of said rotary rings. The substrate web is moved by rotating said two rollers and/or said two rings by a driving motor. In the case of moving the substrate web by rotating the two rotary rings, it is possible to use a pair of toothed rotary rings. In this case, it is necessary that the two side portions of the substrate web are provided with perforations corresponding to the projections of the two toothed rotary rings. In the alternative, it is possible to slidably convey the substrate web over the two rings without rotating them. It is desirable that each of the two rotary rings should have the same shape. A truly round shape is the most desirable. However, they may have other shapes such as oval shape, rectangular-like shape, etc.

In the MW-PCVD apparatus, it is an important factor to maintain the transportation speed of the substrate web constant in order to prevent the substrate web from loosening, wrinkling, side-sliding, etc. during its transportation. For this purpose, it is desirable to provide a detecting mechanism for detecting the transportation speed of the substrate web and a transportation speed controlling mechanism for automatically controlling the transportation speed of the substrate web based on the signal from said detecting mechanism to the supporting and conveying mechanism. These mechanisms are also effective for controlling the thickness of a semiconductor film to be formed on the substrate web.

In any case, each of the two rotary rings is situated, so that it is unavoidably exposed to microwave plasma upon film formation. Thus, there is a fear that a film is deposited also on the surface thereof and said film is removed therefrom to fly into a film deposited on the inner face of the circumferential wall comprising the moving substrate web of the film-forming chamber, wherein the resulting film developes defects such as pin holes. Therefore, it is required for the rotary ring to have a sufficient resistance not only against heat and but also against corrosin. It is also required therefor that little or no film be deposited or the rotary ring have an ability to hold a repeated deposited film thereon and not be removed. In view of this, the rotary ring is necessarily made of a selected material so that said requirements be fulfilled.

Specifically, the rotary ring is made of a material selected from the group consisting of stainless steel, nickel, titanium, vanadium, tungsten, molybdenum, niobium, and alloys of two or more of these metals. The surface of the rotary ring made of one these materials may be applied with a coat comprising a ceramic material such as alumina, quartz, magnesia, zirconia or silicon nitride which is formed by a flame-spraying method, evaporation method, sputtering method, ion-plating method, CVD-coating method, etc. Further, the rotary ring may be made of one of the foregoing ceramic materials or one of composites comprising two or more of these ceramic materials. The surface of the rotary ring may be a mirror-ground surface or an uneven surface depending upon the related factors such as stress of a film to be deposited thereon.

It is desirable to purposely remove a film deposited on the rotary rings before it is peeled off and dispersed in the film-forming chamber. The removal of said film is preferably to be conducted by dry-etching or decomposing said film under vacuum condition and thereafter, carrying out chemical or physical treatments such as wet-etching or beads-blast. The foregoing initial and terminal rollers are so designed respectively to have a larger area to be in contact with the substrate web in comparison with the foregoing pair of rotary rings. Thus, the heat exchange effectiveness of the roller with the substrate web is large. Therefore, it is necessary to to take care that the moving substrate web is not undesirably heated or cooled by the initial and terminal curving rollers. For this purpose, it is desirable to provide an appropriate temperature controlling mechanism to said rollers. Further, it is possible to provide an appropriate conveying tension detecting mechanism to said rollers. This is effective in order to maintain the transportation speed of each of the rollers at a constant speed. Further, in order to prevent the moving substrate web from deflecting, twisting, side-sliding, etc. upon supporting and curving by each of the rollers, a crown mechanism may be provided to said rollers.

The foregoing columnar portion to be the circumferential wall of the film-forming chamber is so established as to include the end portion of the microwave applicator means. As previously described, the microwave applicator means is desired to be arranged to the central position of one of the two side faces of the columnar portion in view of uniformly generating microwave plasma in the film-forming chamber and securing the uniformity of a film to be formed on the inner face of the circumferential wall of the film-forming chamber.

The inside diameter of each of the side faces of the foregoing columnar portion determine the propagating mode of microwave and the volume of a microwave plasma region to be provided. Particularly, the thickness of a film to be formed on the inner face of the circumferential wall comprising the moving substrate web of the film-forming chamber will be determined depending upon a period of time during which said inner face is exposed to said microwave plasma region when said inner face is being transported. And depending upon the width of the substrate web, the area ratio of the inner face of the circumferential wall to the entire surface circumscribing the film-forming space will be determined. As a result, the gas utilization efficiency will be determined.

The microwave power density (W/cm$^3$), in order to maintain microwave plasma in the foregoing microwave plasma region, will be determined by the interrelations between the kind of a film-forming raw material gas to be used, its flow rate, the inner pressure, radiation state of a microwave energy from the microwave applicator means, propagating ability of said microwave energy, the absolute volume of the microwave plasma region, etc. Thus, it is extremely difficult to generalize said microwave power density.

The control of the thickness of a film to be formed on the inner face of the circumferential wall of the film-forming chamber may be carried out by placing a substrate cover over part of said inner face.

Now, as for the substrate web to be used in the present invention, it may have an electroconductive layer thereon where necessary. For example, in the case of continuously preparing a solar cell, when a substrate web made of an electroconductive material is used, it is not necessary to apply an electroconductive layer thereon since the electroconductive substrate web itself is capable of being a current outputting electrode. However, when a substrate web made of an insulating material such as synthetic resin is used, it is necessary to provide an electroconductive layer capable of serving as the current outputting electrode on the surface thereof, on which a semiconductor film is to be formed in the MW-PCVD apparatus of the present invention. Such electroconductive layer may be formed by applying onto the surface of the insulating substrate web an electroconductive material of Al, Ag, Pt, Au, Ni, Ti, Mo, W, Fe, V, Cr, Cu, stainless steel, brass, nichrome, $SnO_2$, $In_2O_3$, ZnO, $SnO_2$—$In_2O_3$(ITO) or TCO by means of metal plating, evaporation or sputtering.

In any case, any of these substrate webs may have an insulating layer portion intermitently on the surface thereof in order to ease the operation of dividing the product into a plurality of independent elements.

Further, in order to improve the reflectivity of a long wavelength light on the surface of a substrate, or in order to prevent mutual dispersions of the constituent elements of a substrate and a deposited film formed thereon between the substrate and the deposited film or in order to prevent occurrence of short circuit, it is possible to provide an appropriate layer on the substrate which comprises a metal different from the constituent element of the substrate or of the electroconductive layer.

In the case of preparing a solar cell of the type where light is impinged from the substrate side, when there is used a relatively transparent web member as the substrate web, it is desirable that an electroconductive thin layer comprising the foregoing electroconductive oxide material or metal be provided on the surface thereof in advance.

The substrate web may be one that has an even surface or an uneven surface accompanied with minute irregularities.

In the case of the latter substrate web, the minute irregularities may be comprised of a plurality of dimples of round, conical or pyramid forms, wherein the maximum height (R max) of the dimple is preferably from 500 to 5000 Å.

The solar cell prepared using such substrate web becomes such that light is irregularly reflected to increase the optical path length of light reflected at the surface thereof.

In the MW-PCVD apparatus of the present invention, the microwave applicator means is provided with a microwave transmissive member at its end portion, said microwave transmissive member being hermetically connected to the film-forming chamber through its side face by way of a pressure durable structure. Particularly, the structure of this part is designed to be in a round, rectangular, bell jar, doublet or conical form.

As for the thickness of the foregoing microwave transmissive member in the direction which microwaves propagate, it should be determined so that the reflection of microwave at the transmissive member can be minimized, with due regard to the dielectric constant of a dielectric material of which said member is to be made.

For instance, in the case where it is of a plate form, the thickness is desired to be ½ of the wavelength of microwave.

The dielectric material to constitute the microwave transmissive member is desired to be such that permits a microwave energy from the microwave applicator means to be radiated into the film-forming chamber with a minimum loss and excels in airtightness to prohibit flow of air into the film-forming chamber.

Examples of such material are glasses or fine ceramics such as quartz, alumina, silicon nitride, beryllia, magnesia, boron nitride, etc.

In the MW-PCVD apparatus, in order to prevent the microwave transmissive member from being damaged because of microwave energy or plasma energy, an appropriate mechanism for uniformly cooling said microwave transmissive member may be provided.

As such cooling mechanism, there can be employed, for example, a cooling mechanism of blowing cooled air over the outside surface of the microwave transmissive member; or a mechanism of cooling the microwave applicator means with the use of a cooling medium such as cooled air, water, oil or freon to thereby cool the microwave transmissive member.

In this case, as the microwave transmissive member is cooled and maintained constant at a sufficiently low temperature, it is not damaged by heat even if a microwave energy is applied with a relatively high power into the film-forming chamber, wherein it is possible to desirably generate microwave plasma of a high electron density.

In the MW-PCVD apparatus of the present invention, the surface of the microwave transmissive member which is situated in the film-forming space and is to be in contact with microwave plasma therein is also deposited with a film after repeated film formation. In this case, it depends upon the kind and the property of the film deposited on said surface of the microwave transmissive member, but in general, microwave energy to be radiated from the microwave applicator means is absorbed or reflected by such deposited film to cause reduction in the quantity of microwave energy radiated into the film-forming chamber. As a result, sometimes a case will occur that microwave plasma cannot be stably maintained and as a result there is a decrease in the film deposition rate, and the resulting film is defective in the characteristics. In order to avoid occurrence of this situation, it is necessary to periodically clean the microwave transmissive member by dry-etching, wet-etching or a mechanical cleaning means. The cleaning of the microwave transmissive member can be desirably carried out by dry-etching the film deposited thereon while maintaining the vacuum of the film-forming chamber. In the alternative, the cleaning of the microwave transmissive member can also be carried out in the following way. That is, the whole unit of the microwave applicator means containing the microwave transmissive member is transported into a load lock chamber being connected to the film-forming chamber without breaking the vacuum of the film-forming chamber, the microwave transmissive member is cleaned by dry-etching or a mechanical cleaning means in said load lock chamber, and said whole unit containing the cleaned microwave transmissive member is returned to the film-forming chamber. Alternatively, the microwave transmissive member having a deposited film thereon can be replaced by a new one.

Further, it is possible to maintain the microwave transmissive member in a desirable state without having film deposited by continuously moving a sheet made of a dielectric material equivalent to the dielectric material constituting the microwave transmissive member along the surface thereof situated in the film-forming space to thereby prevent a film from depositing on said surface and removing the sheet having a film deposited thereon from the film-forming chamber.

The microwave applicator means has such a structure that functions to radiate a microwave energy supplied from a microwave power source into the film-forming chamber in a desirable state, thereby decomposing a film-forming raw material gas supplied from the gas feed means with the action of said microwave energy to stably generate plasma causing the formation of a semiconductor film on the inner face of the circumferential wall comprising the moving substrate web of the film-forming chamber and to maintain said plasma constant in a desirable state.

The microwave applicator means may be of the same specification as that of the microwave transmissive member. It is a matter of course that the microwave applicator means may be a specification different from that of the microwave transmissive member.

The microwave applicator means is preferred to be designed with regard to its size and shape such that the microwave propagating mode in said microwave applicator means be a single mode in order to make a microwave energy effectively propagated in the film-forming chamber thereby stably generating, maintaining and controlling microwave plasma.

However, it is possible to employ a plurality of modes in the case if the microwave plasma generating parameters: the kind of a film-forming raw material gas, the inner pressure, the microwave power, etc. are properly determined.

As the microwave propagating mode to establish the single mode, there can be mentioned, for example, $TE_{10}$ mode, $TE_{11}$ mode, $eH_1$ mode, $TM_{11}$ mode and $TM_{01}$ mode. Of these modes, $TE_{10}$ mode, $TE_{11}$ mode and $eH_1$ mode are the most desirable. A waveguide capable of propagating a microwave energy with the above-mentioned mode is connected to the microwave application means. In a preferable embodiment, the microwave propagating mode in the waveguide is made equivalent to that in the microwave applicator means.

The kind of waveguide should be appropriately determined depending upon the frequency band and the propagating mode of a microwave to be used. Its cut-off frequency is desired to be smaller than the frequency to be used.

Usable as the waveguide are, for example, rectangular waveguide, circular waveguide and oval waveguide of JIS, EIAJ, IEC or JAN. Other than these waveguides, it is possible to use a waveguide having a rectangular cross-section which is 96 mm in width and 27 mm in height.

In the MW-PCVD apparatus of the present invention, the microwave energy from the microwave power source is effectively radiated through the foregoing microwave applicator means into the film-forming chamber, so that problems relating to the so-called reflected wave can be desirably eliminated, and relatively stable discharge can be maintained without using a microwave matching circuit such as three-stub tuner or E-H tuner in the microwave circuit.

However, in the case where there is a concern that strong reflected wave would be caused before commencement of discharge or such strong reflected wave would be caused by abnormal discharge after discharge is started, it is desirable to provide the foregoing microwave matching circuit in order to protect the microwave power source.

In the MW-PCVD apparatus of the present invention, the film-forming chamber is provided with the foregoing spacing between the foregoing initial and terminal curving rollers, through which spacing the film-forming space is evacuated by means of an exhaust means to thereby maintain said film-forming space at a predetermined pressure during film formation.

The size of said spacing is necessarily designed such that a sufficient exhaust conductance is provided and the microwave energy radiated into the film-forming chamber is not leaked out of said chamber.

Particularly, the microwave applicator means is arranged such that the face containing the central axis of the foregoing initial curving roller and the central axis of the foregoing terminal curving roller is not in parallel to the electric field direction of the microwave to be propagated in said microwave applicator means. That is, the foregoing waveguide is arranged such that the face containing the longer edge or the longer axis of said waveguide is not parallel to the face containing the central axes of the foregoing initial and terminal curving rollers.

Even in the case where a microwave energy is radiated into the film-forming chamber by using a plurality of the foregoing microwave applicator means, it is necessary that each of said microwave applicator means to be arranged in the same way as described above.

As previously described, the maximum size of the width of the foregoing spacing in the longitudinal direction which is provided between the initial and terminal curving rollers is desired to be made preferably less than ½ or more preferably less than ¼ of the wavelength of microwave.

Further, in the case where a plurality of the foregoing microwave applicator means are provided to the film-forming chamber such that they are opposite each other through the film-forming space of said chamber, it is necessary to arrange each of them in the way so as not to cause problems that a microwave energy radiated by one microwave applicator means is received by the other microwave applicator means. The microwave energy thus received by the latter microwave applicator means arrives at the microwave power source for the latter microwave applicator means and thereby damages said power source or causes abnormality in the oscillation of microwave power. Particulary in this respect, those microwave applicator means are arranged such that the electric field direction of a microwave energy propagating in one microwave applicator means is not in parallel to the electric field direction of a microwave energy propagating in other microwave applicator means. In other words, those microwave applicator means are so arranged that the face containing the longer edge or longer axis of the waveguide connected to one microwave applicator means is not in parallel to the other face containing the longer edge or longer axis of the waveguide connected to the other microwave applicator means.

In the MW-PCVD apparatus of the present invention, when a microwave energy is radiated through only one side face of the film-forming chamber into said chamber, it is necessary to design the remaining side face so that a microwave energy does not leak through that side face. For this purpose, the remaining side face is covered by an electroconductive member or a perforated member such as a metal mesh member or punching board respectively having a plurality of perforation each perforations, being preferably less than ½ or more preferably less than ¼ of the wavelength of microwave to prevent microwave energy from leaking to the outside of the film-forming chamber.

In the MW-PCVD apparatus, as previously described, it is possible to provide a bias voltage applying means to the film-forming chamber in order to control the plasma potential.

In the following, explanation is made about the constitution and arrangement of the bias voltage applying means in the MW-PCVD apparatus of the present invention with reference to FIG. 15(a) through FIG. 15(d).

Figure 2:
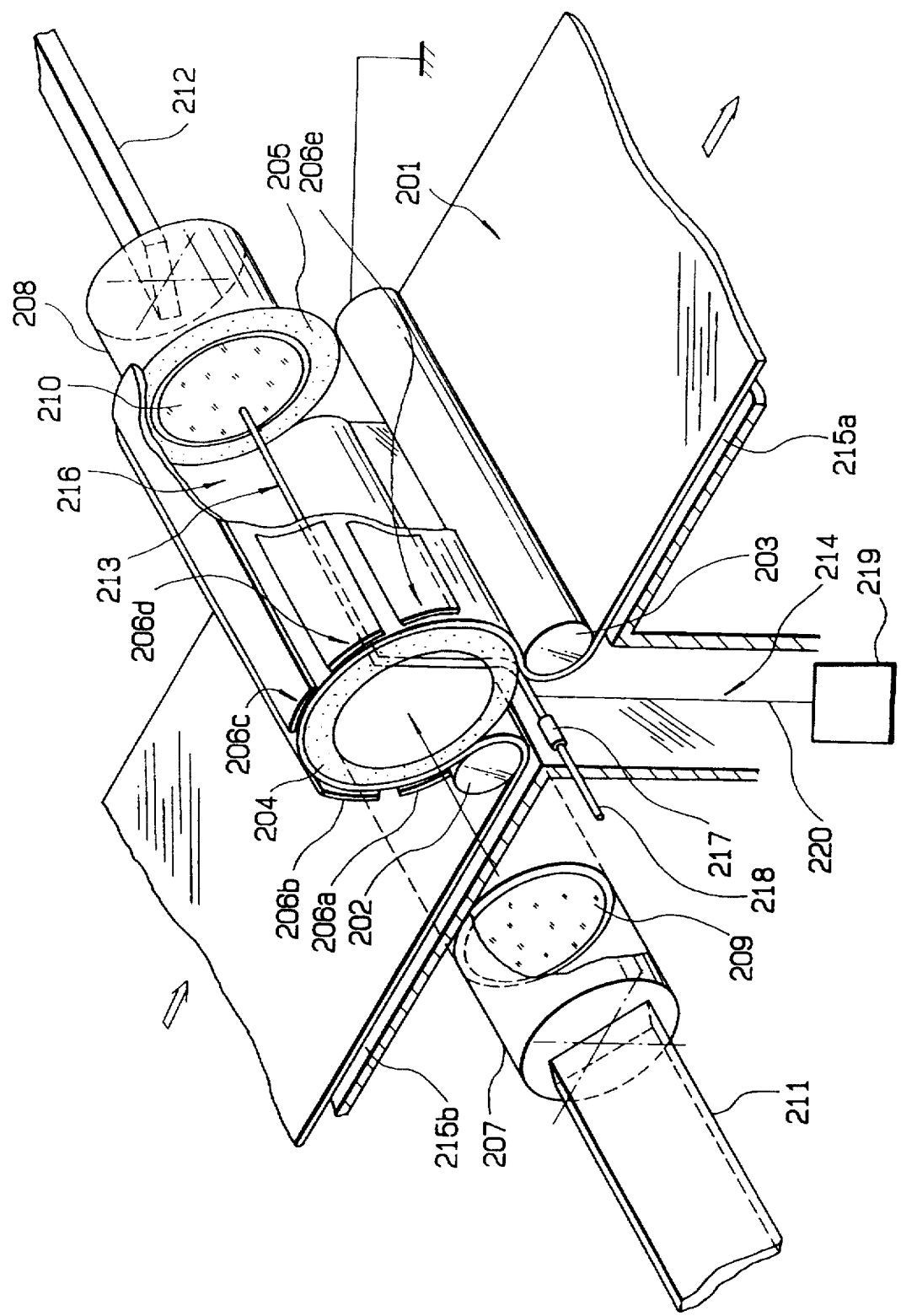
FIG. 2 is a schematic diagram illustrating the constitution of a second representative embodiment of the MW-PCVD apparatus according to the present invention which is a partial modification of the apparatus shown in FIG. 1 wherein a bias voltage applying means is additionally provided.

FIG. 15(a) through FIG. 15(d) are schematic cross-section views respectively illustrating the constitution of the bias voltage applying means to be provided to the MW-PCVD apparatus in the way shown by numeral reference 217 in FIG. 2. In each case, the constitution of the bias voltage applying means is shown as a schematic side cross-section view in the H–H' direction in FIG. 10.

FIG. 15(a) shows a typical example of the case where the bias voltage applying means serves also as the gas feed means.

In FIG. 15(a), a substrate web 1501 as the circumferential wall of the film-forming chamber is electrically grounded and it is moved while maintaining its columnar shape by a supporting and curving roller 1502. Numeral reference 1503 stands for a bias voltage applying pipe capable of serving as a gas feed pipe. Numeral reference 1510 stands for a gas supply pipe extending from a gas reservoir (not shown), and said gas supply pipe 1510 is connected through an insulating fitting 1509 to the bias voltage applying pipe 1503. Numeral reference 1507 stands for a bias voltage generating power source which is electrically connected to the bias voltage applying pipe 1503. As the power source 1507, a commercially available DC power source or AC power source maybe used. Other than these power sources. A power source system capable of applying a selected bias voltage having various wave forms and frequencies wherein a wave form outputted, for example, from a function generator which is amplified by a precision power amplifier may be used.

It is desirable to set up a system which always monitors the bias voltage and the bias current value by a recorder and sends the data obtained to a control circuit for improving the stability and reproducibility of microwave plasma and controlling the occurrence of abnormal discharge.

There is not any particular restriction for the position at which the bias voltage applying pipe 1503 is arranged in the film-forming chamber as long as the bias voltage applying pipe is situated so as to be in contact with microwave plasma generated.

In a preferred embodiment, in view of preventing occurrence of abnormal discharge, the bias voltage applying pipe 1503 is arranged at the position preferably apart by more than 10 mm or more preferably by more than 20 mm from the inner face of the circumferential wall 1501.

Since the bias voltage applying pipe 1503 also serves to feed a film-forming raw material gas into the film-forming space, said pipe is desired to be provided with a plurality of gas liberation holes or slits capable of uniformly spouting a film-forming raw material gas preferably in the longitudinal direction.

As for the diameter and the length of the bias voltage applying pipe 1503, they are designed such that a desired current density be provided. As for its surface area, it is desirable to be as small as possible, as long as the desired current density is ensured, with the view of preventing film deposition thereon which will cause contamination of a film formed on the inner face of the circumferential wall comprising the moving substrate and will also cause reduction in the gas utilization efficiency.

FIG. 15(b) and FIG. 15(d) are schematic explanatory views respectively illustrating a typical example of the constitution wherein an independent bias voltage applying means and an independent gas feed means are separately arranged in the film-forming chamber.

In the case of FIG. 15(b), there is arranged a bias bar 1504. And in the case of FIG. 15(d), there are separately arranged a first bias bar 1504 and a second bias bar 1506. In any of these two cases, it is possible to arrange one or more additional bias bars.

In the case of FIG. 15(d), the two bias voltage applying power sources 1507 and 1508 can have different specifications or have the same specifications.

In either one the two cases, a film-forming raw material gas is supplied through a gas feed pipe 1505 into the film-forming space. The gas feed pipe 1505 is preferably made of a dielectric material, so as to of preventing occurrence of abnormal discharge and provide an uniform plasma potential. However, it can be made of a conductive material. In this case, it is necessary for the gas feed pipe to be electrically grounded.

FIG. 15(c) schematically illustrates a typical example of the case where a bias voltage is applied onto the substrate web as the circumferential wall of the film-forming chamber wherein a bias voltage applying power source is electrically connected to the substrate web 1501 and a gas feed pipe 1505 made of a conductive material is electrically grounded. In this case, it is possible to use a gas feed pipe 1505 made of a dielectric material and to provide an earth electrode.

In this case, there is particular restriction for the position of said gas feed pipe to have be arranged in the film-forming chamber as long as it is situated so as to contact with microwave plasma generated.

As previously described, the MW-PCVD apparatus of the present invention may include one or more other film-forming vacuum vessels. In this case, each of the vacuum vessels is isolated one from the other by means of a gas gate means capable of allowing transportation of the substrate web from one to the other under vacuum. In the MW-PCVD apparatus, the inside of the film-forming chamber (or vacuum vessel) is desirably maintained at such a pressure which is required for the performance near the minimum value of the modified Pashen's curve. Therefore, the inside pressure of another vacuum vessel connected to the film-forming chamber (vacuum vessel) of the present invention often becomes equivalent or superior to that of the film-forming chamber (vacuum vessel) of the present invention. Thus, it is required that said gas gate means functions to prevent a film-forming raw material gas used in one vacuum vessel from dispersing into the other vacuum vessel. In order to design the gas gate means so as to satisfy this requirement, the principle of a gas gate means disclosed in the specification of U.S. Pat. No. 4,438,723 may be employed. Particularly in this respect, the gas gate means is required to stand against a pressure difference of about $10^6$ hold. As the exhaust pump therefor, an exhaust pump having a high exhausting capacity such as oil diffusion pump, turbomolecular pump, mechanical booster pump, etc. is used.

The cross-section form of the gas gate means is desired to be in the form of a slit or the like form. The scale thereof is properly designed based on the result obtained by a known conductance computation equation in connection with its full length and the exhausting capacity of the exhaust pump used.

Figure 14A:
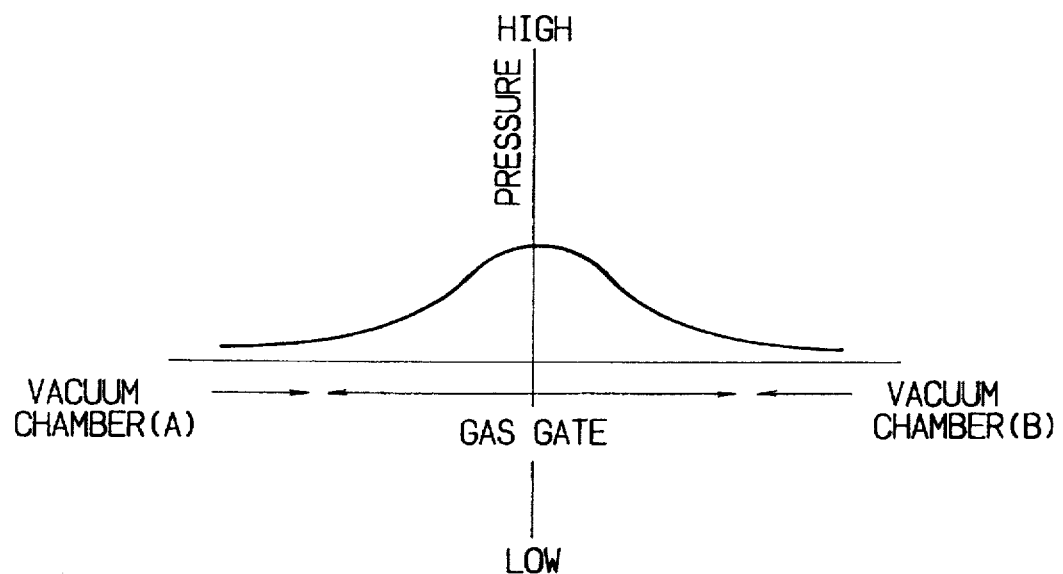
FIGS. 14(a) and 14(b) are schematic graphs respectively for illustrating a pressure gradient in the gas gate in the present invention.
Figure 14B:
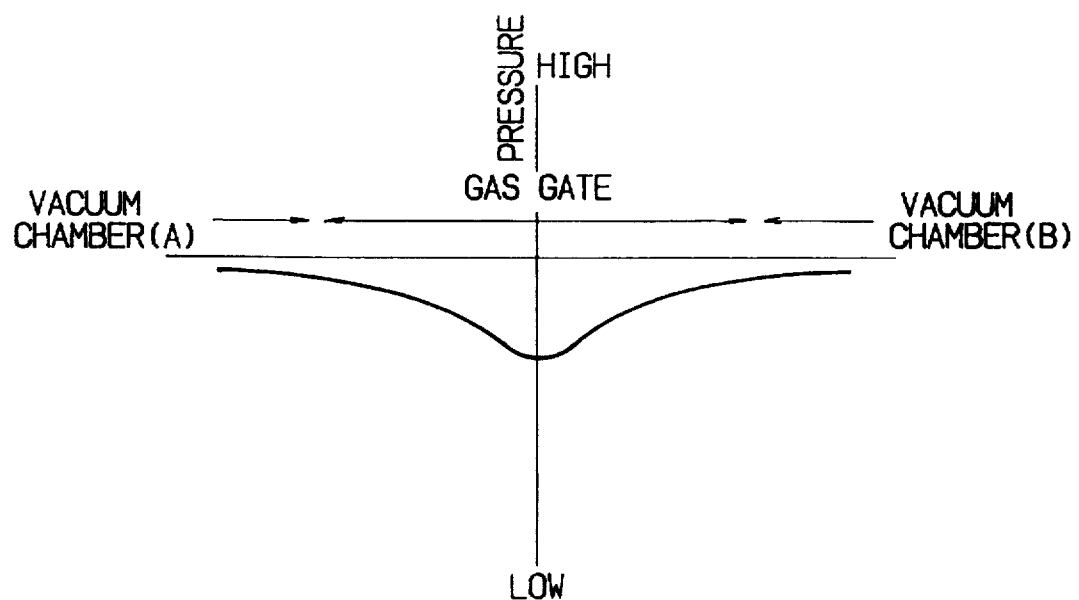

In order to sufficiently isolate one vacuum vessel from the other vacuum vessel, it is desirable to use a gate gas. Usable as the gate gas are rare gases such as Ar, He, Ne, Kr, Xe, Rn, etc. and dilution gases for diluting a film-forming raw material such as $H_2$. The flow rate of such gate gas can be properly determined depending upon the conductance of the entire gas gate and the exhausting capacity of the exhaust pump used, utilizing the pressure gradient shown in FIG. 14(a) or FIG. 14(b). In the case of FIG. 14(a), it is understood that the point where pressure becomes maximum is situated near the central part of the gas gate and thus, the gate gas dividedly flows from the central part toward the respective adjacent vacuum vessels positioned in the both sides. In the case of FIG. 14(b), it is understood that the point where pressure becomes minimum is situated near the central part of the gas gate and thus, the gate gas is exhausted together with film-forming raw material gases from the adjacent vacuum vessels through the central part. In this connection, in each of these two cases, it is possible to prevent mutual dispersion of the gases used in the adjacent vacuum vessels. In practice, this is done by measuring the amount of a gas to be dispersed by a mass spectrometer or by analyzing the composition of the resultant deposited film to find an optimum condition.

In the MW-PCVD apparatus of the present invention, the film formation in a vacuum vessel other than the film-forming chamber of the present invention can be carried out by any known film-forming method such as RF plasma CVD method, sputtering method, reactive sputtering method, ion plating method, light-induced CVD method, thermally induced CVD method, MO-CVD method, MBE method, HR-CVD method, etc. It is also possible to use a microwave plasma CVD method similar to the MW-PCVD method of the present invention.

The frequency of microwave to be used in the MW-PCVD apparatus is preferably of 2.45 GHz but it is possible to use microwave of other frequency.

The oscillation system in order to provide stable discharge is desired to be continuous oscillation. And its ripple width is desired to be preferably within 30% or more preferably within 10% in the use output region.

In order to obtain a high quality semiconductor film, it is perferable to continue film formation without opening the film-forming chamber to the open air. However, there is a limit for the length of a substrate web used. Therefore, it is necessary to connect a new substrate web to the previously used substrate web by means of an appropriate connecting means such as welding. This can be carried out, for example, in a processing chamber arranged next to the chamber containing the pay-out mechanism or the take-up mechanism.

In the following, explanation is made about the processing of a substrate web upon film formation.

FIG. 13(a) through FIG. 13(j) are, respectively, schematic views for illustrating the outline of the substrate web processing chamber and the operation of the substrate web upon film-formation.

In FIG. 13, 1301a represents a first substrate web processing chamber disposed on the side of delivering the substrate web and 1301b represents a second substrate web processing chamber disposed on the side of taking-up the substrate web, in which are contained a pair of rollers 1307a or a pair of rollers 1307b, respectively made of a fluorine containing rubber, a pair of cutting blades 1308a or 1308b and a welding jig 1309a or 1309b.

Figure 13A:
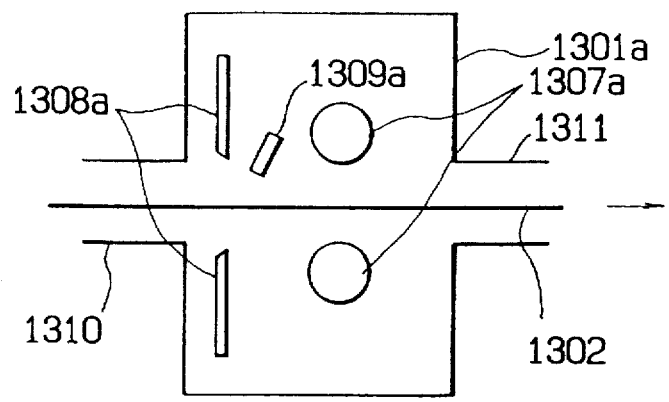
FIGS. 13(a), 13(b), 13(c), 13(d), 13(e), 13(f), 13(g), 13(h), 13(i), and 13(j) are schematic views for illustrating the operations in the substrate web processing chamber in the present invention.
Figure 13B:
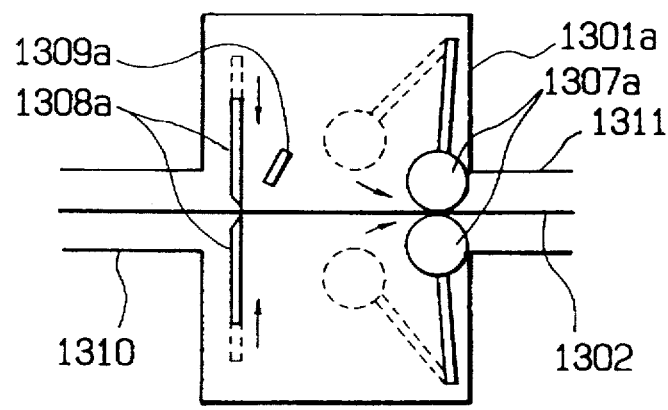
Figure 13C:
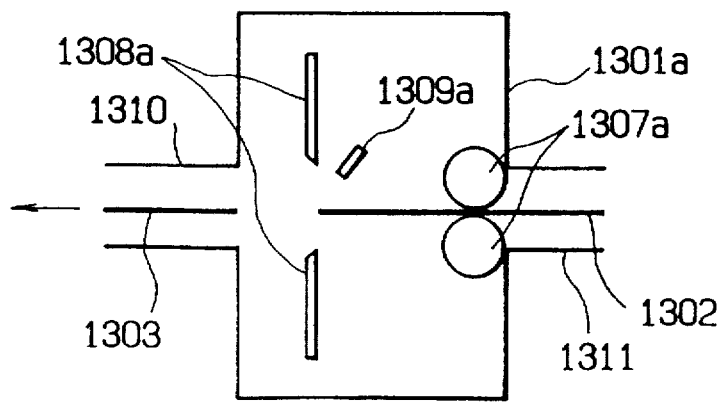
Figure 13D:
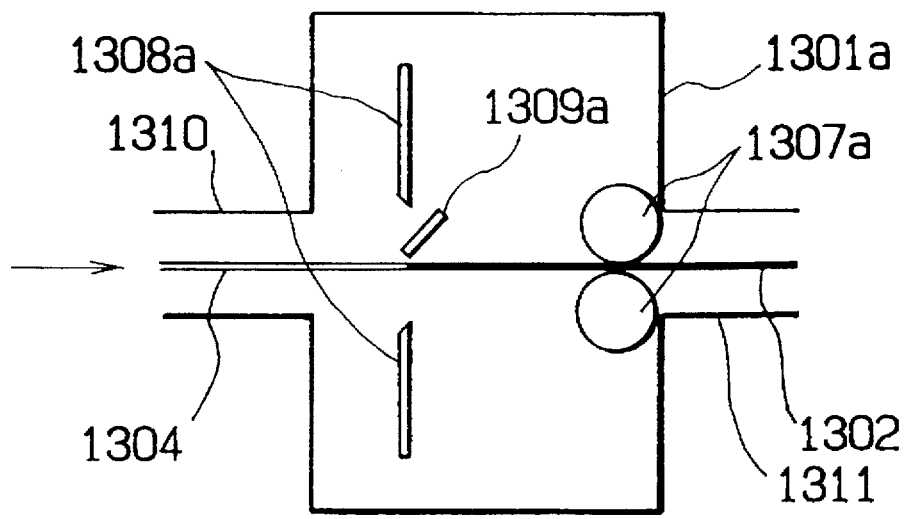
Figure 13E:
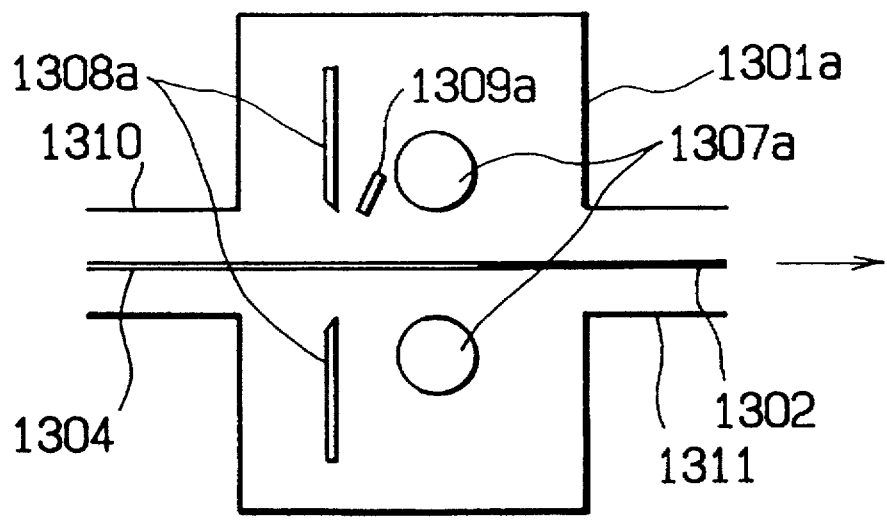
Figure 13F:
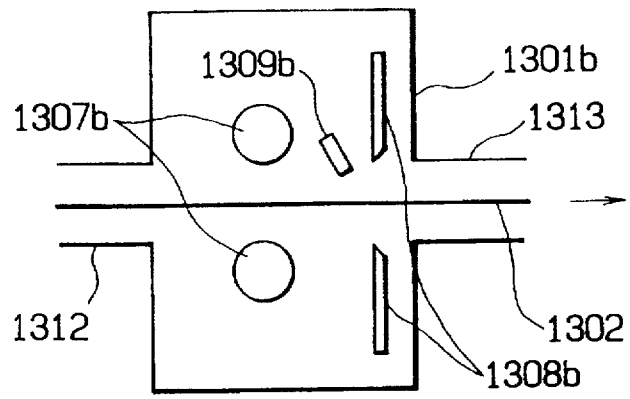
Figure 13G:
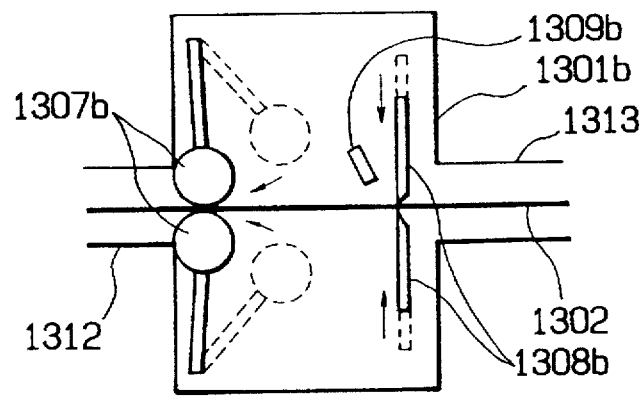
Figure 13H:
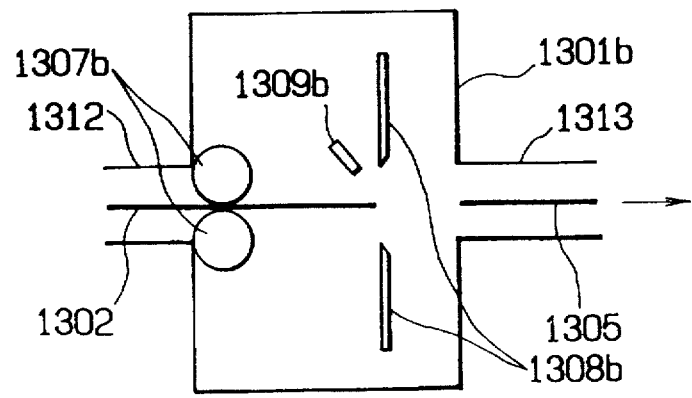
Figure 13I:
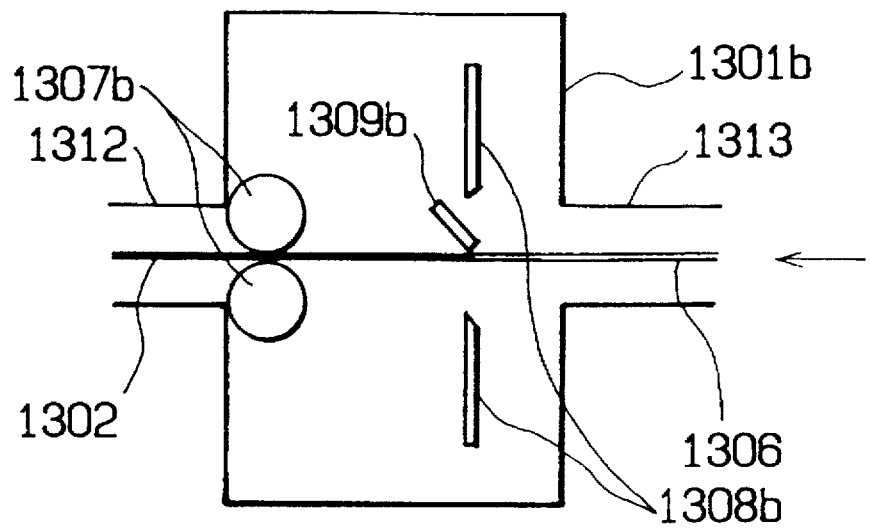
Figure 13J:
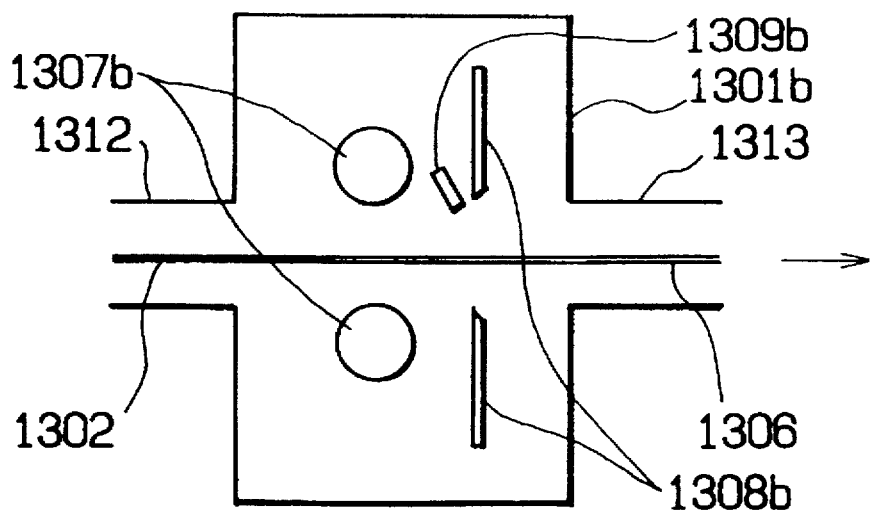

That is, FIG. 13(a) shows a state of the usual film-formation, in which the substrate web 1302 is moving in the direction of an arrow, and the rollers 1307a, the cutting blades 1308a and the welding jig 1309a are not in contact with the substrate web 1302. Numeral reference 1310 represents a connection pipe (gas gate) with an initial substrate web container (not shown). Numeral reference 1311 represents a connection pipe (gas gate) with a first film-forming chamber (A).

FIG. 13(*b*) shows a first step for replacing a new substrate web after the completion of the film-forming step to one roll of the substrate web. At first, the substrate web 1302 is stopped, and the rollers 1307a are moved from the positions shown by the dotted lines along the directions of arrows shown in the figure, and are thereby brought into close contact with the substrate web 1302 and the wall of the substrate web processing chamber 1301a. In this state, the initial substrate web container and the first film-forming chamber are separated in a gas sealed manner of operating the gas gate. Then, the pair of cutting blades 1308a are operated in the directions of arrows to cut the substrate web 1302. The cutting blades 1308a are constituted so as to mechanically, electrically or thermally cut the substrate web 1302.

FIG. 13(*c*) shows a state in which the cut and separated substrate web 1303 is taken up on the side of the initial substrate web container.

The above cutting and taking-up steps can be conducted inside the initial substrate web container under a vacuum state or under a state of leaking to atmospheric air.

FIG. 13(*d*) shows a step in which new substrate web 1304 is supplied and connected with the former substrate web 1302. The substrate webs 1304 and 1302 are brought into contact at the ends thereof and then connected by welding using the welding jig 1309a.

FIG. 13(*e*) shows a state in which the inside of the first substrate web container (not shown) is evacuated to sufficiently reduce the pressure difference relative to the film-forming chamber and, thereafter, the pair of roller 1307a are parted from the substrate web 1302 and the substrate webs 1302 and 1304 are taken up.

A description is now to be made of the operation on the side of taking-up the substrate web.

FIG. 13(*f*) shows a usual film-forming state, in which respective jigs are disposed substantially in symmetry with those described in FIG. 13(*a*).

FIG. 13(*g*) shows a step for taking out one roll of a substrate web after the completion of the film formation thereto, and placing an empty bobbin for taking-up the substrate web applied with the subsequent film-forming step.

At first, the substrate web 1302 is stopped, and the pair of rollers 1307b are moved from the positions shown by the dotted lines along the directions of arrows shown in the figure and are brought into close contact with the substrate web 1302 and the wall of the second substrate web processing chamber 1301b. In this state, the foregoing terminal substrate web container and the film-forming chamber are separated in a gas tight manner of operating the gas gate. Then, the pair of cutting blades 1308b are moved in the directions of arrows to out the substrate web 1302. The cutting blades 1308b are constituted of any one of those capable of mechanically, electrically or thermally cutting the substrate web 1302.

FIG. 13(*h*) shows the state in which a cut substrate web 1305 after the completion of the film-forming step is taken up on the side of the terminal substrate web container.

The above cutting and taking-up steps can be conducted at the inside of the terminal substrate web container under an evacuated state or under a state of leaking to atmospheric.

FIG. 13(*i*) shows a step in which a stand-by substrate web 1306 for taking-up use attached to a new taking-up bobbin is supplied and connected with the substrate web 1302. The substrate web 1306 and the substrate web 1302 are in contact with each other at the ends thereof and then connected by welding using the welding jig 1309b.

FIG. 13(*j*) shows a state in which the inside of the terminal substrate web container (not shown) is evacuated to sufficiently reduce the pressure difference with a film-forming chamber (B) and thereafter, the rollers 1307b are aparted from the substrate web 1302 and the wall of the second substrate web processing chamber 1301b and the substrate webs 1302 and 1306 are being taken up.

As shown in FIG. 13, since the substrate web can be replaced by another substrate web easily while maintaining the evacuated state in the film-forming chamber, the operation efficiency can be remarkably improved. In addition, since the inside of the film-forming chamber is not exposed to the atmospheric pressure, there is not any occasion for the inner wall of the film-forming chamber to be wetted with water, thereby enabling the stable preparation of semiconductor devices of high quality.

According to the present invention, there can be continuously formed a desirable high quality amorphous or crystalline semiconductor film on a large area and lengthy substrate at a high deposition rate and with a high yield.

As such semiconductor film, there can be mentioned, for example, so-called IV Group semiconductor films containing Si, Ge, C, etc.; so-called IV Group alloy semiconductor films containing SiGe, SiC, SiSn, etc.; so-called III–V Group semiconductor films containing GaAs, GaP, GaSb, InP, InAs, etc.; and so-called II–VI Group semiconductor films containing ZnSe, ZnS, ZnTe, CdS, CdSe, CdTe, etc.

As the film-forming raw material gases for forming these semiconductor films in the present invention, known gaseous or easily gasifiable compounds may be used capable of contributing to the formation of such semiconductor film as hydrides, halides or organic metal compounds of one or more of the constituent elements of a semiconductor film to be formed.

One or more of these film-forming raw material gases are introduced through the foregoing gas feed means or the foregoing bias voltage applying means capable of serving as the gas feed means into the film-forming chamber upon film formation.

It is possible that the film-forming raw material gas is mixed with an appropriate rare gas or dilution gas and then introduced into the film-forming chamber. Usable as such rare gas are, for example, He, Ne, Ar, Kr, Xe, Rn, etc. Usable as such dilution gas are, for example, $H_2$, HF, HCl, etc.

In the present invention, the semiconductor film to be continuously formed on the foregoing substrate web may be controlled with respect to the valence electron or the forbidden band width by incorporating a valence electron controlling element or a forbidden band width controlling element into the film upon its formation. In this case, a raw material gas capable of imparting such element is introduced into the film-forming chamber independently or together with the film-forming raw material gas, optionally while being mixed with the above rare gas or dilution gas.

In the present invention, as previously described, the film-forming raw material gas introduced into the film-forming chamber is decomposed with the action of a microwave energy to produce a precursor causing the formation of a film on the moving foregoing substrate web.

The MW-PCVD apparatus of the present invention will now be explained more specifically with reference to the drawings as follows. The description is not intended to limit the scope of the present invention.

Apparatus Embodiment 1

FIG. 1 is a schematic perspective view illustrating the constitution of a first embodiment of the MW-PCVD apparatus according to the present invention.

In FIG. 1, a substrate web 101 is continuously moved in the direction expressed by an arrow while being supported curved and projected by an initial supporting transporting roller 102 and a terminal supporting transporting roller 103 to provide a columnar portion to be the circumferential wall of a film-forming chamber 116 having a film-forming space, the two side ends of said columnar portion being supported by a pair of supporting transporting rings 104 and 105 so that the shape of said columnar portion is maintained in a desired state. Numeral references 106a through 106e are temperature controlling mechanisms for heating or cooling the substrate web which are provided over the external face of said circumferential wall comprising the moving substrate web. The temperature controlling mechanisms 106a through 106e are designed such that each of them can be independently operated (this part is not shown).

Numeral reference 107 stands for a microwave applicator being connected to one side face of the film-forming chamber 116. Likewise, numeral reference 108 stands for the other microwave applicator being connected to the remaining side face of the film-forming chamber 116. Each of the microwave applicators 107 and 108 is provided with a microwave transmissive member 109 or 110 at its end portion such that it hermetically seals the side face of the film-forming chamber 116. In FIG. 1, for explanatory purposes, the microwave transmissive member 109 is shown in a state separated from the side face.

Each of the microwave applicators 107 and 108 is connected through a rectangular waveguide 111 or 112 to a microwave power source (not shown).

The two microwave applicators 107 and 108 are oppositely arranged through the film-forming space such that each face containing the long edge of one of said rectangular waveguides 111 and 112 is not perpendicular to each face containing the central axis of one of the rollers 102 and 103 in the film-forming space and also the face containing the long edge of one waveguide is not in parallel to the face containing the long edge of the other wave guide.

Numeral reference 113 stands for a gas feed pipe being extended into the film-forming space.

The gas feed pipe 113 is connected through a flow rate controlling means (not shown) to one or more reservoirs (not shown) containing film-forming raw material gases.

Numeral reference 114 stands for an exhaust pipe being connected through an exhaust valve (not shown) to an exhaust pump (not shown).

Numeral references 115a and 115b are isolated passages for use in the case where another film-forming chamber (vacuum vessel) is connected to the film-forming chamber of the present invention.

Each of the initial and terminal supporting transporting rollers 102 and 103 contains a transportation speed detecting mechanism and a tensible strength detecting mechanism (these mechanisms are not shown) for detecting and controlling the transportation speed and the tensible strength in order to always maintain the shape of the foregoing columnar portion in a desired state.

Explanation will be made about the constitution of the foregoing microwave applicator means (107 or 108) with reference to FIG. 3.

Figure 3:
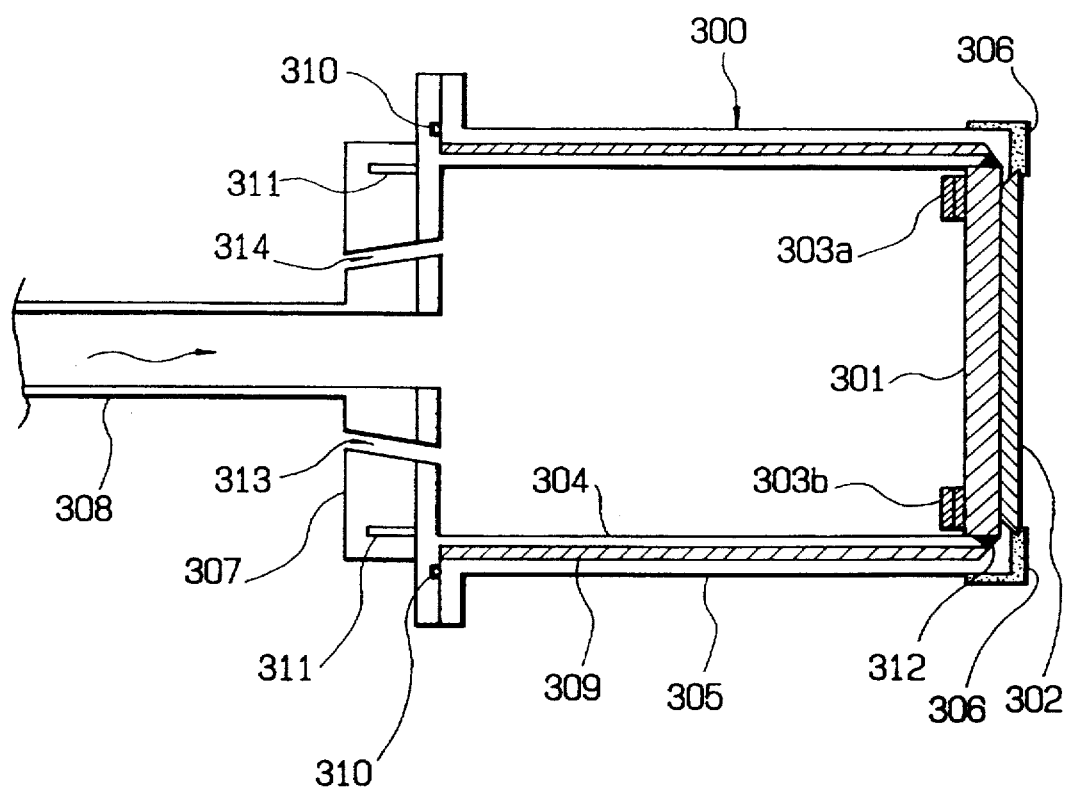
FIG. 3 is a schematic cross-section view illustrating the constitution of a representative embodiment of the microwave applicator to be used in the present invention.

FIG. 3 is a schematic cross-section view for illustrating the constitution of a typical embodiment of the microwave applicator means to be employed in the MW-PCVD apparatus of the present invention.

Numeral reference 300 stands for a microwave applicator to which a rectangular waveguide 308 extending from a microwave power source (not shown) is connected. Numeral reference 305 stands for an outer cylindrical circumferential wall of the microwave applicator 300. Numeral reference 304 stands for an inner cylindrical circumferential wall of the microwave applicator 300. Numeral reference 309 stands for a cooling space containing a cooling medium such as water, freon, oil or cooled air which is recycled.

Numeral reference 302 stands for a microwave transmissive member which is fixed to one end portion of the outer cylindrical circumferential wall 305 by means of a fixing ring 306.

Numeral reference 301 stands for another microwave transmissive member which is disposed on the foregoing microwave transmissive member 302 while being fixed to one end portion of the inner cylindrical circumferential wall 304 by means of a metal seal member 312. Said one end portion of the cooling space 309 is sealed by said metal seal member 312. Numeral reference 310 stands for an O-ring to seal the other end of said cooling space 309. The microwave transmissive member 301 is provided with a pair of microwave matching circular plates 303a and 303b on the surface thereof. A choke-flunge 307 having a channel 311 is connected to the other end portion of the outer cylindrical circumferential wall 305.

Numeral references 313 and 314 are holes respectively for recycling cooled air into the inside of the microwave applicator 300 to cool said inside. The inside diameter and the inside length in the microwave propagating direction of the microwave applicator 300 are appropriately determined such that it can function as the waveguide. That is, said inside diameter is desired to be designed such that the cut-off frequency becomes smaller than the frequency of microwave but as large as possible as long as a plurality of modes can not be established therein. Said inside length is desired to be designed such that a standing wave can not be provided therein. As for the inside shape of the microwave applicator 300, it is not limited only to a cylindrical shape but it may be of a prismatic shape.

Apparatus Embodiment 2

There can be mentioned the case where the apparatus shown in Apparatus Embodiment 1 is placed in an isolation vessel.

The isolation vessel can take any shape as long as it can enclose the MW-PCVD apparatus shown in FIG. 1. Among others, cubic shape, rectangular paralleopiped-like shape or cylindrical shape is preferable.

In any case, there is provided an auxiliary gas feed pipe in the space remaining between the film-forming chamber and the isolation vessel, wherein a pressure controlling gas such as rare gas or $H_2$ is supplied through said gas feed pipe into the above space in order to prevent occurrence of discharge therein. It is possible to evacuate the above space through the exhaust pipe for the film-forming chamber or by means of an independent exhaust means.

Apparatus Embodiment 3

There can be mentioned a partial modification of the apparatus shown in Apparatus Embodiment 1, wherein the cylindrical microwave applicator means is replaced by a prismatic - shaped microwave applicator means.

The cross-section size of the prismatic-shaped microwave applicator means maybe be equivalent to or different from the size of the waveguide.

Said size may enlarged as desired as long as a plurality of modes can not be established therein.

Apparatus Embodiment 4

There can be mentioned a partial modification of the apparatus shown in Apparatus Embodiment 2, wherein the cylindrical microwave applicator means is replaced by the same prismatic-shaped microwave applicator means as described in Apparatus Embodiment 3.

Apparatus Embodiments 5 and 6

There can be mentioned a partial modification of the apparatus shown in Apparatus Embodiment 1 and a partial modification of the apparatus shown in Apparatus Embodiment 2, wherein the cylindrical microwave applicator means is replaced by a oval shaped microwave applicator means in each case.

Apparatus Embodiment 7

Figure 4:
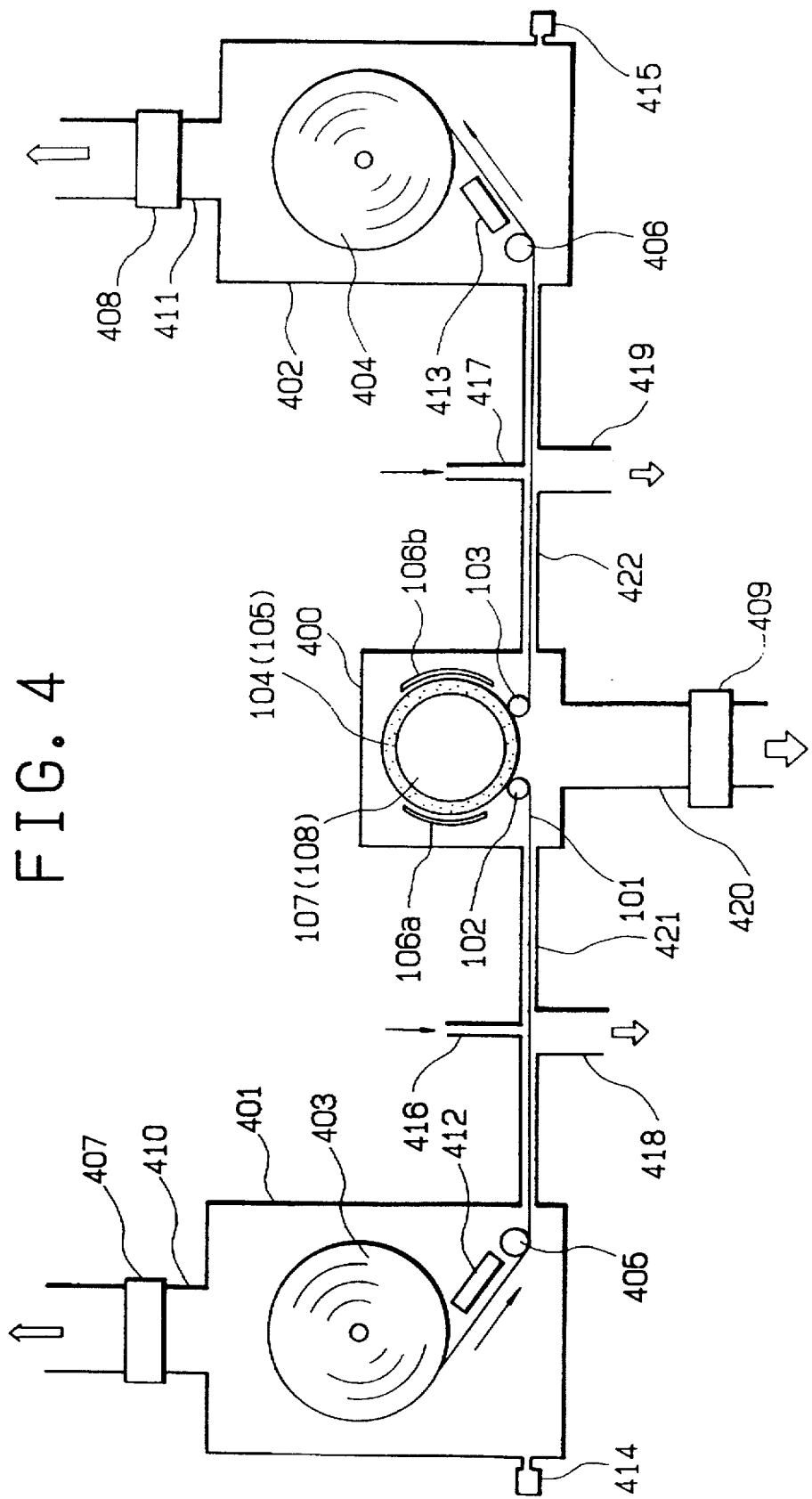
FIG. 4, FIG. 5, FIG. 6, FIG. 7, FIG. 8 and FIG. 9 are schematic explanatory views respectively for illustrating the entire constitution of the MW-PCVD apparatus according to the present invention.

There can be mentioned a MW-PCVD apparatus comprising the apparatus shown in Apparatus Embodiment 2 which includes a substrate feed chamber 401 for paying out a substrate web 101 and an unload chamber 402 for taking up said substrate web as shown in FIG. 4, said substrate feed chamber being connected through a gas gate 421 to an isolation chamber 400 containing the film-forming chamber shown in FIG. 1 and said unload chamber 402 being connected through a gas gate 422 to said isolation chamber 400.

As shown in FIG. 4, the substrate feed chamber 401 contains a pay-out reel 403 having a substrate web 101 wound thereon and a feed roller 405. The unload chamber 402 contains a take-up reel 404 and a feed roller 406. Each of the chambers 401 and 402 contains a temperature controlling mechanism 412 or 413 for heating or cooling the substrate web 101 and is provided with an exhaust pipe 410 or 411 provided with a slot valve 407 or 408 for regulating the exhausting degree.

Each of the chambers 401 and 402 is also provided with a pressure gage 414 or 415.

In the substrate feed chamber 401, there can be provided an appropriate protective sheet feed means for feeding a protective sheet for the rear face of the substrate web to be delivered. Likewise, in the unload chamber 402, there can be provided an appropriate protective sheet feed means for feeding a protective sheet for the surface of a film formed on the substrate web 101. As such protective sheet, there can be mentioned a thin film sheet made of a heat resistant resin such as polyimide resin and polyfluoroethylene fiber or a thin glass wool sheet. Numeral references 416 and 417 are gate gas supply pipes. Numeral references 418 and 419 are exhaust pipes respectively for exhausting a gate gas and sometimes, a film-forming raw material gas.

Apparatus Embodiment 8

Figure 6:
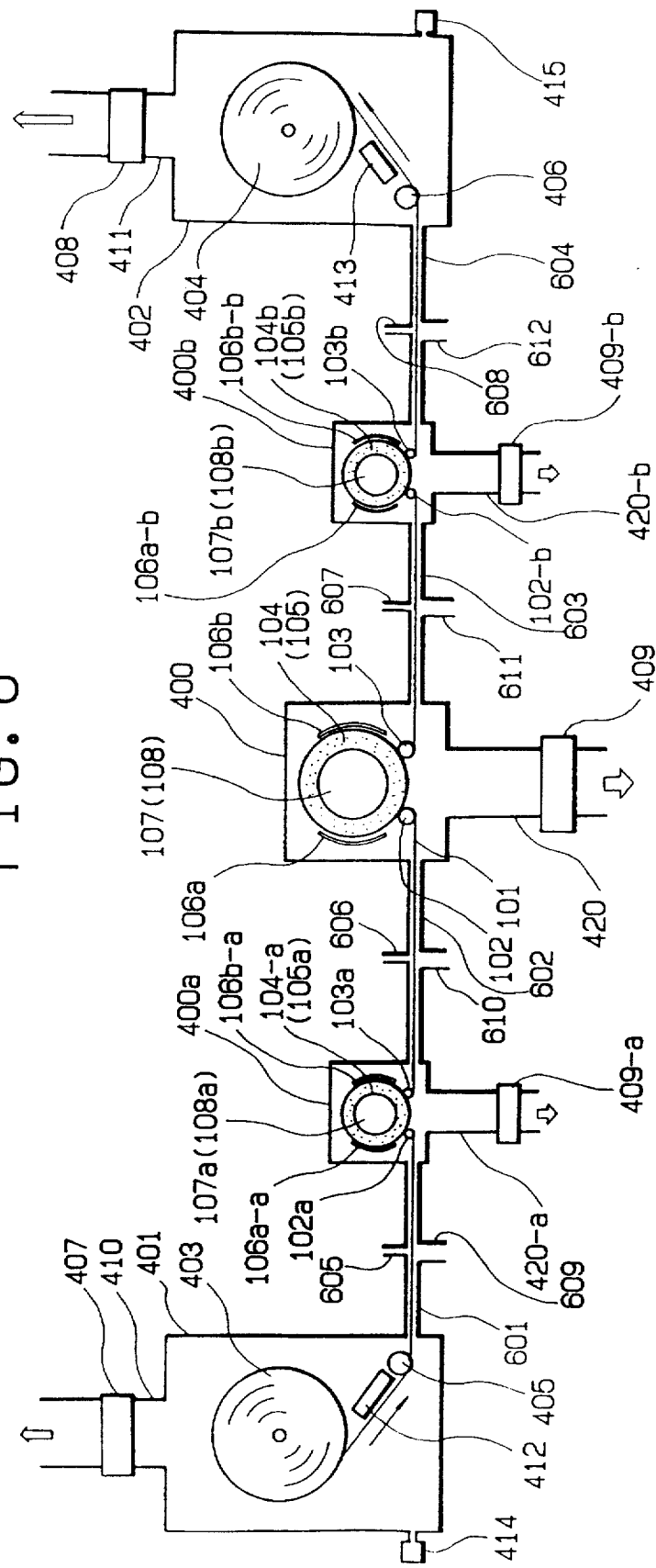

There can be mentioned a MW-PCVD apparatus shown in FIG. 6 which comprises a modification of the apparatus shown in Apparatus Embodiment 4 wherein the same MW-PCVD apparatus 400a as shown in FIG. 1 is additionally arranged between the substrate feed chamber 401 and the MW-PCVD apparatus 400 and the same MW-PCVD apparatus 400b as shown in FIG. 1 is also arranged between said apparatus 400 and the unload chamber 402. This apparatus is suitable for continuously preparing a multi-layered semiconductor device.

In FIG. 6, numeral references added with the mark "a" or the mark "b" are used for purposes of distinguishing one from the other among the three MW-PCVD apparatus 400, 400a and 400b being separately arranged. Each of numeral references 601 through 604 stands for a gas gate. Each of numeral references 605 through 608 stands for a gate gas supply pipe. Each of numeral references 609 through 612 stands for a gate gas exhaust pipe.

Apparatus Embodiments 9 and 10

There can be mentioned a partial modification of the apparatus shown in Apparatus Embodiment 7 and a partial modification of the apparatus shown in Apparatus Embodiment 8, wherein the cylindrical microwave applicator means is replaced by the same prismatic-shaped microwave applicator means as used in the apparatus shown in Apparatus Embodiment 3 in each of the two cases.

Apparatus Embodiments 11 and 12

There can be mentioned a partial modification of the apparatus shown in Apparatus Embodiment 7 and a partial modification of the apparatus shown in Apparatus Embodiment 8, wherein the cylindrical microwave applicator means is replaced by an oval-shaped microwave applicator means in each of the two cases.

Apparatus Embodiment 13

Figure 8:
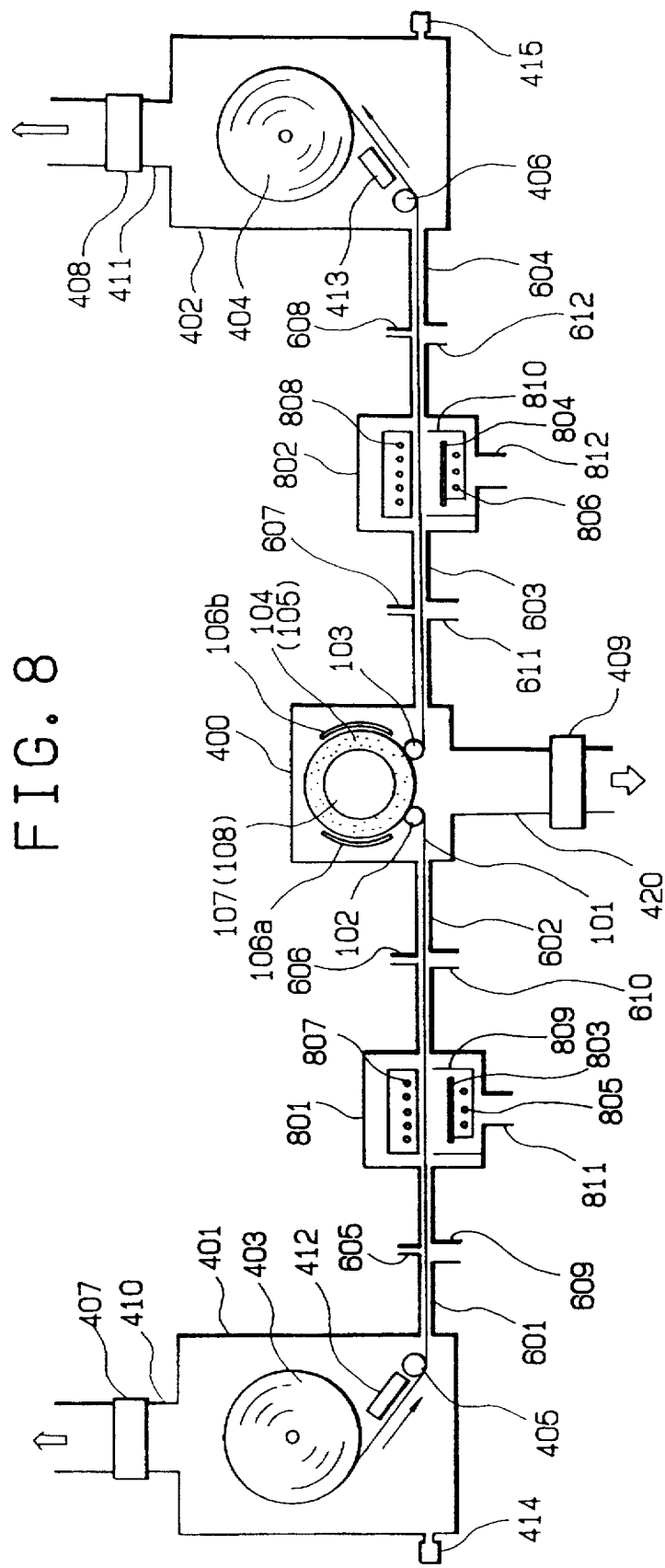

There can be mentioned a MW-PCVD apparatus shown in FIG. 8 which comprises a modification of the apparatus shown in Apparatus Embodiment 4 wherein a known RF plasma CVD apparatus is additionally arranged between the substrate feed chamber 401 and the MW-PCVD apparatus 400 and also between said apparatus 400 and the unload chamber 402. This apparatus is suitable for continuously preparing a multi-layered semiconductor device.

In FIG. 8, each of numeral references 801 and 802 stands for a vacuum vessel. Each of numeral references 803 and 804 stands for a RF power applying cathode electrode. Each of numeral references 805 and 806 stands for a gas feed pipe capable of serving also as a heater. Each of numeral references 807 and 808 stands for a halogen lamp for heating the substrate web 101. Each of numeral references 809 and 810 stands for an anode electrode. Each of numeral references 811 and 812 stands for an exhaust pipe.

Apparatus Embodiments 14 and 15

There can be mentioned a partial modification of the MW-PCVD apparatus shown in Apparatus Embodiment 1 and a partial modification of the MW-PCVD apparatus shown in Apparatus Embodiment 2, wherein the cylindrical microwave applicator means is connected only to one side face of the film-forming chamber and the remaining side face thereof is sealed with the foregoing perforated metal member capable of preventing leakage of microwave energy.

Apparatus Embodiment 16

FIG. 2 is a schematic perspective view illustrating the constitution of a typical embodiment of the MW-PCVD apparatus having a bias voltage applying means according to the present invention. A substrate web 201 is continuously moved in the direction expressed by an arrow while being supported curved and projected by an initial supporting transporting roller 202 and a terminal supportingly transporting roller 203 to provide a columnar portion to be the cirumferential wall of a film-forming chamber 216 having a film-forming space, the two side ends of said columnar portion being supported by a pair of supporting transporting rings 204 and 205 so that the shape of said columnar portion is maintained in a desired state. Numeral references 206a through 206e are temperature controlling mechanisms for heating or cooling the substrate web 201 which are provided over the external face of said circumferential wall of the moving substrate web 201.

The temperature controlling mechanisms 206a through 206e are designed such that each of them can be independently operated (this part is not shown). Numeral reference 207 stands for a microwave applicator being connected to one side face of the film-forming chamber 216. Likewise, numeral reference 208 stands for another microwave applicator being connected to the remaining side face of the film-forming chamber 216. Each of the microwave applicators 207 and 208 is provided with a microwave transmissive member 209 or 210 at its end portion such that it hermetically seals the side face of the film-forming chamber 216. In FIG. 2, for explanatory purposes, the microwave transmissive member 209 is shown in a state apart from the side face. Each of the microwave applicators 207 and 208 is connected through a rectangular waveguide 211 or 212 to a microwave power source (not shown). The two microwave applicators 207 and 208 are oppositely arranged through the film-forming space such that each face containing the long edge of one of said two rectangular waveguides 211 and 212 is not perpendicular to each face containing the central axis of one of said rollers 202 and 203 in the film-forming space and also the face containing the long edge of one rectangular wave guide is not in parallel to the face containing the long edge of the other rectangular waveguide in the film-forming space.

Numeral reference 213 stands for a bias voltage applying pipe capable of serving as a gas feed pipe. The bias voltage applying pipe is electrically connected through a lead wire 220 to a bias power source 219.

Numeral reference 218 stands for a film-forming raw material gas supply pipe extending from a gas reservoir (not shown).

The gas supply pipe 218 connected through an insulating fitting 217 to the bias voltage applying pipe 213 capable of serving as the gas feed pipe. The moving substrate web 201 constituting the circumferential wall of the film-forming chamber 216 is electrically grounded. In a preferred embodiment, the entire inner face of said circumferential wall is uniformly grounded, for example, by means of an electric brush (not shown) being electrically contacted with the rollers 202 and 203, the rings 204 and 205, and said circumferential wall. Numeral reference 214 stands for an exhaust pipe being connected through an exhaust valve (not shown) to an exhaust pump (not shown).

Numeral references 215a and 215b are isolated passages for use in the case where another film-forming chamber (vacuum vessel) is connected to the film-forming chamber of the present invention.

Each of the initial and terminal supporting transporting rollers 202 and 203 contains a transportation speed detecting mechanism and a tensible strength detecting mechanism (these mechanisms are not shown) for detecting and controlling the transportation speed and the tensible strength in order to always maintain the shape of the foregoing columnar portion in a desired state.

The constitution of each of the foregoing microwave applicator means (207, 208) is the same as that described in Apparatus Embodiment 1.

In the case above described, there is used the constitution shown in FIG. 15(a) as the bias voltage applying means. However, this can be replaced by the constitution shown in any of FIGS. 15(b) through 15(d).

Apparatus Embodiment 17

There can be mentioned the case where the apparatus shown in Apparatus Embodiment 16 is placed in an isolation vessel.

The isolation vessel can take any shape as long as it can enclose the MW-PCVD apparatus shown in FIG. 2. Among others, cubic shape, rectangular parallelopiped-like shape or cylindrical shape is preferable.

In any case, there is provided an auxiliary gas feed pipe in the space remaining between the film-forming chamber 216 and the isolation vessel, wherein a pressure controlling gas such as rare gas or $H_2$ is supplied through said gas feed pipe into the above space in order to prevent occurrence of discharge therein. It is possible to evacuate the above space through the exhaust pipe for the film-forming chamber 216 or by means of an independent exhaust means.

The constitution of each of the foregoing microwave applicator means (207, 208) is the same as that described in Apparatus Embodiment 1.

In the case described above, the constitution shown in FIG. 15(a) is used as the bias voltage applying means. However, this can be replaced by the constitution shown in any of FIGS. 15(b) through 15(d).

Apparatus Embodiment 18

There can be mentioned a partial modification of the apparatus shown in Apparatus Embodiment 16, wherein the cylindrical microwave applicator means is replaced by a prismatic-shaped microwave applicator means.

The cross-section size of the prismatic-shaped microwave applicator means may be equivalent to or different from the size of the waveguide.

Said size may enlarged as desired as long as a plurality of modes can not be established therein.

Apparatus Embodiment 19

There can be mentioned a partial modification of the apparatus shown in Apparatus Embodiment 17, wherein the cylindrical microwave applicator means is replaced by the same prismatic-shaped microwave applicator means as described in Apparatus Embodiment 18.

Apparatus Embodiments 20 and 21

There can be mentioned a partial modification of the apparatus shown in Apparatus Embodiment 16 and a partial modification of the apparatus shown in Apparatus Embodiment 17, wherein the cylindrical microwave applicator means is replaced by an oval shaped microwave applicator means in each case.

Apparatus Embodiment 22

Figure 5:
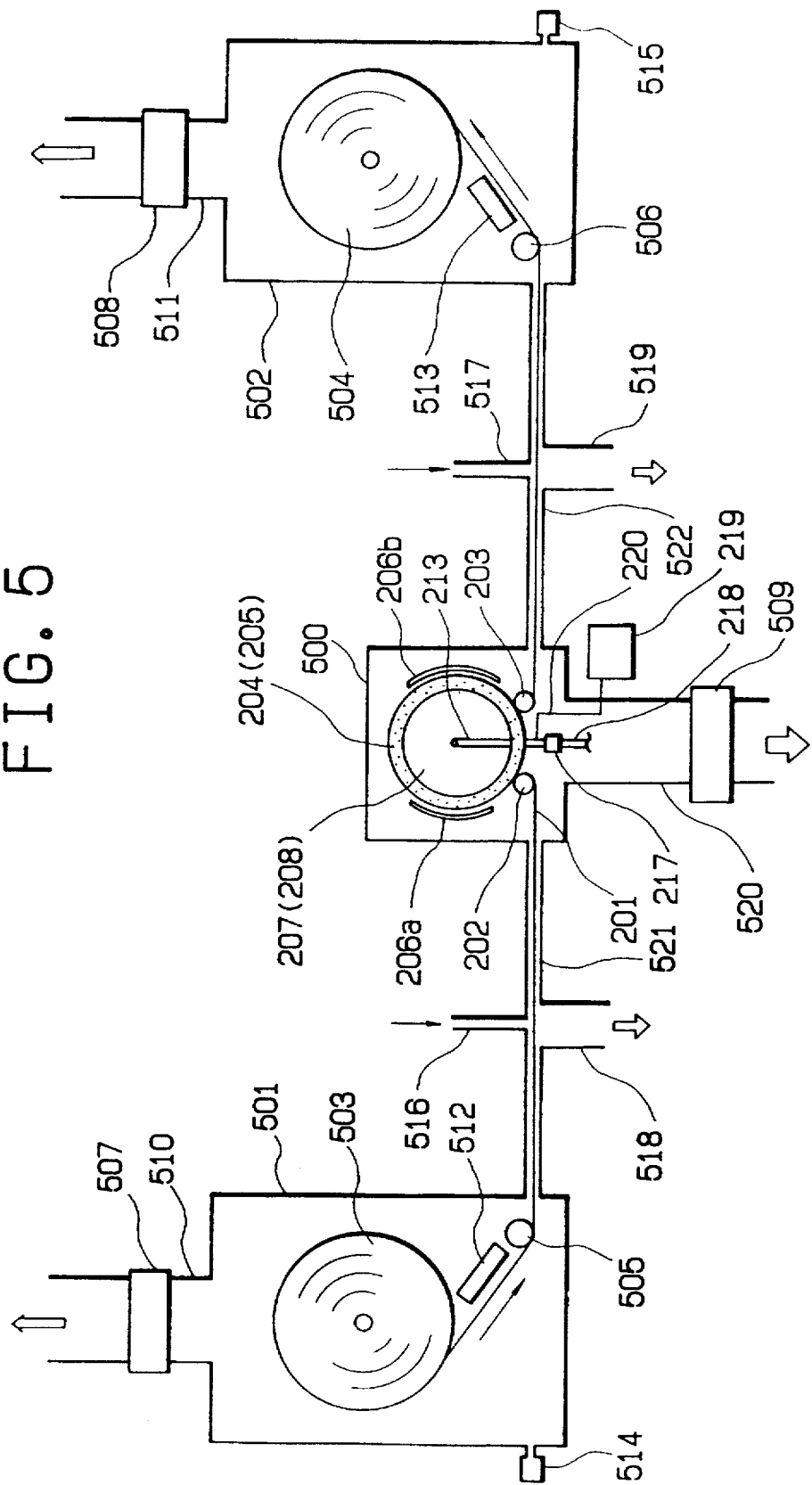

There can be mentioned a MW-PCVD apparatus comprising the apparatus shown in Apparatus Embodiment 17 which includes a substrate feed chamber 501 for paying out a substrate web 201 and an unload chamber 502 for taking up said substrate web as shown in FIG. 5, said substrate feed chamber being connected through a gas gate 521 to an isolation chamber 500 containing the film-forming chamber shown in FIG. 2 and said unload chamber 502 being connected through a gas gate 522 to said isolation chamber 500.

The constitution of each of the foregoing microwave applicator means (207, 208) is the same as that described in Apparatus Embodiment 1.

In the case described above, the constitution shown in FIG. 15(a) is used as the bias voltage applying-means. However, this can be replaced by the constitution shown in any of FIGS. 15(b) through 15(d).

As shown in FIG. 5, the substrate feed chamber 501 contains a pay-out reel 503 having a substrate web 201 wound thereon and a feed roller 505. The unload chamber 502 contains a take-up reel 504 and a feed roller 506. Each of the chamber 501 and 502 contains a temperature controlling mechanism 512 or 513 for heating or cooling the substrate web 101 and is provided with an exhaust pipe 510 or 511 provided with a slot valve 507 or 508 for regulating the exhausting degree.

Each of the chambers 501 and 502 is also provided with a pressure gauge 514 or 515.

In the substrate feed chamber 501, there can be provided an appropriate protective sheet feed means for feeding a protective sheet for the rear face of the substrate web to be delivered. Likewise, in the unload chamber 502, there can be provided an appropriate protective sheet feed means for feeding a protective sheet for the surface of a film formed on the substrate web 201. As such protective sheet, there can be mentioned a thin film sheet made of a heat resistant resin such as polyimide resin and polyfluoroethylene fiber or a thin glass wool sheet. Numeral references 516 and 517 are gate gas supply pipes. Numeral references 518 and 519 are exhaust pipes respectively for exhausting a gate gas and sometimes, a film-forming raw material gas.

Apparatus Embodiment 23

Figure 7:
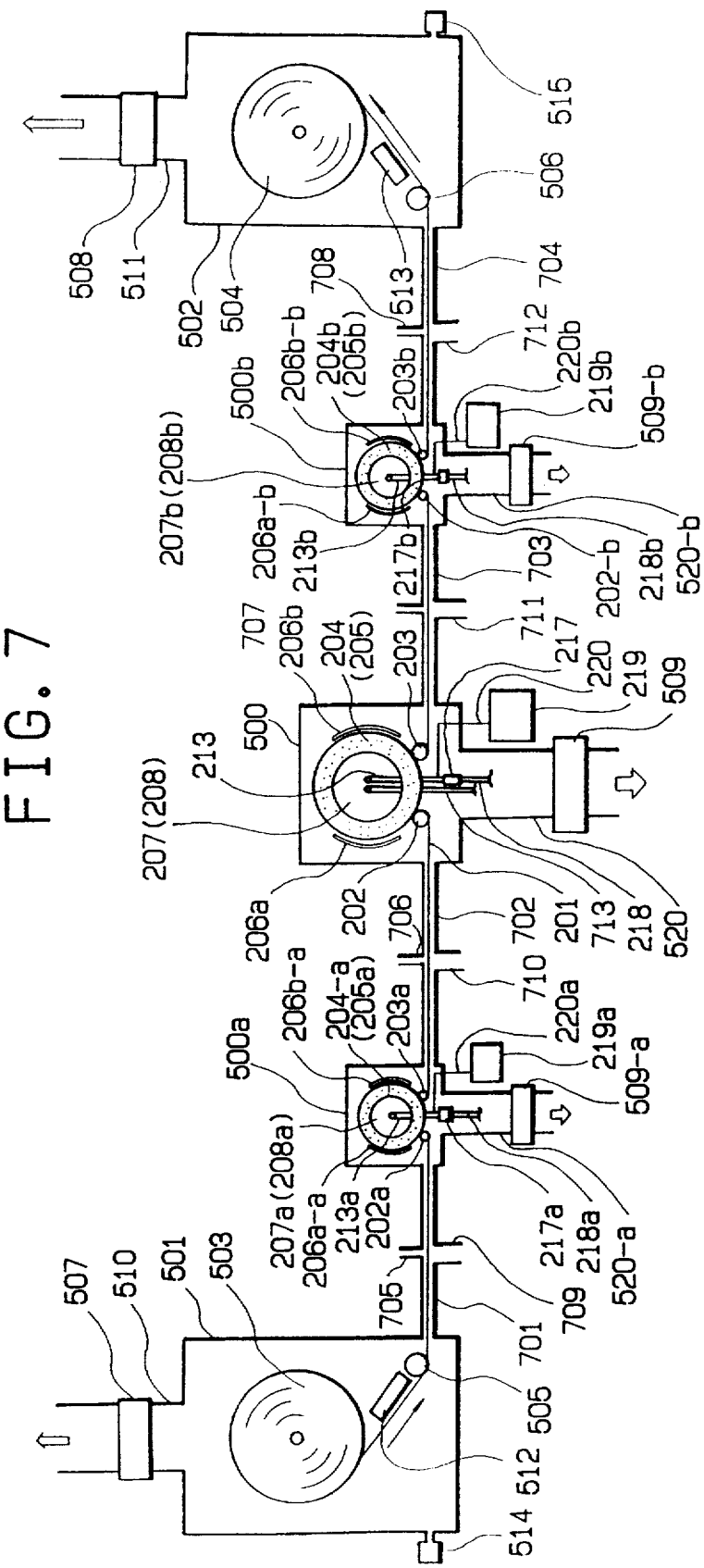

There can be mentioned a MW-PCVD apparatus shown in FIG. 7 which comprises a modification of the apparatus shown in Apparatus Embodiment 22.

The MW-PCVD apparatus comprises a first MW-PCVD apparatus 500a having the same constitution as shown in FIG. 2, a second MW-PCVD apparatus 500 comprising a partial modification of the apparatus shown in FIG. 2 wherein the bias voltage applying means of the constitution shown in FIG. 15(a) is replaced by a bias voltage applying means of the constitution shown in FIG. 15(b) and a third MW-PCVD apparatus 500b having the same constitution as shown in FIG. 2.

The bias voltage applying means of any of the three MW-PCVD apparatus can be replaced by other constitutions selected from those shown in FIGS. 15(a) through 15(d).

The MW-PCVD apparatus in this embodiment is suitable for continuously preparing a multi-layered semiconductor device.

In FIG. 7, numeral references added with the mark "a" or the mark "b" are used for purposes of distinguishing one from the other among the three MW-PCVD apparatus 400, 400a and 400b being separately arranged. Each of numeral references 701 through 704 stands for a gas gate. Each of numeral references 705 through 708 stands for a gate gas supply pipe. Each of numeral references 709 through 712 stands for a gate gas exhaust pipe. Numeral reference 713 stands for a gas feed pipe.

Appparatus Embodiments 24 and 25

There can be mentioned a partial modification of the apparatus shown in Apparatus Embodiment 22 and a partial modification of the apparatus shown in Apparatus Embodiment 23, wherein the cylindrical microwave applicator means is replaced by the same prismatic-shaped microwave applicator means as used in the apparatus shown in Apparatus Embodiment 18 in each of the two cases.

Apparatus Embodiments 26 and 27

There can be mentioned a partial modification of the apparatus shown in Apparatus Embodiment 20 and a partial modification of the apparatus shown in Apparatus Embodiment 21, wherein the cylindrical microwave applicator means is replaced by an oval-shaped microwave applicator means in each of the two cases.

Apparatus Embodiment 28

Figure 9:
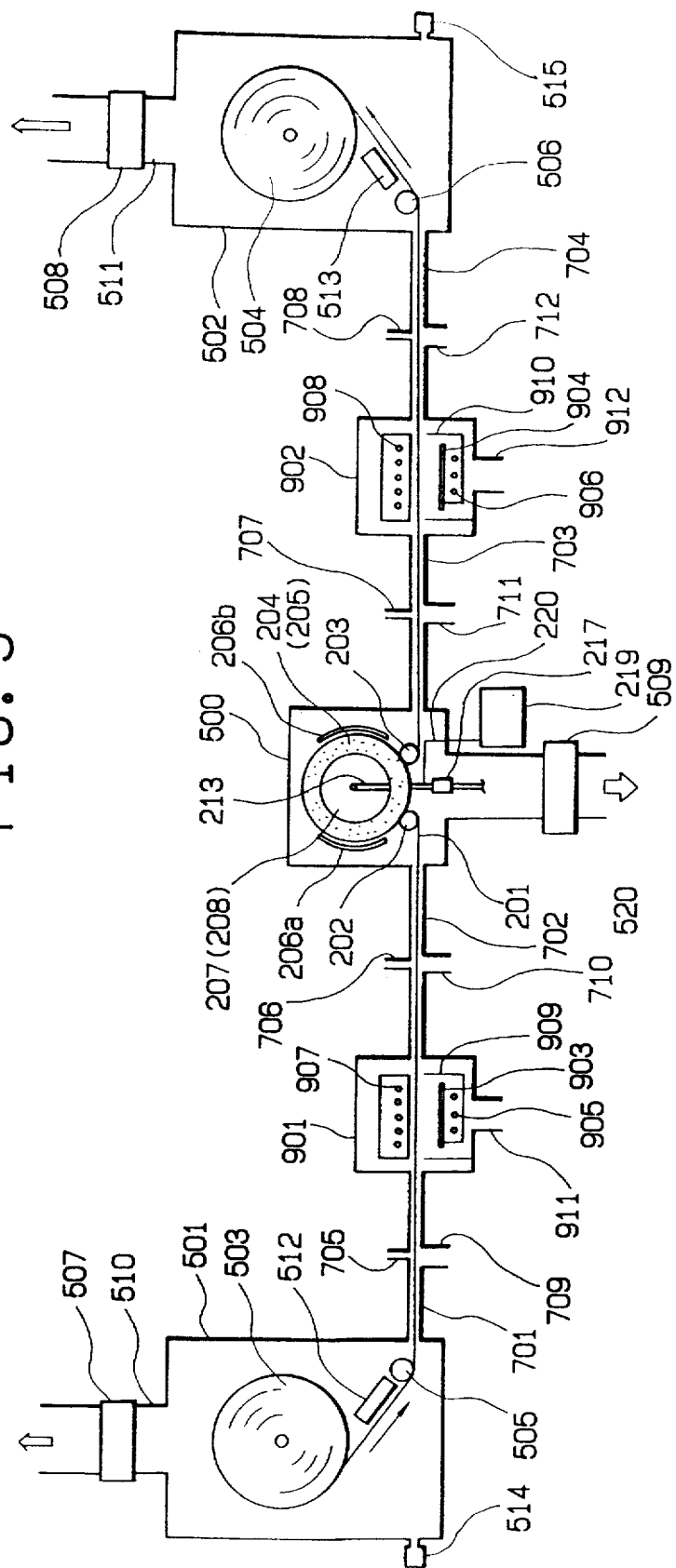

There can be mentioned a MW-PCVD apparatus shown in FIG. 9 which comprises a modification of the apparatus shown in Apparatus Embodiment 22 wherein a known RF plasma CVD apparatus is additionally arranged between the substrate feed chamber 501 and the MW-PCVD apparatus 500 and also between said apparatus 500 and the unload chamber 502. This apparatus is suitable for continuously preparing a multi-layered semiconductor device.

In FIG. 8, each of numeral references 901 and 902 stands for a vacuum vessel. Each of numeral references 903 and 904 stands for a RF power applying cathode electrode. Each of numeral references 905 and 906 stands for a gas feed pipe capable of serving also as a heater. Each of numeral references 907 and 908 stands for a halogen lamp for heating the substrate web 201. Each of numeral references 909 and 910 stands for an anode electrode. Each of numeral references 911 and 912 stands for an exhaust pipe.

In the case above described, there is used the constitution shown in FIG. 15(a) as the bias voltage applying means. However, this can be replaced by the constitution shown in any of FIGS. 15(b) through 15(d).

Apparatus Embodiments 29 and 30

There can be mentioned a partial modification of the MW-PCVD apparatus shown in Apparatus Embodiment 16 and a partial modification of the MW-PCVD apparatus shown in Apparatus Embodiment 17, wherein the cylindrical microwave applicator means is connected only to one side face of the film-forming chamber and the remaining side face thereof is sealed with the foregoing perforated metal member capable of preventing leakage of microwave energy.

Other Apparatus Embodiments

Other than those embodiments mentioned above, there can be mentioned further apparatus embodiments as will be hereunder mentioned.

(1) Modifications of the MW-PCVD apparatus described in Apparatus Embodiment 8 wherein each of the isolated vessels 400, 400a and 400b is provided with one or two microwave applicator means of various shapes as previously described.

(2) Modifications of the MW-PCVD apparatus described in Apparatus Embodiment 8 wherein the three chambered unit is repeated two or three times.

(3) Modifications of the MW-PCVD apparatus described in Apparatus Embodiment 8 wherein the three chambered unit added with a known RF plasma CVD apparatus is repeated two or three times.

(4) Modifications of the MW-PCVD apparatus described in Apparatus Embodiment 1 or 2, wherein two or more microwave applicator means are provided to each side face of the film-forming chamber such that a relatively large microwave plasma region can be provided to result in causing the formation of a relatively thick semiconductor film without changing the transportation speed of the substrate web.

(5) Modifications of the MW-PCVD apparatus described in Apparatus Embodiment 23 wherein each of the isolated vessels 500, 500a and 500b is provided with one or two microwave applicator means of various shapes as previously described.

(6) Modifications of the MW-PCVD apparatus described in Apparatus Embodiment 23 wherein the three chambered unit is repeated two or three times.

(7) Modifications of the MW-PCVD apparatus described in Apparatus Embodiment 23 wherein the three chambered unit added with a known RF plasma CVD apparatus is repeated two or three times.

(8) Modifications of the MW-PCVD apparatus described in Apparatus Embodiment 16 or 17, wherein two or more microwave applicator means are provided to each side face of the film-forming chamber such that a relatively large microwave plasma region can be provided to result in causing the formation of a relatively thick semiconductor film without changing the transportation speed of the substrate web.

According to the present invention, various kinds of semiconductor devices can be continuously and effectively prepared.

As a representative example of those semiconductor devices, there can be mentioned a solar cell of the configuration shown in FIG. 12(a), FIG. 12(b), FIG. 12(c), or FIG. 12(d).

Figure 12A:
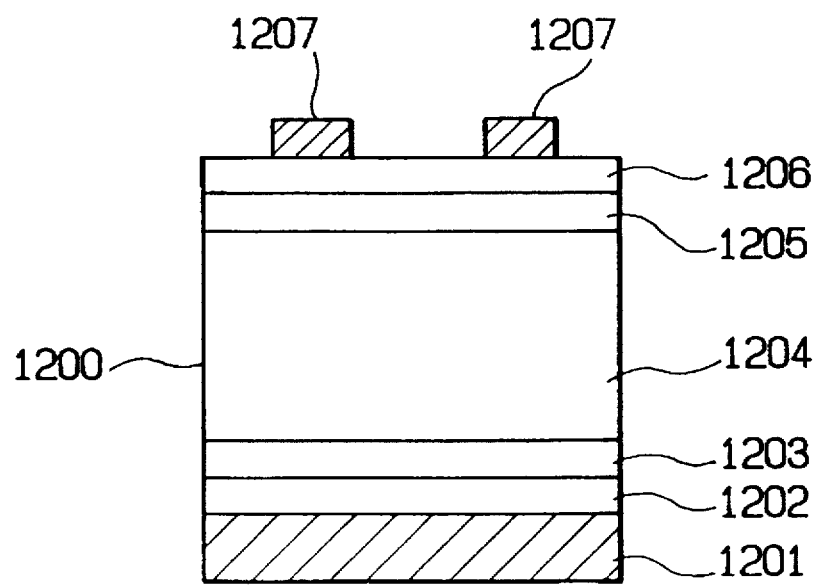
FIGS. 12(a), 12(b), 12(c), and 12(d) are schematic cross-section views respectively for illustrating the constitution of a pin junction photovoltaic device provided by the present invention.

The solar cell 1200 shown in FIG. 12(a) is of the type that light is impinged from the side of a transparent electrode 1206.

The solar cell 1200 shown in FIG. 12(a) comprises a substrate 1201, a lower electrode 1202, an n-type semiconductor layer 1203, an i-type semiconductor layer 1204, a p-type semiconductor layer 1205, a transparent electrode 1206 and a comb-shaped collecting electrode 1207.

Figure 12B:
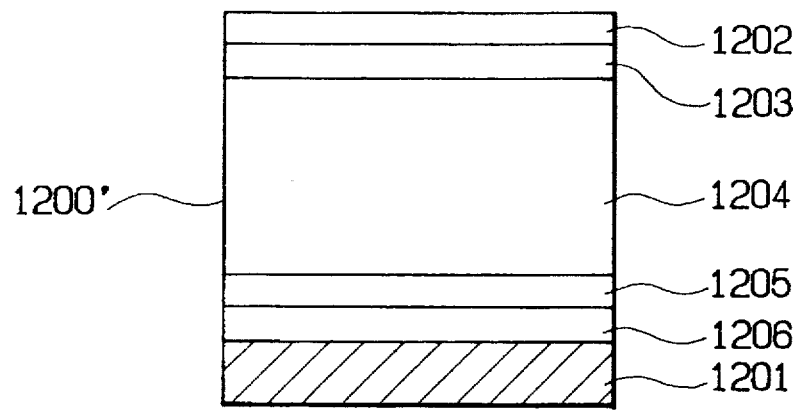

The solar cell 1200' shown in FIG. 12(b) is of the type that light is impinged from the side of a transparent substrate 1201.

The solar cell 1200' shown in FIG. 12(b) comprises a transparent electrode 1201, a transparent electrode 1206, a p-type semiconductor layer 1205, an i-type semiconductor layer 1204, an n-type semiconductor layer 1203, and a lower electrode 1202.

Figure 12C:
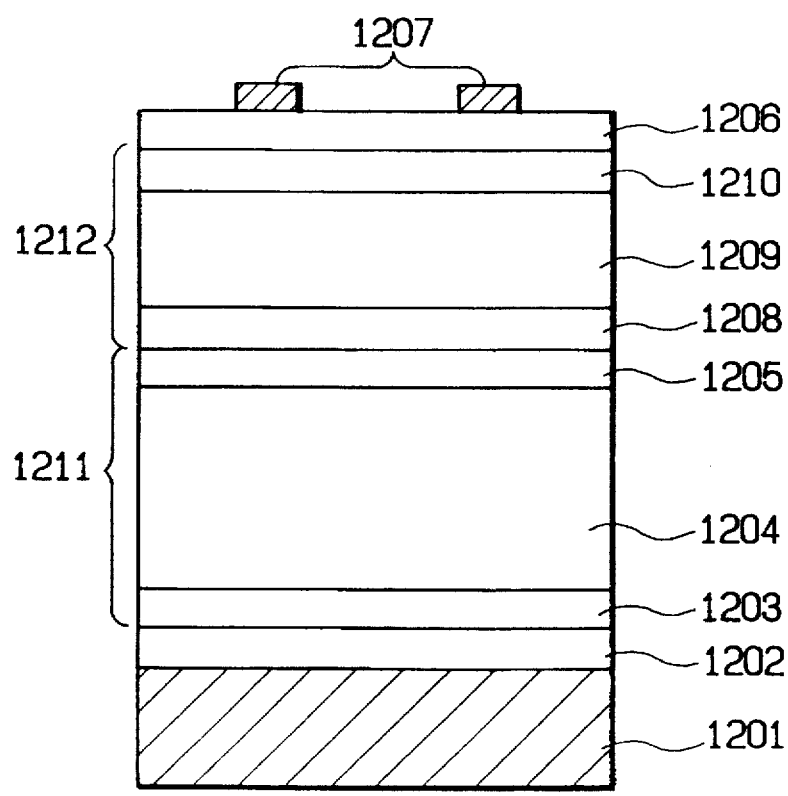

The solar cell shown in FIG. 12(c) is of a so-called tandem type which comprises a first pin junction photovoltaic cell 1211 and a second pin junction photovoltaic cell 1212 having an i-type layer different from the i-type layer of the former element 1211 with respect to the band gap and/or the layer thickness, the two cells 1211 and 1212 being stacked in this order from the side of a substrate 1201. For this solar cell, light is impinged from the side of a transparent electrode 1206.

The tandem type solar cell shown in FIG. 12(c) comprises a substrate 1201, a lower electrode 1202, the first photovoltaic cell 1211 comprising an n-type semiconductor layer 1203, an i-type semiconductor layer 1204 and a p-type semiconductor layer 1205, the second photovoltaic cell 1212 comprising an n-type semiconductor layer 1208, an i-type semiconductor layer 1209 and a p-type semiconductor layer 1210, a transparent electrode 1206, and a comb-shaped collecting electrode 1207.

Figure 12D:
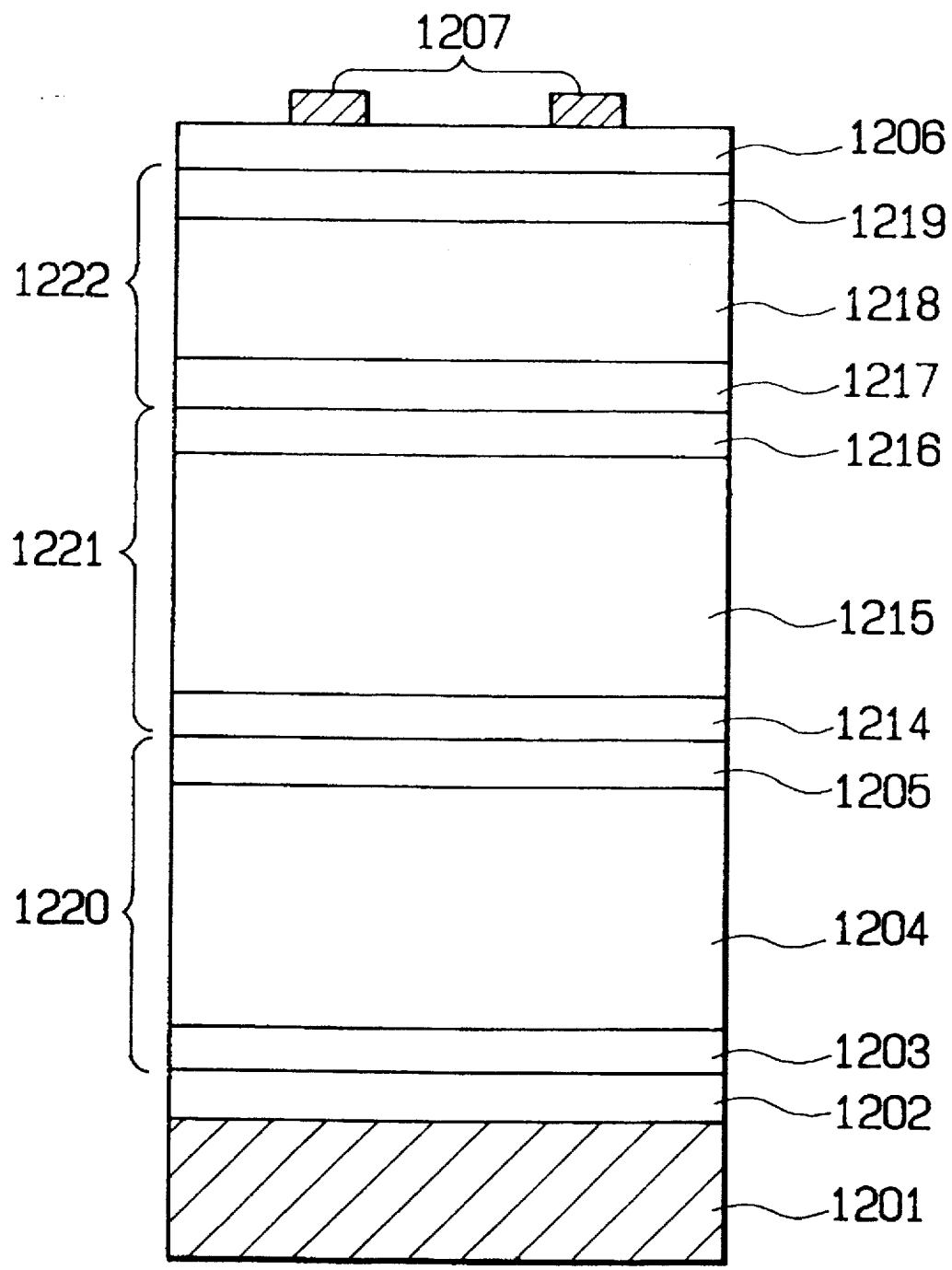

The solar cell shown in FIG. 12(d) is of a so-called triple cell type which comprises a first pin junction photovoltaic cell 1220, a second pin junction photovoltaic cell 1221 and a third pin junction photovoltaic cell 1222, the three cells 1220, 1221 and 1222 being stacked in this order from the side of a substrate 1201, wherein the i-type layer of each of said three cells is different one from the other with respect to the band gap or/and the layer thickness. For this solar cell, light is impinged from the side of a transparent electrode 1206 disposed on the top cell (the third photovoltaic cell 1222).

The solar cell shown in FIG. 12(d) comprises a substrate 1201, a lower electrode 1202, the first photovoltaic cell 1220 comprising an n-type semiconductor layer 1203, an i-type semiconductor layer 1204 and a p-type semiconductor layer 1205, the second photovoltaic cell 1221 comprising an n-type semiconductor layer 1214, an i-type semiconductor layer 1215 and a p-type semiconductor layer 1216, the third photovoltaic cell 1222 comprising an n-type semiconductor layer 1217, an i-type semiconductor layer 1218 and a p-type semiconductor layer 1219, a transparent electrode 1206, and a comb-shaped collecting electrode 1207.

For any of the above solar cells, the position of the n-type semiconductor layer may be replaced by the position of the p-type semiconductor layer.

Explanation will be made for the substrate, each constituent semiconductor layer and each constituent electrode in the pin junction photovoltaic element of the present invention.

Substrate

As to the substrate web (substrate 1201 in FIG. 12), it is desired to use such a web member that can be desirably curved to provide the foregoing columnar portion to be the cirumferential wall of the film-forming chamber. It may be electroconductive or electrically insulating, and it may be transparent or opaque. It is necessary to be transparent in the case of preparing a solar cell of the type that light is impinged from the side of the substrate. Particularly, the web member as previously described may be selectively used. According to the present invention, as a substrate web is used as the substrate for the preparation of such solar cell as described above, it enables to mass-produce any of the foregoing solar cells with an improved gas utilization efficiency and with a high yield.

Electrodes

For the solar cell to be provided according to the present invention, an appropriate electrode is optionally used depending upon the configuration of a solar cell to be prepared. As such electrode, there can be mentioned lower electrode, upper electrode (transparent electrode) and collecting electrode. Said upper electrode denotes the one to be placed at the side through which light is impinged, and said lower electrode denotes the one to be placed opposite to the upper electrode through the semiconductor layers to be arranged between the two electrodes.

These electrodes will be explained in the following:.

(i) Lower electrode

For the pin junction photovoltaic element according to the present invention, the side through which light is impinged is determined depending upon whether a transparent member is used or an opaque member as the substrate 1201.

In this connection, the position where the lower electrode 1202 is to be placed is properly determined upon the kind of the substrate 1201 to be used. For example, in the case where an opaque member such as metal member is used as the substrate 1201, light for the generation of a photoelectromotive force is impinged from the side of the transparent electrode 1206.

Now, in the case where the solar cell is of the configuration as shown in FIG. 12(a), FIG. 12(c) or FIG. 12(d), the lower electrode 1202 is disposed between the substrate 1201 and the n-type semiconductor layer 1203.

In the case of FIG. 12(b), a transparent member is used as the substrate 1201 and light is impinged from the side of the substrate 1201. In this connection, the lower electrode 1202 serving to output a photocurrent is placed on the surface of the top semiconductor layer above the substrate 1201. In the case where an electrically insulating member is used as the substrate 1201, the lower electrode 1202 serving to output a photocurrent is placed between the substrate 1201 and the n-type semiconductor layer 1203.

The electrode 1202 may be a metallic thin film of a metal selected from the group consisting of Ag, Au, Pt, Ni, Cr, Cu, Al, Ti, Zn, Mo and W. Said metallic thin film may be properly formed by way of the known vacuum deposition technique, electron-beam deposition technique or reactive sputtering technique. However, due consideration should be made for the metallic thin film to be thus formed not to be a resistant component for the photovoltaic element in this respect, the metallic thin film to constitute the electrode 1202 is desired to be such that it has a sheet resistance of preferably, 50Ω or less, more preferably 10Ω or less.

In the alternative, it is possible to place a diffusion preventive layer comprising an electroconductive material such as zinc oxide between the lower electrode 1202 and the n-type semiconductor layer 1203. (This is not shown.)

In the case where such diffusion preventive layer is placed in the way as mentioned above, the following advantages will be expected: (a) it prevents the metal elements constituting the electrode 1202 from diffusing into the n-type semiconductor layer 1203; (b) as it is provided with a certain resistance value, it prevents occurrence of shorts, which would otherwise occur between the lower electrode 1202 and the transparent electrode 1206 through the semiconductor layers being arranged between them due to pinholes and the like; and (c) it serves to generate multiple interferences with the thin film and confines the light as impinged within the photovoltaic element.

(ii) Upper electrode (transparent electrode)

The transparent electrode 1206 is prepared to have a light transmittance of more than 85% so that it serves to make the semiconductor layer to efficiently absorb sunlight or fluorescent light. In addition to this, it is prepared to have a sheet resistance of 100Ω or less with the view of preventing the internal resistance of the photovoltaic element from becoming too great which results in impaired performance.

In view of the above, the transparent electrode 1206 is desired to comprise a thin film of a metal oxide selected from the group consisting of $SnO_2$, $In_2O_3$, ZnO, CdO, $CdO_2SnO_2$ and ITO ($In_2O_3+SnO_2$) or a semitransparent thin film of a metal selected from the group consisting of Au, Al and Cu.

The transparent electrode 1206 is disposed on the p-type semiconductor layer 1205 in the case of FIG. 12(a), FIG. 12(c) or FIG. 12(d), and it is disposed on the substrate 1201 in the case of FIG. 12(b).

In either one of the cases, it is necessary to constitute the transparent electrode 1206 with a thin film member selected from the foregoing which exhibits good adhesion with the layer or the substrate.

The transparent electrode 1206 comprising such thin film may be formed by way of the known resistance heating deposition technique, electron-beam heating deposition technique, reactive sputtering technique or spraying technique.

(iii) Collecting electrode

The collecting electrode 1207 in the solar cell according to the present invention is disposed on the transparent electrode 1206 for the purpose of reducing the surface resistance of said transparent electrode.

The collecting electrode 1207 is desired to comprise a metallic thin film of Ag, Cr, Ni, Al, Ag, Au, Ti, Pt, Cu, Mo, W or alloy of these metals. It is possible for the collecting electrode 1207 to be constituted with a member comprising a plurality of such metallic thin films being stacked.

The shape and the area of the collecting electrode 1207 are properly designed so that a sufficient quantity of light be impinged into the semiconductor layer.

Specifically as for the shape, it be desired to be of such shape that extends uniformly all over the light receiving face of the photovoltaic element. As for the area, it is desired to correspond to 15% or less in a preferred embodiment or 10% or less in a more preferred embodiment respectively of said light receiving face.

And the member constituting the collecting electrode 1207 is desired to be such that it has a sheet resistance of preferably 50Ω or less, more preferably, 10Ω or less.

i-type semiconductor layer

The i-type semiconductor layer of any of the foregoing solar cells may be formed of an appropriate non-doped semiconductor film.

Usable as such non-doped semiconductor film are so-called Group IV semiconductor films or so-called Group IV semiconductor alloy films such as a-Si:H, a-Si:F, a-Si:H:F, a-SiC:H, a-SiC:F, a-SiC:H:F, a-SiGe:H, a-SiGe:F, a-SiGe:H:F, poly-Si:H, poly-Si:F, poly-Si:H:F films, etc.

Other than these semiconductor films, so-called compound semiconductor films of Group II–VI or Group III–V are also usable.

n-type semiconductor layer and p-type semiconductor layer

The n-type semiconductor layer of any of the foregoing solar cells may be formed of an n-type semiconductor film obtained by doping any of the films mentioned in the case of the i-type semiconductor layer with an n-type dopant.

Likewise, the p-type semiconductor layer of any of the foregoing solar cells may be formed of a p-type semiconductor film obtained by doping any of the films mentioned in the case of the i-type semiconductor layer with a p-type dopant.

The features and the effects of the present invention will be described in more detail referring to the following film formation examples.

It should, however, be noted that the present invention is not restricted only to these examples.

Film Formation Example 1

An amorphous silicon film was continuously deposited on a large area and lengthy substrate web, using the MW-PCVD apparatus (FIG. 4) described in the foregoing Apparatus Embodiment 7.

A pay-out reel 403 having a cleaned substrate web 101 made of SUS 430 BA (stainless steel) of 45 cm in width, 0.25 mm in thickness and 200 m in length wound thereon was set in the substrate feed chamber 401. The substrate web 101 was paid out from the pay-out reel, it was passed through the gas gate 421, the transportation mechanism of the isolated vessel 400 and the gas gate 422, and it was fixed to the take-up reel 404 of the unload chamber 402. Wherein, the substrate web was adjusted not to have any loose parts.

The size of the columnar portion to be the circumferential wall of the film-forming chamber and the foregoing spacing L were made as shown in Table 9. As each of the pair of microwave applicator means, one shown in Table 9 was used. The substrate feed chamber 401, the isolated vessel 400, and the unload chamber 402 were provisionally evacuated respectively by means of a rotary vacuum pump (not shown). These three vessels were then evacuated respectively by means of a mechanical booster pump (not shown) to a vacuum of about $10^{-3}$ Torr.

The substrate web. 101 was heated to and maintained at a temperature of about 250° C. by the temperature controlling mechanisms 106a and 106b in the isolated vessel 400. The inner pressure of the isolated vessel was regulated to a vacuum of less than $5 \times 10^{-6}$ Torr by means of an oil diffusion pump (not shown). Thereafter, $SiH_4$ gas, $SiF_4$ gas and $H_2$ gas were fed through a gas feed pipe (not shown) into the film-forming space at respective flow rates of 450 sccm, 5 sccm and 100 sccm. The gas pressure of the film-forming space was controlled to and maintained at about 5 m Torr by regulating the opening of a slot valve 409 of an exhaust pipe 420. After the flow rates of the three gases and the gas pressure became stable respectively, a microwave power source (not shown) was switched on to radiate a microwave energy (2.45 GHz) through the pair of microwave applicator means 107 and 108 into the film-forming space with an effective power of 0.85 KW (×2), wherein discharge was caused to provide a plasma region in the film-forming space. In this case, no plasma region was leaked out of the isolated vessel 400. And no leakage of microwave energy occurred. Then the initial and terminal supporting transporting rollers 102 and 103 and the pair of supporting transporting rings 104 and 105 were started rotating respectively by a driving mechanism (not shown) to transport the substrate web at a speed of 0.6 m/min.

And, $H_2$ gas as the gate gas was fed into gas gates 421 and 422 through gate gas supply pipes 416 and 417 at a flow rate of 50 sccm. And the gas gates 421 and 422 were evacuated through exhaust pipes 418 and 419 by means of an oil diffusion pump (not shown) to bring their insides to and maintain at a vacuum of 1 m Torr.

Film formation was performed for 30 minutes. Since a lengthy substrate web was used, the next film formation was successively performed after finishing the film formation of this example. After the film formation of this example, the substrate web 101 taken up on the take-up reel while being cooled by the temperature controlling mechanism 413 in the unload chamber 402 was taken out from the unload chamber 402.

Then, the film deposited on the substrate web 101 in this example was examined with respect to the thickness distribution in the width direction and also in the longitudinal direction. As a result, it was found that the thickness distribution was within 5%. As a result of examining the deposition rate, it was found to be 125 Å/sec on the average. Further, as a result of examining an infrared absorption spectrum for a film specimen cut off from the resultant by a conventional reflection method, a distinguishable peak was found at 2000 $cm^{-1}$ and also at 630 $cm^{-1}$ which indicate a-Si:H:F film. Likewise, as a result of examining the crystallinity of said film specimen by a RHEED (trade name: JEM-100 SX, product by JEOL, Ltd. ), the film specimen showed a halo pattern, and it was found to be amorphous. Further, the amount of hydrogen atoms contained in the film specimen was examined by a hydrogen content analyzer EMGA-1100 (product by Horiba Seisakusho Kabushiki Kaisha ).

As a result, it was found to be 20±2 atomic %.

Film Formation Example 2

After the film formation of Film Formation Example 1 was completed, the introduction of the gases used therein was terminated. The isolated vessel 400 was evacuated in the same manner as in Film Formation Example 1 to bring the inside to a vacuum of less than $5 \times 10^{-6}$ Torr. The film-forming procedures of Film Formation Example 1 were repeated, except that $SiH_4$ gas, $GeH_4$ gas, $SiF_4$ gas and $H_2$ gas were fed into the film-forming space at respective flow rates of 100 sccm, 80 sccm, 3 sccm and 100 sccm; the gas pressure of the film-forming space was maintained at a vacuum of 10 m Torr; the power of a microwave energy was made to be 0.5 KW×2; and the substrate web was moved at a transportation speed of 30 cm/min, to thereby form an amorphous silicon-germanium film on the substrate web. Then, the resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1. As a result, the following were found. That is, the film thickness distribution: within 5%; the deposition rate: 49 Å/sec on the average; the infrared absorption spectrum: a distinguishable peak at 2000 $cm^{-1}$, at 1880 $cm^{-1}$ and at 630 $cm^{-1}$ which indicate a-SiGe:H:F film; the crystallinity: halo pattern which indicates an amorphous film; and the hydrogen content: 15±2 atomic %.

Film Formation Example 3

After the film formation of Film Formation Example 2 was completed, the introduction of the gases used therein was terminated. The isolated vessel 400 was evacuated in the same manner as in Film Formation Example 1 to bring the inside to a vacuum of less than $5 \times 10^{-6}$ Torr.

The film-forming procedures of Film Formation Example 1 were repeated, except that $SiH_4$ gas, $CH_4$ gas, $SiF_4$ gas and $H_2$ gas were fed into the film-forming space at respective flow rates of 140 sccm, 20 sccm, 5 sccm and 300 sccm; the gas pressure of the film-forming space was maintained at a vacuum of 22 m Torr; and the power of a microwave energy was made to be 1.1 KW×2, to thereby form an amorphous silicon carbide film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 42 Å/sec on the average; the infrared absorption spectrum: a distinguishable peak at 2080 $cm^{-1}$, at 1250 $cm^{-1}$, at 960 $cm^{-1}$, at 777 $cm^{-1}$ and at 660 $cm^{-1}$ which indicate a-SiC:H:F film; the crystallinity: halo pattern which indicates an amorphous film; and the hydrogen content: 14±2 atomic %.

Film Formation Example 4

After the film formation of Film Formation Example 3 was completed, the introduction of the gases used therein was terminated. The isolated vessel 400 was evacuated in the same manner as in Film Formation Example 1 to bring the inside to a vacuum of less than $5\times10^{-6}$ Torr.

The film-forming procedures of Film Formation Example 1 were repeated, except that $SiH_4$ gas, $BF_3$ gas (diluted with $H_2$ gas to 3000 ppm), $SiF_4$ gas and $H_2$ gas were fed into the film-forming space at respective flow rates of 220 sccm, 40 sccm, 25 sccm and 600 sccm; the gas pressure of the film-forming space was maintained at a vacuum of 7 m Torr; and the power of a microwave energy was made to be 1.2 KW×2, to thereby form a p-type crystalline silicon film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found: That is, the film thickness distribution: within 5%; the deposition rate: 60 Å/sec on the average; the infrared absorption spectrum: a distinguishable peak at 2100 $cm^{-1}$ and at 630 $cm^{-1}$ which indicate a microcrystal Si:H:F:B film; the crystallinity: ring pattern which indicates a non-oriented polycrystalline film; and the hydrogen content: 4±2 atomic %.

Film Formation Example 5

After the film formation of Film Formation Example 4 was completed, the introduction of the gases used therein was terminated. The isolated vessel 400 was evacuated in the same manner as in Film Formation Example 1 to bring the inside to a vacuum of less than $5\times10^{-6}$ Torr.

The film-forming procedures of Film Formation Example 1 were repeated, except that $SiH_4$ gas, $PH_3$ gas (diluted with $H_2$ gas to 1%), $SiF_4$ gas and $H_2$ gas were fed into the fill-forming space at respective flow rates of 320 sccm, 27 sccm, 5 sccm and 50 sccm; the gas pressure of the film-forming space was maintained at a vacuum of 8 m Torr; and the power of a microwave energy was made to be 0.8 KW×2, to thereby form an n-type amorphous silicon film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found: That is, the film thickness distribution: within 5%; the deposition rate: 86 Å/sec on the average; the infrared absorption spectrum: a distinguishable peak at 2000 $cm^{-1}$ and at 630 $cm^{-1}$ which indicate a-Si:H:F:P film; the crystallinity: halo pattern which indicates an amorphous film; and the hydrogen content: 22±2 atomic %.

Film Formation Example 6

The film-forming procedures of Film Formation Example 1 were repeated, except that the substrate web was replaced by a polyethyleneterephthalate substrate web (hereinafter referred to as "PET substrate web") of 45 mm in width, 0.9 mm in thickness and 100 mm in length and the circumferential wall of the film-forming chamber which comprises said PET substrate web was maintained at a temperature of 210° C., to thereby form an amorphous silicon film on the PET substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 120 Å/sec on the average; the infrared absorption spectrum: a distinguishable peak at 2000 $cm^{-1}$ and at 630 $cm^{-1}$ which indicate a-Si:H:F film; the crystallinity: halo pattern which indicates an amorphous film; and the hydrogen content: 25±2 atomic %.

The resultant film formed on the PET substrate web was cut to obtain 20 film specimens.

Each specimen was applied with an aluminum comb-shaped gap electrode of 250 μm in width and 5 mm in length by a conventional heat resistance evaporation method. For the resultant, a value of photocurrent under irradiation of AM-1 light (100 m $W/cm^2$) and a value of dark current in dark were measured using HP 4140 B to obtain a light conductivity σp (S/cm) and a dark conductivity σd (S/cm). As a result, the light conductivity of each of the 20 specimens was within the range of $(5.5\pm0.5)\times10^{-5}$ S/cm and the dark conductivity of each of the 20 specimens was within the range of $(1.5\pm0.5)\times10^{-11}$ S/cm.

Film Formation Example 7

Figure 11:
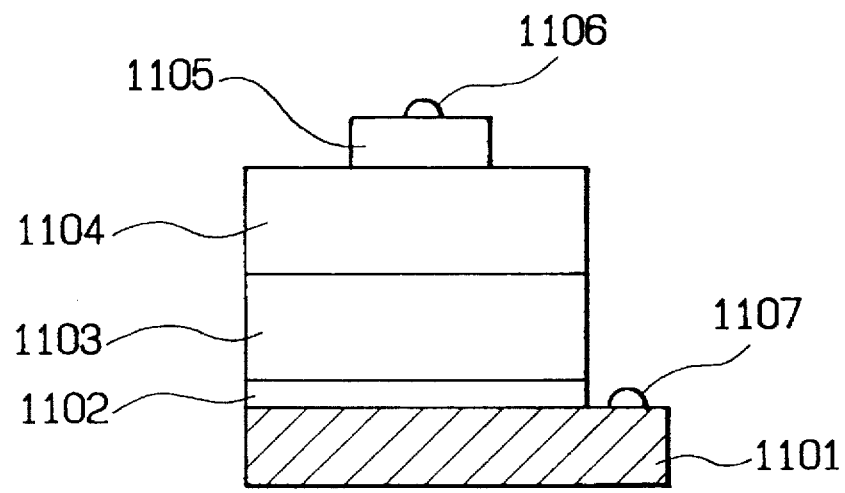
FIG. 11 is a schematic cross-section view of a Shottky diode provided by the present invention.

In this example, a Schottky junction type diode of the configuration shown in FIG. 11 was prepared, using the MW-PCVD apparatus shown in FIG. 4.

The Schottky junction type diode shown in FIG. 11 comprises substrate 1101, lower electrode 1102, $n^+$-type semiconductor layer 1103, non-doped semiconductor layer 1104, metal layer 1105, and a pair of current outputting terminals 1106 and 1107.

First, a continuous sputtering apparatus was provided, and a SUS 430 BA substrate web was set to said apparatus in the same manner as in Film Formation Example 1, wherein a Cr target (99.98% purity) was used to deposit a 1300 Å thick Cr film to be the lower electrode 1102 on the surface of the substrate web.

Then, the substrate web having said Cr layer thereon was placed in the MW-PCVD apparatus shown in FIG. 4 in the same manner as in Film Formation Example 1, wherein said substrate web was set such that the Cr layer formed thereon was facing downward. The spacing L provided between the initial and terminal supportingly transporting rollers was made as shown in Table 9. As each of the pair of microwave applicator means, one shown in Table 9 was used.

The substrate feed chamber 401, the isolated vessel 400, and the unload chamber were provisionally evacuated respectively by means of a rotary vacuum pump (not shown). These three vessels were then evacuated respectively by means of a mechanical booster pump (not shown) to a vacuum of about $10^{-3}$ Torr.

The substrate was heated to and maintained at a temperature of about 250° C. by the temperature controlling mechanisms 106a and 106b in the isolated vessel 400.

The inner pressure of the isolated vessel was regulated to a vacuum of less than $5 \times 10^{-6}$ Torr by means of an oil diffusion pump (not shown).

Thereafter, $SiH_4$ gas, $SiF_4$ gas, $PH_3/H_2$ gas (=1%), and $H_2$ gas were fed through a gas feed pipe (not shown) to the film-forming space at respective flow rates of 300 sccm, 4 sccm, 55 sccm and 40 sccm. The gas pressure of the film-forming space was controlled to and maintained at about 5 m Torr by regulating the opening of the slot valve 409 of the exhaust pipe 420.

After the flow rates of the four gases and the gas pressure became stable respectively, a microwave power source (not shown) was switched on to radiate a microwave energy (2.45 GHz) through the pair of microwave applicator means 107 and 108 into the film-forming space with an effective power of 0.8 KW (×2), wherein discharge was caused to provide a plasma region in the film-forming space. Then, the initial and terminal supporting transporting rollers 102 and 103 and the pair of supporting transporting rings 104 and 105 were started rotating respectively by a driving mechanism (not shown) to transport the substrate web at a speed of 60 cm/min. from the left side to the right side in the FIG. 4 for 5 minutes. In this case, $H_2$ gas as the gate gas was fed into the gas gates 421 and 422 through the gate gas supply pipes 416 and 417 at a flow rate of 50 sccm. And the gas gates 421 and 422 were evacuated through the exhaust pipes 418 and 419 by means of an oil diffusion pump (not shown) to bring their insides to and maintain at a vacuum of 1.5 m Torr.

As a result, there was formed an n+-type a-Si:H:F film doped with P as the n+-type semiconductor later on the Cr layer as the lower electrode 1102 previously formed on the substrate web. Thereafter, the application of the microwave energy and the introduction of the film-forming raw material gases were suspended. And, the transportation of substrate web was stopped.

Then, the isolated vessel 400 was evacuated to a vacuum of less than $5 \times 10^{-6}$ Torr.

Following the procedures in the above film formation, $SiH_4$ gas, $SiF_4$ gas and $H_2$ gas were fed into the film-forming space at respective flow rates of 320 sccm, 6 sccm and 60 sccm. The gas pressure of the film-forming space was maintained at about 6 m Torr. Then, a microwave energy (2.45 GHz) was radiated into the film-forming space with an effective power of 0.7 KW (×2). Upon generation of microwave plasma, the substrate web was transported from the right side to the left side at a transportation speed of 60 cm/min. Film formation was performed for 5.5 minutes.

As a result, there was formed a non-doped a-Si: H: F film as the non-doped semiconductor layer 1104 on the previously formed n+-type a-Si:H:F film.

After the above film formation completed, the application of the microwave energy, the introduction of the film-forming raw material gas, and the transportation of the substrate web were all terminated. The residual gas in the isolated vessel 400 was exhausted. After the substrate web was cooled to room temperature, the substrate web was taken out from the substrate feed chamber 401 which served as the unload chamber in the case of the last film formation.

The substrate web having the foregoing three layers being laminated thereon was randomly cut off to obtain ten specimens of the same size.

Each of the ten specimens was applied with an 80 Å thick Au film as the metal layer 1105 by an electron beam evaporation method. Then, a pair of current outputting terminals 1106 and 1107 were provided thereto by using a wire bonder.

Each of the resultants was examined with respect to diode characteristics by using a HP 4140 B.

As a result, each of the ten specimens exhibited a desirable diode factor (n=1.2+0.05) and about 6 digits for the rectification ratio at +1 V. From the results obtained, it was found that any of the ten specimens excels in the diode characteristics desired for the Schottky junction type diode.

Film formation Example 8

In this example, a pin junction photovoltaic element of the configuration shown in FIG. 12(a) was provided, using the three film-forming chambered MW-PCVD apparatus shown in FIG. 6.

A PET substrate web was used as the substrate web 101 in FIG. 6.

The PET substrate web was set to a continuous sputtering apparatus, wherein a 1000 Å thick Ag film as a electroconductive layer was formed on said substrate web by sputtering an Ag target (99.99%). Successively, a 1.2 μm thick ZnO film as the lower electrode 1202 was formed on the previously formed Ag film by supporting a ZnO target (99.999%).

The substrate web having the Ag thin film and the ZnO thin film being laminated thereon was set to the three film-forming chambered MW-PCVD apparatus having the constitution shown in FIG. 6 in the same manner as in Film Formation Example 1.

In this case, the size of the columnar portion provided in the isolated vessel 400 was made to be 20 cm in inside diameter as shown in Table 10. Likewise, the size of the columnar portion in the isolated chamber 400a and the size of the columnar portion in the isolated chamber 400b were made to be 10 cm and 9 cm in inside diameter. As each of the pair of microwave applicator means 107 and 108 to be provided to the film-forming chamber in the isolated vessel 400, one shown in Table 10 was used. Likewise, as each of the pair of microwave applicator means 107a and 108a to be provided to the film-forming chamber in the isolated vessel 400a and also as each of the pair of microwave applicator means 107b and 108b in the isolated vessel 400b, those shown in Table 11 were used.

There was caused microwave discharge in each of the three film-forming chambers under the respective conditions shown in Table 10 for the isolated vessel 400 and in Table 11 for the isolated chambers 400a and 400b. After the state of the discharge in each of the three film-forming chambers became stable, the substrate web was started moving at a transportation speed of 55 cm/min. from the left side to the right side. Thus, there were continuously formed an n-type a-Si:H:F film doped with P to be the n-type semiconductor layer 1203 in the film-forming chamber of the isolated chamber 400a under the film-forming conditions shown in Table 11, a non-doped a-Si:H:F film to be the i-type semiconductor layer 1204 in the film-forming chamber of the isolated vessel 400 under the film-forming conditions shown in Table 10, and a p+-type microcrystal Si:H:F film doped with B to be the p-type semiconductor layer 1205 in the film-forming chamber of the isolated vessel 400b under the film-forming conditions shown in Table 11 respectively on the moving substrate in the same manner as in Film Formation Example 7.

The substrate web having the foregoing n-type, i-type and p+-type semiconductor layers being laminated on the lower electrode comprising the foregoing ZnO thin film was cooled to room temperature in the unload chamber 402 and it was taken out therefrom. This substrate web was set to a reactive sputtering apparatus, wherein a 700 Å thick ITO film as the transparent electrode 1206 was formed thereon. Then, the resultant was cut off to obtain a plurality of specimens respectively of 35 cm×70 cm in size. Each of the specimens thus obtained was applied with a comb-shaped collecting electrode comprising about 1 μm thick Ag film onto the surface thereof by an electron beam evaporation method.

Thus, a plurality of solar cell modules were obtained respectively of the pin junction type.

For each of them, the photovoltaic characteristics were evaluated under irradiation of AM 1.5 light (100 mW/cm$^2$). As a result, every module exhibited a photoelectric conversion efficiency of more than 8.3%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 9

A pin junction photovoltaic element of the configuration shown in FIG. 12(*a*) was prepared by repeating the procedures of Film Formation Example 8, except that instead of the a-Si:H:F film as the i-type semiconductor layer, there was formed a non-doped a-SiGe:H:F film in the same manner as in Film Formation Example 2 wherein the substrate web was maintained at 200° C. and the substrate web was moved at a transportation speed of 52 cm/min.

The resultant was processed in the same manner as in Film Formation Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 7.3%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 10

A pin junction photovoltaic element of the configuration shown in FIG. 12(*a*) was prepared by repeating the procedures of Film Formation Example 8, except that instead of the a-Si:H:F film as the i-type semiconductor layer, there was formed a non-doped a-SiC:H:F film in the same manner as in Film Formation Example 3 wherein the substrate web was maintained at 200° C. and the substrate web was moved at a transportation speed of 50 cm/min.

The resultant was processed in the same manner as in Film Formation Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 6.6%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 11

In this example, a photovoltaic element of the configuration shown in FIG. 12(*c*) was prepared, using a modification of the three film-forming chambered MW-PCVD apparatus shown in FIG. 6 wherein a first isolated vessel 400a' equivalent to the isolation vessel 400a, a second isolated vessel 400' equivalent to the isolated vessel 400 and a third isolated vessel 400b' equivalent to the isolated vessel 400b are additionally arranged between the isolated vessel 400b and the unload chamber 402 and these three isolated vessels are connected to each other by means of gas gates (not shown).

As the substrate web 101, a substrate web made of SUS 430 BA was used which is the same as used in Film Formation Example 1.

Firstly, the substrate web was applied with a 1.2 μm thick ZnO film as the lower electrode 1202 to the surface thereof in the same manner as in Film Formation Example 8.

Then, the substrate web was set to the foregoing modified six film-forming chambered MW-PCVD apparatus. The lower cell 1211 was formed using the first unit comprising the isolated vessels 400a, 400 and 400b in the same manner as in Film Formation Example 9 and under the conditions shown in Table 12, and the upper cell 1212 was formed using the second unit comprising the isolated vessels 400a', 400' and 400b' in the same manner as in Film Formation Example 8 under the conditions shown in Table 12.

The resultant was applied with a ITO thin film as the transparent electrode to the surface of the top layer thereof in the same manner as in Film Formation Example 8.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode 1206 in the same manner as in Film Formation Example 8.

Thus, a plurality of solar cell modules were obtained respectively of the pin junction type.

For each of them, the photovoltaic characteristics were evaluated under irradiation of AM 1.5 light (100 mW/cm$^2$). As a result, every module exhibited a photoelectric conversion efficiency of more than 10.3%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

These modules were properly combined to obtain a power supply system. It was found that the resultant system outputs a power of about 3 KW.

Film Formation Example 12

In this example, a photovoltaic element of the configuration shown in FIG. 12(c) was used, using the same six film-forming chambered MW-PCVD apparatus as used in Film Formation Example 11.

As the substrate web 101, a substrate web made of SUS 430 BA was used which is the same as used in Film Formation Example 1.

First, the substrate web was applied with a 1.2 μm thick ZnO film as the lower electrode 1202 to the surface thereof in the same manner as in Film Formation Example 8.

Then, the substrate web was set to the six film-forming chambered MW-PCVD apparatus. The lower cell 1211 was formed using the first unit comprising the isolated vessels 400a, 400 and 400b in the same manner as in Film Formation Example 8 and under the conditions shown in Table 13, and the upper cell 1212 was formed using the second unit comprising the isolated vessels 400a', 400' and 400b' in the same manner as in Film Formation Example 10 under the conditions shown in Table 13.

The resultant was applied with a ITO thin film as the transparent electrode to the surface of the top layer thereof in the same manner as in Film Formation Example 8.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode 1206 in the same manner as in Film Formation Example 8.

Thus, a plurality of solar cell modules were obtained respectively of the pin junction type.

For each of them, the photovoltaic characteristics were evaluated under irradiation of AM 1.5 light (100 mW/cm$^2$). As a result, every module exhibited a photoelectric conversion efficiency of more than 10.2%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

These modules were properly combined to obtain a power supply system. It was found that the resultant system outputs a power of about 3 KW.

Film Formation Example 13

In this example, a triple cell type photovoltaic element of the configuration shown in FIG. 12(d) was prepared, using a modification of the six film-forming chambered MW-PCVD apparatus used in Film Formation Example 11, wherein a first isolated vessel 400a" equivalent to the isolation vessel 400a, a second isolated vessel 400" equivalent to the isolated vessel 400 and a third isolated vessel 400b" equivalent to the isolated vessel 400b are additionally arranged between the isolated vessel 400b' and the unload chamber 402 and these three isolated vessels are connected to each other by means of gas gates (not shown).

As the substrate web 101, a substrate web made of SUS 430 BA was used which is the same as used in Film Formation Example 1.

First, the substrate web was applied with a 1.2 μm thick ZnO film as the lower electrode 1202 to the surface thereof in the same manner as in Film Formation Example 8.

Then, the substrate web was set to the foregoing modified nine film-forming chambered MW-PCVD apparatus. The lower cell 1220 was formed using the first unit comprising the isolated vessels 400a, 400 and 400b in the same manner as in Film Formation Example 9 and under the conditions shown in Table 14. The middle cell 1221 was formed using the second unit comprising the isolated vessels 400a', 400' and 400b' in the same manner as in Film Formation Example 8 under the conditions shown in Table 14. And the upper cell 1222 was formed using the third unit comprising the isolated vessels 400a", 400" and 400b" in the same manner as in Film Formation Example 10 and under the conditions shown in Table 14.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode 1206 in the same manner as in Film Formation Example 8.

Thus, a plurality of solar cell modules were obtained respectively of the pin junction type.

For each of them, the photovoltaic characteristics were evaluated under irradiation of Am 1.5 light (100 mW/cm$^2$). As a result, every module exhibited a photoelectric conversion efficiency of more than 10.4%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

These modules were properly combined to obtain a power supply system. It was found that the resultant system outputs a power of about 3 KW.

Film Formation Example 14

An amorphous silicon film was continuously formed on a large area and lengthy substrate web, using the MW-PCVD apparatus (shown in FIG. 5) described in the foregoing Apparatus Embodiment 22.

A pay-out reel 503 having a cleaned substrate web 201 made of SUS 430 BA of 45 cm in width, 0.25 mm in thickness and 200 m in length wound thereon was placed in the substrate feed chamber 501. The substrate web 201 was paid out from the pay-out reel 503, it was passed through the gas gate 421, the transportation mechanism of the isolated vessel 500 and the gas gate 522, and fixed to the take-up reel 504 of the unload chamber 502. The substrate web 201 was adjusted not to have any loose parts.

The size of the columnar portion to be the circumferential wall of the film-forming chamber and the spacing L provided between the initial and terminal transporting rollers 202 and 203 were made as shown in Table 15. Likewise, as each of the pair of microwave applicator means 207 and 208, one shown in Table 15 was used.

The substrate feed chamber 501, the isolated vessel 500, and the unload chamber were provisionally evacuated respectively by means of a mechanical booster pump (not shown) to a vacuum of about 10$^{-3}$ Torr. The substrate web 201 situated in the isolated vessel 500 was heated and maintained at a temperature of about 250° C. by the temperature controlling mechanisms 206a and 206b. The inner pressure of the isolated chamber 500 was controlled to a vacuum of less than 5×10$^{-6}$ Torr by means of an oil diffusion pump (not shown).

Thereafter, through a bias voltage applying pipe 213 made of nickel which serves also as a gas feed pipe, SiH$_4$ gas, SiF$_4$ gas and H$_2$ gas were fed into the film-forming space at respective flow rates of 400 sccm, 4.5 sccm and 80 sccm. The gas pressure of the film-forming space was controlled to and maintained at about 4.5 m Torr by regulating the opening of a slot valve 509 of an exhaust pipe 520. After the flow rates of the three gases and said gas pressure became stable respectively, a microwave power source (not shown) was switched on to radiate a microwave energy (2.45 GHz) through the pair of microwave applicator means 207 and 208 into the film-forming space with an effective power of 0.70 KW(×2), wherein discharge was caused to provide a plasma region in the film-forming space. In this case, no plasma region was leaked out of the film-forming space. And any leakage of microwave out of the isolated vessel 500 was not detected.

Then, a bias voltage power source 219 was switched on to apply a DC voltage of +80 V onto the bias voltage applying pipe 213, wherein a bias current of 6.8 A was flown and a certain increase in the luminance of plasma was visually observed.

Successively, the initial and terminal supporting transporting rollers 202 and 203 and the pair of supporting transporting rings 204 and 205 were started rotating respectively by a driving mechanism (not shown) to thereby transport the substrate web 201 at a speed of 40 cm/min, wherein plasma was stable and no change was observed for the bias voltage and the bias current.

In the above, H$_2$ gas as the gate gas was fed into gas gates 521 and 522 through gate gas supply pipes 516 and 517 at a flow rate of 50 sccm. And the gas gates 521 and 522 were evacuated through exhaust pipes 518 and 519 by means of an oil diffusion pump (not shown) to bring their insides to and maintain at a vacuum of 1 m Torr.

Film formation was performed for 30 minutes. Since a lengthy substrate web was used, next film formation was successively performed after finishing the film formation of this example. After the film formation of this example, the substrate web 201 taken up on the take-up reel 504 while being cooled by the temperature controlling mechanism 513 in the unload chamber 502 was taken out from the unload chamber 502.

Then, the film deposited on the substrate web 201 in this example was examined with respect to the thickness distribution in the width direction and also in the longitudinal direction. As a result, it was found that the thickness distribution was within 5%. As a result of examining the deposition rate, it was found to be 100 Å/sec on the average. Further, as a result of examining an infrared absorption spectrum for a film specimen cut off from the resultant by a conventional reflection method, a distinguishable peak was found at 2000 cm$^{-1}$ and also at 630 cm$^{-1}$ which indicate a-Si:H:F film. Likewise, as a result of examining the crystallinity of said film specimen by a RHEED (trade name: JEM-100 SX, product by JEOL, Ltd. ), the film specimen showed a halo pattern, and it was found to be amorphous. Further, the amount of hydrogen atoms contained in the film specimen was examined by a hydrogen content analyzer EMGA-1100 (product by Horiba Seisakusho Kabushiki Kaisha). As a result, it was found to be 21±2 atomic %.

Further, about 5 cm$^2$ square of the amorphous silicon film formed on the substrate web 201 was mechanically removed. The resultant was measured with respect to its volume, and it was set to a ESR device JES-RE2X (product by JEOL, Ltd.) to measure its spin density. As a result, it was found that its spin density is 2.5×10$^{15}$ spins/cm$^2$, which means that the film has few defects.

In addition, the substrate web having the amorphous silicon film thereon was cut off to obtain 5 specimens respectively of 1 cm×1 cm in size.

Each of the specimens was applied with a 1500 Å thick ITO (In$_2$O$_3$+SnO$_2$) film to the surface thereof by a reactive sputtering method.

Each of the resultants was set to a constant photocurrent device (product by CANON KABUSHIKI KAISHA), wherein light was impinged from the side of the ITO film to measure the inclination of an Urbach tail. Any of the 5 specimens showed a value of 48±1 meV.

From this result, it was found that the film exhibits few defects.

Film Formation Example 15

After the film formation of Film Formation Example 14 was completed, the introduction of the gases used therein was terminated. The isolated vessel 500 was evacuated in the same manner as in Film Formation Example 14 to bring the inside to a vacuum of less than 5×10⁻⁶ Torr. The film-forming procedures of Film Formation Example 14 were repeated, except that $SiH_4$ gas, $GeH_4$ gas, $SiF_4$ gas and $H_2$ gas were fed into the film-forming space at respective flow rates of 120 sccm, 100 sccm, 4 sccm and 60 sccm; the gas pressure of the film-forming space was maintained at 9 mTorr; the power of a microwave energy was made to be 0.5 KW(×2) in terms of effective power; and the substrate web 201 was moved at a transportation speed of 25 cm/min, to thereby form an amorphous silicon germanium film on the substrate web.

In the above, a DC bias voltage of +40 V was applied onto the bias voltage applying pipe 213, wherein a bias current of 6.2 A was flown and a certain increase in the luminance of plasma was visually observed.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 14.

As a result, the following were found. That is, the film thickness distribution: within 5%; the deposition rate: 52 Å/sec on the average; the infrared absorption spectrum: a distinguishable peak at 2000 cm⁻¹, at 1880 cm⁻¹, and at 630 cm⁻¹ which indicate a SiGe:H:F film; the crystallinity: halo pattern which indicates an amorphous film; and the hydrogen content: 14±2 atomic %.

Further, the spin density and the inclination of an Urback tail of the resultant film were examined in the same manner as in Film Formation Example 14.

As a result, the following were found. That is, the spin density: $4.5 \times 10^{15}$ spins/cm which means that the film is accompanied with few defects; and the Urback tail inclination: 54±1 meV which also means that the film is accompanied with few defects.

Film Formation Example 16

After the film formation of Film Formation Example 15 was completed, the introduction of the gases used therein was terminated. The isolated vessel 500 was evacuated in the same manner as in Film Formation Example 14 to bring the inside to a vacuum of less than 5×10⁻⁶ Torr. The film-forming procedures of Film Formation Example 14 were repeated, except that $SiH_4$ gas, $CH_4$ gas, $SiF_4$ gas and $H_2$ gas were fed into the film-forming space at respective flow rates of 160 sccm, 23 sccm, 5 sccm and 250 sccm; the gas pressure of the film-forming space was maintained at 23 m Torr; and the power of a microwave energy was made to be 1.0 KW(×2) in terms of effective power, to thereby form an amorphous silicon carbide film on the substrate web.

In the above, a DC bias voltage of +50 V was applied onto the bias voltage applying pipe 213, wherein a bias current of 6.6 A was flown and a certain increase in the luminance of plasma was visually observed.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 14.

As a result, the following were found. That is, the film thickness distribution: within 5%; the deposition rate: 41 Å/sec on the average; the infrared absorption spectrum: a distinguishable peak at 2080 cm⁻¹, at 1250 cm⁻¹, at 960 cm⁻¹, at 777 cm⁻¹ and at 660 cm⁻¹ which indicate a SiC:H:F film; the crystallinity: halo pattern which indicates an amorphous film; and the hydrogen content: 15±2 atomic %.

Further, the spin density and the inclination of an Urback tail of the resultant film were examined in the same manner as in Film Formation Example 14.

As a result, the following were found. That is, the spin density: $8.0 \times 10^{15}$ spins/cm³ which means that the film has few defects; and the Urback tail inclination: 57±1 meV which also means that the film has few defects.

Film Formation Example 17

After the film formation of Film Formation Example 16 was completed, the introduction of the gases used therein was terminated. The isolated vessel 500 was evacuated in the same manner as in Film Formation Example 14 to bring the inside to a vacuum of less than 5×10⁻⁶ Torr. The film-forming procedures of Film Formation Example 14 were repeated, except that $SiH_4$ gas, $BF_3/H_2$ gas (=3000 ppm), $SiF_4$ gas and $H_2$ gas were fed into the film-forming space at respective flow rates of 200 sccm, 38 sccm, 25 sccm and 550 sccm; the gas pressure of the film-forming space was maintained at 6.5 m Torr; and the power of a microwave energy was made to be 1.1 KW(×2) in terms of effective power, to thereby form a p-type microcrystal silicon film doped with B on the substrate web.

In the above, a DC bias voltage of +120 V was applied onto the bias voltage applying pipe 213, wherein a bias current of 7.5 A was flown and a certain increase in the luminance of plasma was visually observed.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 14.

As a result, the following were found. That is, the film thickness distribution: within 5%; the deposition rate: 48 Å/sec on the average; the infrared absorption spectrum: a distinguishable peak at 2100 cm⁻¹ at 630 cm⁻¹ which indicate a microcrystal Si:H:F film; the crystallinity: ring pattern which indicates a non-oriented polycrystalline film; and the hydrogen content: 4±2 atomic %.

In addition, the substrate web of the foregoing film formed thereon was randomly cut off to obtain 5 specimens respectively of 5 mm×5 mm in size.

The surface state of each of the 5 specimens was observed by an ultra-high resolution low-accelerating FE-SEM S-900 type (product by Hitachi Ltd.)

As a result, it was found that any of the 5 specimens has a desirably smooth surface without having any undesirable irregularities.

Film Format ion Example 18

After the film formation of Film Formation Example 17 was completed, the introduction of the gases used therein was terminated. The isolated vessel 500 was evacuated in the same manner as in Film Formation Example 14 to bring the inside to a vacuum of less than 5×10⁻⁶ Torr. The film-forming procedures of Film Formation Example 14 were repeated, except that $SiH_4$ gas, $PH_3/H_2$ gas (=1%), $SiF_4$ gas and $H_2$ gas were fed into the film-forming space at respective flow rates of 280 sccm, 24 sccm, 5 sccm and 40 sccm; the gas pressure of the film-forming space was maintained at 7 m Torr; the power of a microwave energy was made to be 0.75 KW(×2) in terms of effective power, to thereby form an n-type amorphous silicon film doped with P on the substrate web.

In the above, a DC bias voltage of +80 V was applied onto the bias voltage applying pipe 213, wherein a bias current of 7.0 A was flown and a certain increase in the luminance of plasma was visually observed by eyes.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 14.

As a result, the following were found: That is, the film thickness distribution: within 5%; the deposition rate: 65 Å/sec on the average; the infrared absorption spectrum: a distinguishable peak at 2000 cm$^{-1}$, 630 cm$^{-1}$ which indicate a a-Si: H: F film; the crystallinity: halo pattern which indicates an amorphous film; and the hydrogen content: 21±2 atomic %.

In addition, the substrate web of the foregoing film formed thereon was randomly cut off to obtain 5 specimens respectively of 5 mm×5 mm in size.

The surface state of each of the 5 specimens was observed by an ultra-high resolution low-accelerating FE-SEM S-900 type (product by Hitachi Ltd.)

As a result, it was found that any of the 5 specimens has a desirably smooth surface without having any undesirable irregularities.

Film Formation Example 19

The procedures of Film Formation Example 14 were repeated except that the SUS 430 BA substrate web was replaced by a PET substrate web processed in the way as will be described below: said substrate web was maintained at a temperature of 210° C. upon film formation, to thereby continuously form an amorphous silicon film on said substrate web.

That is, a PET substrate web of 45 cm in width, 0.9 mm in thickness and 100 m in length of, and it was applied with a 2 μm thick Al film to the surface thereof on which a film is to be formed, wherein a part of which a plurality of comb-shaped gap electrodes respectively of 70 μm in width and 10 mm in length were formed at the interval of 20 cm in the longitudinal direction. This was used as the substrate web.

During the film formation, a DC bias voltage of +80 V was applied onto the bias voltage applying pipe 213, wherein a bias current of 6.7 A was flown and a certain increase in the luminance of plasma was visually observed.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 14.

As a result, the following were found: That is, the film thickness distribution: within 5%; the deposition rate: 95 Å/sec on the average; the infrared absorption spectrum: a distinguishable peak at 2000 cm$^{-1}$ and at 630 cm$^{-1}$ which indicate a a-Si:H:F film; the crystallinity: halo pattern which indicates an amorphous film; and the hydrogen content: 24±2 atomic %.

The resultant film formed on the plurality of gap electrodes was randomly cut to obtain 20 film specimens respectively containing a gap electrode. For each specimen, a value of photocurrent under irradiation of AM-1 light (100 mW/cm$^2$) and a value of dark current in dark were measured using HP 4140 B to obtain a light conductivity σp (S/cm) and a dark conductivity σd (S/cm). As a result, the light conductivity of each of the 20 specimens was within the range of (3.5±0.5)×10$^{-5}$ S/cm and the dark conductivity of each of the 20 specimens was within the range of (1.0±0.5)× 10$^{-11}$ S/cm.

Further, the inclination of an Urback tail of the resultant film was examined in the same manner as in Film Formation Example 14.

As a result, the Urback tail inclination was 50±1 meV which means that the film has few defects.

Film Formation Examples 20 to 24

In each of Film Formation Examples 14 to 18, the film formation was performed by changing the bias voltage as shown in Table 16.

The film obtained in each of the five cases was evaluated in the same manner as in Film Formation Examples 14 to 18.

The evaluated results obtained were collectively shown in Table 16.

In each of the five cases, plasma was stably maintained without causing abnormal discharge and a desirable semiconductor film excelling in the characteristics was obtained.

Film Formation Examples 25 to 29

In each of Film Formation Examples 14 to 18, the bias voltage applying means was replaced by the bias voltage applying means shown in FIG. 15(d), a DC voltage of +30 V was applied onto the first bias bar and a different bias voltage was applied onto the second bias bar as shown in Table 17.

The film obtained in each of the five cases was evaluated in the same manner as in Film Formation Examples 14 to 18.

The evaluated results obtained are collectively shown in Table 17.

In each of the five cases, plasma was stably maintained without causing abnormal discharge and a desirable semiconductor film excelling in the characteristics was obtained.

Film Formation Example 30

In this example, a Schottky junction type diode of the configuration shown in FIG. 11 was prepared, using the MW-PCVD apparatus shown in FIG. 5.

The Schottky junction type diode shown in FIG. 11 comprises substrate 1101, lower electrode 1102, n$^+$-type semiconductor layer 1103, non-doped semiconductor layer 1104, metal layer 1105, and a pair of current outputting terminals 1106 and 1107.

First, there was provided a continuous sputtering apparatus was provided, and a SUS 430 BA substrate web was set to said apparatus in the same manner as in Film Formation Example 14, wherein a Cr target (99.98% purity) was used to deposit a 1300 Å thick Cr film to be the lower electrode 1102 on the surface of the substrate web.

Then, the substrate web having said Cr layer thereon was placed in the MW-PCVD apparatus shown in FIG. 5 in the same manner as in Film Formation Example 14, wherein said substrate web was set such that the Cr layer formed thereon was facing downward. The spacing L provided between the initial and terminal supporting transporting rollers was made as shown in Table 15. As each of the pair of microwave applicator means, there was used one shown in Table 15.

The substrate feed chamber 501, the isolated vessel 500, and the unload chamber 502 were provisionally evacuated respectively by means of a rotary vacuum pump (not shown). These three vessels were then evacuated respectively by means of a mechanical booster pump (not shown) to a vacuum of about $10^{-3}$ Torr.

The substrate was heated to and maintained at a temperature of about 250° C. by the temperature controlling mechanisms 206a and 206b in the isolated vessel 500.

The inner pressure of the isolated vessel was regulated to a vacuum of less than $5 \times 10^{-6}$ Torr by means of an oil diffusion pump (not shown).

Thereafter, $SiH_4$ gas, $SiF_4$ gas, $PH_3/H_2$ gas (=1%), and $H_2$ gas were fed through the bias voltage applying pipe 213 capable of serving as the gas feed pipe into the film-forming space at respective flow rates of 280 sccm, 4 sccm, 50 sccm and 35 sccm. The gas pressure of the film-forming space was controlled to and maintained at about 7.5 m Torr by regulating the opening of the slot valve 509 of the exhaust pipe 520.

After the flow rates of the four gases and the gas pressure became stable respectively, a microwave power source (not shown) was switched on to radiate a microwave energy (2.45 GHz) through the pair of microwave applicator means 207 and 208 into the film-forming space with an effective power of 0.8 KW (×2). At the same time, a DC bias voltage of +80 V was applied onto the bias voltage applying pipe 213, wherein a bias current of 6.9 A was flown.

After plasma became stable, the initial and terminal supporting transporting rollers 202 and 203 and the pair of supporting transporting rings 204 and 205 were started rotating respectively by a driving mechanism (not shown) to transport the substrate web at a speed of 50 cm/min. from the left side to the right side in the FIG. 5 for 5 minutes. In this case, $H_2$ gas as the gate gas was fed into the gas gates 521 and 522 through the gate gas supply pipes 516 and 517 at a flow rate of 50 sccm. And the gas gates 521 and 522 were evacuated through the exhaust pipes 518 and 519 by means of an oil diffusion pump (not shown) to bring their insides to and maintain at a vacuum of 1.5 m Torr.

As a result, there was formed an n+-type a-Si:H:F film doped with P as the n+-type semiconductor later 1103 on the Cr layer as the lower electrode 1102 previously formed on the substrate web. Thereafter, the application of the microwave energy and the introduction of the film-forming raw material gases were suspended. And, the transportation of substrate web was stopped.

Then, the isolated vessel 500 was evacuated to a vacuum of less than $5 \times 10^{-6}$ Torr.

Following the procedures in the above film formation, $SiH_4$ gas, $SiF_4$ gas and $H_2$ gas were fed into the film-forming space at respective flow rates of 350 sccm, 6.5 sccm and 65 sccm. The gas pressure of the film-forming space was maintained at about 6.5 m Torr. Then, a microwave energy (2.45 GHz) was radiated into the film-forming space with an effective power of 0.7 KW (×2). At the same time, a DC bias voltage of +80 V was applied, wherein a bias current of 6.5 A was flown. After generated plasma became stable, the substrate web was transported from the right side to the left side reversly at a transportation speed of 67 cm/min. Film formation was performed for 3.7 minutes.

As a result, there was formed a non-doped a-Si:H:F film as the non-doped semiconductor layer 1104 on the previously formed n+-type a-Si:H:F film.

After the above film formation completed, the application of the microwave energy, the introduction of the film-forming raw material gas, and the transportation of the substrate web were all terminated. The residual gas in the isolated vessel 500 was exhausted. After the substrate web was cooled to room temperature, the substrate web was taken out from the substrate feed chamber 501 which served as the unload chamber in the case of the last film formation.

The substrate web having the foregoing three layers being laminated thereon was randomly cut off to obtain ten specimens of the same size.

Each of the ten specimens was applied with a 80 Å thick Au film by an electron beam evaporation method. Then, a pair of current outputting terminals 1106 and 1107 were provided thereto by using a wire bonder.

Each of the resultants was examined with respect to diode characteristics by using a HP 4140 B.

As a result, each of the ten specimens exhibited a desirable diode factor (n=1.2±0.04) and about 6 digits for the rectification ratio at ±1 V. From the results obtained, it was found that any of the ten specimens excels in the diode characteristics desired for the Schottky junction type diode.

Film formation Example 31

In this example, a pin junction photovoltaic element of the configuration shown in FIG. 12(a) was prepared, using the three film-forming chambered MW-PCVD apparatus shown in FIG. 7.

A PET substrate web was used as the substrate web 201.

The PET substrate web was set to a continuous sputtering apparatus, wherein a 1000 Å thick Ag film as a electroconductive layer was formed on said substrate web by sputtering an Ag target (99.99%). Successively, a 1.2 μm thick ZnO film as the lower electrode 1202 was formed on the previously formed Ag film.

The substrate web having the Ag thin film and the ZnO thin film being laminated thereon was set to the three film-forming chambered MW-PCVD apparatus having the constitution shown in FIG. 7 in the same manner as in Film Formation Example 28.

In this case, the size of the columnar portion provided in the isolated vessel 500 was made to be 22 cm in inside diameter as shown in Table 18. Likewise, the size of the columnar portion in the isolated chamber 500a and the size of the columnar portion in the isolated chamber 500b were made to be 10 cm and 9 cm in inside diameter. As each of the pair of microwave applicator means 207 and 208 to be provided to the film-forming chamber in the isolated vessel 500, one shown in Table 18 was used. Likewise, as each of the pair of microwave applicator means 207a and 208a to be provided to the film-forming chamber in the isolated vessel 500a and also as each of the pair of microwave applicator means 207b and 208b in the isolated vessel 500b, those shown in Table 19 was used.

There was caused microwave discharge in each of the three film-forming chambers under the respective conditions shown in Table 18 for the isolated vessel 500 and in Table 19 for the isolated vessels 500a and 500b. In the film-forming chamber of the isolated vessel 500a, there was formed an n-type a-Si:H:F film to be the n-type semiconductor layer 1203 under the conditions shown in Table 19. In the film-forming chamber of the isolated vessel 500, there was formed a non-doped a-Si:H:F film to be the i-type semiconductor layer 1204 under the conditions shown in Table 18. In the film-forming chamber of the isolated vessel 500b, there was formed a p+-type microcrystal Si:H:F film to be the p-type semiconductor layer 1205 under the conditions shown in Table 19.

The substrate web having the foregoing n-type, i-type and p+-type semiconductor layer being laminated on the lower electrode comprising the foregoing ZnO thin film was cooled to room temperature in the unload chamber 402 and it was taken out therefrom. This substrate web was set to a reactive sputtering apparatus, wherein a 700 Å thick ITO film as the transparent electrode 1206 was formed thereon. Then, the resultant was cut off to obtain a of specimens respectively of 35 cm×70 cm in size. Each of the specimens thus obtained was applied with a comb-shaped collecting electrode comprising an about 1 µm thick Ag film onto the surface thereof by an electron beam evaporation method.

Thus, a plurality of solar cell modules were obtained respectively of the pin junction type.

For each of them, the photovoltaic characteristics were evaluated under irradiation of Am 1.5 light (100 mW/cm$^2$). As a result, every module exhibited a photoelectric conversion efficiency of more than 8.5%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were appropriately combined to obtain a power supply system. It was found that the resultant system outputs a power of about 3 KW.

Film Formation Example 32

A pin junction photovoltaic element of the configuration shown in FIG. 12(*a*) was prepared by repeating the procedures of Film Formation Example 31, except that instead of the a-Si:H:F film as the i-type semiconductor layer, there was formed a non-doped a-SiGe: H: F film in the manner similar to that of Film Formation Example 15 wherein the substrate web was maintained at 200° C., the substrate web was moved at a transportation speed of 51 cm/min, and a sine wave bias voltage (500 Hz) of 170 Vp-p was applied upon film formation.

From the resultant, a plurality of solar cell modules were prepared in the same manner as in Film Formation Example 31.

For each of them, the photovoltaic characteristics were evaluated under irradiation of Am 1.5 light (100 mW/cm$^2$). As a result, every module exhibited a photoelectric conversion efficiency of more than 6.8%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%. The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were appropriately combined to obtain a power supply system. It was found that the resultant system outputs a power of about 3 KW.

Film Formation Example 33

A pin junction photovoltaic element of the configuration shown in FIG. 12(*a*) was prepared by repeating the procedures of Film Formation Example 31, except that in stead of the a-Si:H:F film as the i-type semiconductor layer, there was formed a non-doped a-SiC:H:F film in the manner similar to that of Film Formation Example 16 wherein the substrate web was maintained at 200° C., the substrate web was moved at a transportation speed of 36 cm/min, and a triangle wave bias voltage (1 MHz) of 160 Vp-p was applied upon film formation.

From the resultant, a plurality of solar cell modules were prepared in the same manner as in Film Formation Example 31.

For each of them, the photovoltaic characteristics were evaluated under irradiation of Am 1.5 light (100 mW/cm$^2$). As a result, every module exhibited a photoelectric conversion efficiency of more than 6.8%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained this example were properly combined to obtain a power supply system. It was found that the resultant system outputs a power of about 3 KW.

Film Formation Example 34

In this example, a photovoltaic element of the configuration shown in FIG. 12(*c*) was prepared, using a modification of the three film-forming chambered MW-PCVD apparatus shown in FIG. 7 wherein a first isolated vessel 500*a*' equivalent to the isolation vessel 500*a*, a second isolated vessel 500' equivalent to the isolated vessel 500 and a third isolated vessel 500*b*' equivalent to the isolated vessel 500*b* are additionally arranged between the isolated vessel 500*b* and the unload chamber 502 and these three isolated vessels are connected to each other by means of gas gates (not shown).

As the substrate web 201, a substrate web made of SUS 430 BA was used which is the same as used in Film Formation Example 14.

First, the substrate web was applied with a 1.2 µm thick ZnO film as the lower electrode 1202 to the surface thereof.

Then, the substrate web was set to the foregoing modified six film-forming chambered MW-PCVD apparatus. The lower cell 1211 was formed using the first unit comprising the isolated vesseles 500*a*, 500 and 500*b* in the same manner as in Film Formation Example 32 and under the conditions shown in Table 20, and the upper cell 1212 was formed using the second unit comprising the isolated vessels 500*a*', 500' and 500*b*' in the same manner as in Film Formation Example 31 under the conditions shown in Table 20.

The resultant was applied with a ITO thin film as the transparent electrode 1206 to the surface of the top layer thereof.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode.

For each of them, the photovoltaic characteristics were evaluated under irradiation of Am 1.5 light (100 mW/cm$^2$). As a result, every module exhibited a photoelectric conversion efficiency of more than 10.4%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.0%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were appropriately combined to obtain a power supply system. It was found that the resultant system outputs a power of about 3 KW.

Film Formation Example 35

In this example, a photovoltaic element of the configuration shown in FIG. 12(c) was prepared, using the same six film-forming chamber MW-PCVD apparatus as used in Film Formation Example 34.

As the substrate web 201, a substrate web made of SUS 430 BA was used which is the same as used in Film Formation Example 14.

First, the substrate web was applied with a 1.2 μm thick ZnO film as the lower electrode 1202 to the surface thereof.

Then, the substrate web was set to the foregoing modified six film-forming chambered MW-PCVD apparatus. The lower cell 1211 was formed using the first unit comprising the isolated vesseles 500a, 500 and 500b in the same manner as in Film Formation Example 31 and under the conditions shown in Table 21, and the upper cell 1212 was formed using the second unit comprising the isolated vessels 500a', 500' and 500b' in the same manner as in Film Formation Example 33 under the conditions shown in Table 21.

The resultant was applied with a ITO thin film as the transparent electrode to the surface of the top layer thereof.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode 1206.

For each of them, the photovoltaic characteristics were evaluated under irradiation of Am 1.5 light (100 mW/cm$^2$). As a result, every module exhibited a photoelectric conversion efficiency of more than 10.3%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were appropriately combined to obtain a power supply system. It was found that the resultant system outputs a power of about 3 KW.

Film Formation Example 36

In this example, a triple cell type photovoltaic element of the configuration shown in FIG. 12(d) was prepared, using a modification of the six film-forming chambered MW-PCVD apparatus used in Film Formation Example 34, wherein a first isolated vessel 500a" equivalent to the isolated vessel 500a, a second isolated vessel 500" equivalent to the isolated vessel 500 and a third isolated vessel 500b" equivalent to the isolated vessel 500b are additionally arranged between the isolated vessel 500b' and the unload chamber 502 and these three isolated vessels are connected each other by means of gas gates (not shown).

As the substrate web 201, a substrate web made of SUS 430 BA was used which is the same as used in Film Formation Example 14.

First, the substrate web was applied with a 1.2 μm thick ZnO film as the lower electrode 1202 to the surface thereof.

Then, the substrate web was set to the foregoing modified nine film-forming chambered MW-PCVD apparatus. The lower cell 1220 was formed using the first unit comprising the isolated vesseles 500a, 500 and 500b in the same manner as in Film Formation Example 32 and under the conditions shown in Table 22. The middle cell 1221 was formed using the second unit comprising the isolated vessels 400a', 400' and 400b' in the same manner as in Film Formation Example 31 under the conditions shown in Table 22. And the upper cell 1222 was formed using the third unit comprising the isolated vessels 400a", 400" and 400b" in the same manner as in Film Formation Example 33 and under the conditions shown in Table 22.

The product thus obtained was cut off to obtain a plurality of specimens respectively of 35 cm×70 cm in size.

Each of the specimens was applied with a comb shaped Ag film as the collecting electrode 1207 to the surface of the ITO film as the transparent electrode 1206 in the same manner as in Film Formation Example 8.

For each of them, the photovoltaic characteristics were evaluated under irradiation of Am 1.5 light (100 mW/cm$^2$). As a result, every module exhibited a photoelectric conversion efficiency of more than 10.5%. The unevenness with respect to the characteristics among the modules was within 5%.

Further, each module was irradiated with Am 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were appropriately combined to obtain a power supply system. It was found that the resultant system outputs a power of about 3 KW.

TABLE 1

| | |
|---|---|
| raw material gas and its flow rate | $SiH_4$:380 sccm<br>$H_2$:70 sccm |
| microwave frequency and microwave power | 2.45 GHz<br>750 W × 2 |
| spacing L | 3.2 cm |
| inside diameter and width of curved portion | $\phi$ 20 cm, 45 cm |
| inner pressure of the film-forming chamber | 6 mTorr |
| the kind of the substrate web and its thickness | SUS 430BA<br>0.25 mm |
| the size of microwave applicator (inside diameter × length) | $\phi$ 98 mm × 150 mm |
| microwave propagating waveguide | EIAJ, WRI-26 |

TABLE 2

| $\theta_1$(°) | $\theta_2$(°) | $\theta_1 + \theta_2$ (°) | evaluated results |
|---|---|---|---|
| 0 | 0 | 0 | microwave leakage is large, discharge is unstable and noise of the power source is large (abnormal oscillation) |
| 0 | 45 | 45 | microwave leakage is large, discharge is unstable |
| 0 | 90 | 90 | microwave leakage is large, discharge is unstable |
| 15 | 15 | 30 | microwave leakage is medium, discharge is unstable |
| 15 | 45 | 60 | microwave leakage is small, discharge is unstable |
| 15 | 75 | 90 | microwave leakage is small, discharge is unstable |
| 15 | 135 | 150 | microwave leakage is small, discharge is unstable |
| 15 | 165 | 180 | microwave leakage is medium, discharge is unstable and noise of the power source is large (abnormal oscillation) |
| 30 | 30 | 60 | no leakage of microwave, discharge is stable |
| 30 | 60 | 90 | no leakage of microwave, discharge is stable |
| 30 | 105 | 135 | no leakage of microwave, discharge is stable |
| 30 | 150 | 180 | no leakage of microwave discharge is unstable and noise of the power source is large (abnormal oscillation) |
| 45 | 45 | 90 | no leakage of microwave, discharge is stable |
| 45 | 90 | 135 | no leakage of microwave, discharge is stable |
| 45 | 105 | 150 | no leakage of microwave, discharge is stable |
| 45 | 135 | 180 | no leakage of microwave, discharge is unstable and noise of the power source is large (abnormal oscillation) |
| 60 | 60 | 120 | no leakage of microwave, discharge is stable |
| 60 | 75 | 135 | no leakage of microwave, discharge is stable |
| 60 | 90 | 150 | no leakage of microwave, discharge is stable |
| 60 | 120 | 180 | no leakage of microwave, discharge is unstable and noise of the power source is large (abnormal oscillation) |
| 75 | 75 | 150 | no leakage of microwave, discharge is stable |
| 75 | 90 | 165 | no leakage of microwave, discharge is fairly unstable |
| 75 | 105 | 180 | no leakage of microwave, discharge is unstable and noise of the power source is large (abnormal oscillation) |
| 90 | 90 | 180 | no leakage of microwave, discharge is unstable and noise of the power source is large (abnormal oscillation) |

TABLE 3

| specimen No. | spacing L (cm) | inner pressure of film-forming chamber (mTorr) | discharge state | distribution of film thickness (in the width direction) (%) | distribution of film thickness (in the longitudinal direction) (%) |
|---|---|---|---|---|---|
| 1 | 0.4 | 65 | discharge was centralized in the vicinity of the microwave applicator | 1000 ※ | 100 ※ |
| 2 | 0.8 | 28 | discharge was localized in the vicinity of the microwave applicator | 25 | 12 |
| 3 | 1.5 | 12 | discharge is stable | 8 | 7 |
| 4 | 3.5 | 6 | " | 5 | 5 |
| 5 | 5.0 | 4 | " | 7 | 5 |
| 6 | 7.2 | 2 | discharge is unstable (microwave leakage is medium) | 30 | 7 |
| 7 | 10.0 | 1.2 | no discharge (microwave leakage is large) | — | — |

※) no film was formed in the width direction and in the central portion of the substrate web

TABLE 4

| specimen No. | inside diameter of curbed portion (cm) | discharge state | distribution of film thickness (in the width direction) (%) | distribution of film thickness (in the longitudinal direction) (%) |
|---|---|---|---|---|
| 8 | 5.5 | no discharge | — | — |
| 9 | 7 | discharge is unstable | 20 | 12 |
| 10 | 10 | discharge is stable | 10 | 7 |
| 11 | 20 | " | 5 | 5 |
| 12 | 25 | " | 5 | 5 |
| 13 | 35 | discharge is fairly unstable | 12 | 7 |
| 14 | 45 | discharge is unstable | 25 | 12 |

TABLE 5

| inner pressure of the film-forming chamber (mTorr) | raw material gas and its flow rate (sccm) | microwave power (kW) | discharge state |
|---|---|---|---|
| 1.5 | SiH$_4$:100 | 3.0 × 2 | ○ |
| 1.5 | SiH$_4$:100 H$_2$:100 | 3.0 × 2 | Δ |
| 3 | SiH$_4$:100 H$_2$:50 | 2.5 × 2 | ○ |
| 3 | SiH$_4$:100 H$_2$:100 | 2.5 × 2 | Δ |
| 5 | SiH$_4$:10 H$_2$:200 | 1.2 × 2 | ○ |
| 5 | SiH$_4$:300 H$_2$:100 | 0.8 × 2 | ⊙ |
| 5 | SiH$_4$:300 H$_2$:400 | 0.7 × 2 | ○ |
| 5 | SiH$_4$:400 | 0.4 × 2 | ⊙ |
| 10 | SiH$_4$:10 H$_2$:300 | 1.0 × 2 | ○ |
| 10 | SiH$_4$:300 H$_2$:600 | 1.0 × 2 | ⊙ |
| 10 | SiH$_4$:400 | 0.3 × 2 | ⊙ |
| 10 | SiH$_4$:10 H$_2$:800 | 1.0 × 2 | Δ |
| 30 | SiH$_4$:10 | 0.25 × 2 | ⊙ |
| 30 | SiH$_4$:10 H$_2$:300 | 0.7 × 2 | ○ |
| 30 | SiH$_4$:300 H$_2$:300 | 0.6 × 2 | ⊙ |
| 30 | SiH$_4$:300 H$_2$:900 | 0.8 × 2 | ○ |

TABLE 7

| | |
|---|---|
| raw material gas and its flow rate | SiH$_4$:360 sccm H$_2$:50 sccm |
| microwave frequency and microwave power | 2.45 GHz 700 W × 2 |
| spacing L | 3.2 cm |
| inside diameter and width of curved portion | φ 22 cm, 45 cm |
| inner pressure of the film-forming chamber | 6 m Torr |
| the kind of the substrate web and its thickness | SUS 430BA 0.25 mm |
| the size of microwave applicator (inside diameter × length) | φ 98 mm × 150 mm |
| microwave propagating waveguide | EIAJ, WRI-26 |

TABLE 6

| specimen No. | width of the substrate web (cm) | discharge state | distribution of film thickness (in the width direction) (%) | distribution of film thickness (in the longitudinal direction) (%) |
|---|---|---|---|---|
| 15 | 5 | discharge is stable | 3 | 5 |
| 16 | 10 | " | 5 | 7 |
| 17 | 25 | discharge is fairly unstable | 8 | 7 |
| 18 | 35 | discharge is stable | 5 | 5 |
| 19 | 45 | " | 5 | 5 |
| 20 | 60 | discharge is fairly unstable | 10 | 7 |
| 21 | 70 | discharge is unstable | 15 | 10 |

TABLE 8

| wave form | frequency (Hz) | | | | | | | | | | maximum amplitude voltage ($V_{P-P}$) |
|---|---|---|---|---|---|---|---|---|---|---|---|
| | 60 | 400 | 500 | 1.5K | 2K | 500K | 900K | 2M | 2.5M | 4M | |
| 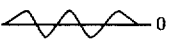 (sine wave) | O | O | O | O | O | O | O | O | X | X | 200 |
| 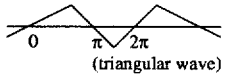 (triangular wave) | O | O | O | O | O | O | O | O | X | X | 220 |
| 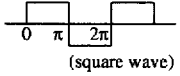 (square wave) | O | O | O | O | O | O | O | O | X | X | 240 |
| 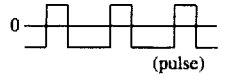 (pulse) | O | O | O | O | O | O | O | O | X | X | 180 |
| 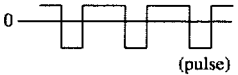 (pulse) | Δ | Δ | Δ | Δ | Δ | Δ | Δ | Δ | X | X | 180 |
| 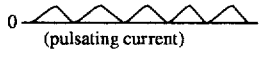 (pulsating current) | O | O | O | O | O | O | O | O | Δ | Δ | 70 |
| 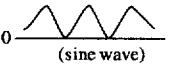 (sine wave) | O | O | O | O | O | O | O | O | Δ | Δ | 200 |

O: good
Δ: practically effective
x: not effective

TABLE 9

| | |
|---|---|
| inside diameter of curbed portion | φ 20 cm |
| spacing L | 3.2 cm |
| the size of microwave applicator (inside diameter × length) | φ 98 mm × 135 mm |
| microwave propagating waveguide | EIAJ, WRI-32 |

TABLE 10

| parameter | isolated vessel 400 |
|---|---|
| film-forming raw material gas and its flow rate (sccm) | SiH$_4$:240<br>H$_2$:80<br>SiF$_4$:8 |
| inner pressure (mTorr) | 6 |
| microwave power (kW) | 0.65 × 2 |
| inside diameter of curved portion (cm) | φ 20 |
| spacing L (cm) | 3.2 |
| the size of microwave applicator (inside diameter × length) | φ 98 mm × 135 mm |
| microwave propagating waveguide | EIAJ, WRI-26 |
| surface temperature of the substrate web (°C) | 210 |

TABLE 11

| parameter | isolated vessel 400-a | isolated vessel 400-b |
|---|---|---|
| film-forming raw material gas and its flow rate (sccm) | SiH$_4$  30<br>H$_2$  100<br>PH$_3$/H$_2$  5 (diluted to 1% by H$_2$ gas)<br>SiF$_4$  3 | SiH$_4$  25<br>H$_2$  250<br>B$_2$H$_6$/H$_2$  20 (diluted to 3000 ppm by H$_2$ gas)<br>SiF$_4$  3 |
| inner pressure (mTorr) | 9 | 8 |
| microwave power (kW) | 0.65 × 2 | 0.75 × 2 |
| inside diameter of curved portion (cm) | φ 10[*] | φ 9[*] |
| spacing L (cm) | 1.0 | 1.0 |
| the size of microwave applicator (inside diameter × length) | φ 95 mm × 125 mm | φ 85 mm × 120 mm |
| microwave propagating waveguide | EIAJ, WRI-26 | EIAJ, WRI-26 |
| surface temperature of the substrate web (°C) | 210 | 200 |

[*] a substrate cover for finely controlling the thickness of a film to be formed was provided in the curved structure.

TABLE 12

| parameter | semiconductor layer Lower Cell | | |
|---|---|---|---|
| | 400-a | 400 | 400-b |
| film-forming raw material gas and its flow rate (sccm) | $SiH_4$  30<br>$H_2$  100<br>$PH_3/H_2$  5<br>(diluted to 1% by $H_2$ gas)<br>$SiF_4$  3 | $SiH_4$  120<br>$GeH_4$  95<br>$H_2$  120<br>$SiF_4$  5 | $SiH_4$  25<br>$H_2$  250<br>$BF_3/H_2$  20<br>(diluted to 3000 ppm by $H_2$ gas)<br>$SiF_4$  3 |
| inner pressure (mTorr) | 9 | 10 | 8 |
| microwave power (kW) | 0.65 × 2 | 0.6 × 2 | 0.75 × 2 |
| inside diameter of curved portion (cm) | ϕ 10*⁾ | ϕ 20 | ϕ 9*⁾ |
| spacing L (cm) | 1.0 | 3.2 | 1.0 |
| the size of microwave applicator (inside diameter × length) | ϕ 95 mm × 125 mm | ϕ 98 mm × 135 mm | ϕ 85 mm × 120 mm |
| microwave propagating waveguide | EIAJ WRI-26 | EIAJ WRI-26 | EIAJ WRI-26 |
| surface temperature of the substrate web (°C.) | 260 | 250 | 240 |
| transportation speed | 55 cm/min | | |

| parameter | semiconductor layer Upper Cell | | |
|---|---|---|---|
| | 400-a' | 400' | 400-b' |
| film-forming raw material gas and its flow rate (sccm) | $SiH_4$  28<br>$H_2$  95<br>$PH_3/H_2$  5<br>(diluted to 1% by $H_2$ gas)<br>$SiF_4$  3 | $SiH_4$  220<br>$H_2$  70<br>$SiF_4$  7 | $SiH_4$  22<br>$H_2$  220<br>$BF_3/H_2$  18<br>(diluted to 3000 ppm by $H_2$ gas)<br>$SiF_4$  2 |
| inner pressure (mTorr) | 9 | 6 | 8 |
| microwave power (kW) | 0.65 × 2 | 0.65 × 2 | 0.75 × 2 |
| inside diameter of curved portion (cm) | ϕ 10*⁾ | ϕ 20 | ϕ 9*⁾ |
| spacing L (cm) | 1.0 | 3.2 | 1.0 |
| the size of microwave applicator (inside diameter × length) | same as in the case of the 400-a | same as in the case of the 400 | same as in the case of the 400-b |
| microwave propagating waveguide | EIAJ WRI-26 | EIAJ WRI-26 | EIAJ WRI-26 |
| surface temperature of the substrate web (°C.) | 240 | 230 | 230 |
| transportation speed | 55 cm/min | | |

*⁾a substrate cover for finely controlling the thickness of a film to be formed was provided in the curved structure.

TABLE 13

| parameter | semiconductor layer Lower Cell | | |
|---|---|---|---|
| | 400-a | 400 | 400-b |
| film-forming raw material gas and its flow rate (sccm) | $SiH_4$  30<br>$H_2$  100<br>$PH_3/H_2$  5<br>(diluted to 1% by $H_2$ gas)<br>$SiF_4$  3 | $SiH_4$  260<br>$H_2$  100<br>$SiF_4$  10 | $SiH_4$  25<br>$H_2$  250<br>$BF_3/H_2$  20<br>(diluted to 3000 ppm by $H_2$ gas)<br>$SiF_4$  3 |
| inner pressure (mTorr) | 9 | 6 | 8 |
| microwave power (kW) | 0.65 × 2 | 0.70 × 2 | 0.75 × 2 |
| inside diameter of curved portion (cm) | ϕ 10*⁾ | ϕ 20 | ϕ 9*⁾ |
| spacing L (cm) | 1.0 | 3.2 | 1.0 |
| the size of microwave applicator (inside diameter × length) | ϕ 95 mm × 125 mm | ϕ 98 mm × 135 mm | ϕ 85 mm × 120 mm |
| microwave propagating waveguide | EIAJ WRI-26 | EIAJ WRI-26 | EIAJ WRI-26 |
| surface temperature of | 270 | 260 | 260 |

TABLE 13-continued

| | | | |
|---|---|---|---|
| the substrate web (°C.) | | | |
| transportation speed | | 52 cm/min | |

| | semiconductor layer Upper Cell | | |
|---|---|---|---|
| parameter | 400-a' | 400' | 400-b' |
| film-forming raw material gas and its flow rate (sccm) | $SiH_4$ 28<br>$H_2$ 95<br>$PH_3/H_2$ 5<br>(diluted to 1% by $H_2$ gas)<br>$SiF_4$ 3 | $SiH_4$ 180<br>$CH_4$ 25<br>$H_2$ 400<br>$SiF_4$ 10 | $SiH_4$ 22<br>$H_2$ 220<br>$BF_3/H_2$ 18<br>(diluted to 3000 ppm by $H_2$ gas)<br>$SiF_4$ 2 |
| inner pressure (mTorr) | 9 | 23 | 8 |
| microwave power (kW) | 0.65 × 2 | 1.3 × 2 | 0.75 × 2 |
| inside diameter of curved portion (cm) | φ 10*⁾ | φ 20 | φ 9*⁾ |
| spacing L (cm) | 1.0 | 3.2 | 1.0 |
| the size of microwave applicator (inside diameter × length) | same as in the case of the 400-a | same as in the case of the 400 | same as in the case of the 400-b |
| microwave propagating waveguide | EIAJ WRI-26 | EIAJ WRI-26 | EIAJ WRI-26 |
| surface temperature of the substrate web (°C.) | 250 | 250 | 240 |
| transportation speed | | 52 cm/min | |

*⁾a substrate cover for finely controlling the thickness of a film to be formed was provided in the curved structure.

TABLE 14

| | semiconductor layer Lower Cell | | |
|---|---|---|---|
| parameter | 300-a | 300 | 300-b |
| film-forming raw material gas and its flow rate (sccm) | $SiH_4$ 30<br>$H_2$ 100<br>$PH_3/H_2$ 5<br>(diluted to 1% by $H_2$ gas)<br>$SiF_4$ 3 | $SiH_4$ 130<br>$GeH_4$ 100<br>$H_2$ 150<br>$SiF_4$ 5 | $SiH_4$ 25<br>$H_2$ 250<br>$BF_3/H_2$ 20<br>(diluted to 3000 ppm by $H_2$ gas)<br>$SiF_4$ 3 |
| inner pressure (mTorr) | 9 | 11 | 8 |
| microwave power (kW) | 0.65 × 2 | 0.65 × 2 | 0.75 × 2 |
| inside diameter of curved portion (cm) | φ 10*⁾ | φ 22 | φ 9*⁾ |
| spacing L (cm) | 1.0 | 3.5 | 1.2 |
| the size of microwave applicator (inside diameter × length) | φ 95 mm × 125 mm | φ 98 mm × 135 mm | φ 85 mm × 120 mm |
| microwave propagating waveguide | EIAJ WRI-26 | EIAJ ERI-32 | EIAJ WRI-26 |
| surface temperature of the substrate web (°C.) | 280 | 280 | 270 |
| transportation speed | | 54 cm/min | |

| | semiconductor layer Middle Cell | | |
|---|---|---|---|
| parameter | 300-a' | 300' | 300-b' |
| film-forming raw material gas and its flow rate (sccm) | $SiH_4$ 28<br>$H_2$ 95<br>$PH_3/H_2$ 5<br>(diluted to 1% by $H_2$ gas)<br>$SiF_4$ 3 | $SiH_4$ 250<br>$H_2$ 90<br>$SiF_4$ 8 | $SiH_4$ 22<br>$H_2$ 220<br>$BF_3/H_2$ 18<br>(diluted to 3000 ppm by $H_2$ gas)<br>$SiF_4$ 2 |
| inner pressure (mTorr) | 8 | 7 | 8 |
| microwave power (kW) | 0.65 × 2 | 0.70 × 2 | 0.75 × 2 |
| inside diameter of curved portion (cm) | φ 10*⁾ | φ 20 | φ 9*⁾ |
| spacing L (cm) | 1.0 | 3.5 | 1.0 |
| the size of microwave applicator (inside | same as in the case of the 300-a | same as in the case of the 300 | same as in the case of the 300-b |

TABLE 14-continued

| | | | |
|---|---|---|---|
| diameter × length) | | | |
| microwave propagating waveguide | EIAJ WRI-26 | EIAJ ERI-32 | EIAJ WRI-26 |
| surface temperature of the substrate web (°C.) | 270 | 260 | 260 |
| transportation speed | | 54 cm/min | |

| | semiconductor layer Upper Cell | | |
|---|---|---|---|
| parameter | 300-a" | 300" | 300-b" |
| film-forming raw material gas and its flow rate (sccm) | SiH₄ 26  H₂ 90  PH₃/H₂ 4 (diluted to 1% by H₂ gas)  SiF₄ 3 | SiH₄ 185  CH₄ 27  H₂ 400  SiF₄ 10 | SiH₄ 20  H₂ 200  BF₃/H₂ 16 (diluted to 3000 ppm by H₂ gas)  SiF₄ 2 |
| inner pressure (mTorr) | 8 | 22 | 7 |
| microwave power (kW) | 0.65 × 2 | 1.3 × 2 | 0.70 × 2 |
| inside diameter of curved portion (cm) | φ 10*⁾ | φ 18 | φ 9*⁾ |
| spacing L (cm) | 1.0 | 3.2 | 1.2 |
| the size of microwave applicator (inside diameter × length) | same as in the case of the 300-a | same as in the case of the 300 | same as in the case of the 300-b |
| microwave propagating waveguide | EIAJ WRI-26 | EIAJ WRI-26 | EIAJ WRI-26 |
| surface temperature of the substrate web (°C.) | 250 | 250 | 240 |
| transportation speed | | 54 cm/min | |

*⁾a substrate cover for finely controlling the thickness of a film to be formed was provided in the curved structure.

TABLE 15

| | | |
|---|---|---|
| inside diameter of curbed portion | φ 22 cm | |
| spacing L | 3.2 cm | 35 |
| the size of microwave applicator (inside diameter × length) | φ 98 mm × 135 mm | |
| microwave propagating waveguide | EIAJ, WRI-32 | |

TABLE 16

| | Bias Voltage | | film-forming conditions | the manner | |
|---|---|---|---|---|---|
| Production example No. | wave form | frequency (Hz) | maximum amplitude voltage (V_{P-P}) | (other than the bias voltage) | of applying a bias voltage | evaluated results |
| 20 | sine wave | 2K | 180 | same as in the case of Production example 14 | the manner shown in FIG. 15(b) | a few abnormal growth, excellent characteristics |
| 21 | pulse | 500 | 140 (reference voltage −30 V) | same as in the case of Production example 15 | the manner shown in FIG. 15(c) | a few abnormal growth, excellent characteristics |
| 22 | triangular wave | 10K | 200 | same as in the case of Production example 16 | the manner shown in FIG. 15(a) | a few abnormal growth, excellent characteristics |
| 23 | pulsating current | 60 | 65 | same as in the case of Production example 17 | the manner shown in FIG. 15(c) | excellent characteristics |
| 24 | sine wave | 20K | 120 (reference voltage 0 V) | same as in the case of Production example 18 | the manner shown in FIG. 15(b) | a few abnormal growth, excellent characteristics |

Note:
a nickel bar was used as the bias bar

TABLE 17

| Production example No. | Bias Voltage wave form | frequency (Hz) | maximum amplitude voltage ($V_{P-P}$) | film-forming conditions (other than the bias voltage) | the manner of applying a bias voltage | evaluated results |
|---|---|---|---|---|---|---|
| 25 | pulse | 1K | 150 (reference voltage −30 V) | same as in the case of Production example 14 | the manner shown in FIG. 15(d) | a few abnormal growth, excellent characteristics |
| 26 | sine wave | 2K | 160 (reference voltage 0 V) | same as in the case of Production example 15 | the manner shown in FIG. 15(d) | a few abnormal growth, excellent characteristics |
| 27 | pulsating current | 400 | 65 | same as in the case of Production example 16 | the manner shown in FIG. 15(d) | excellent characteristics |
| 28 | sine wave | 500 | 180 | same as in the case of Production example 17 | the manner shown in FIG. 15(d) | a few abnormal growth, excellent characteristics |
| 29 | triangular wave | 1.5K | 180 | same as in the case of Production example 18 | the manner shown in FIG. 15(d) | a few abnormal growth, excellent characteristics |

Note:
a nickel bar was used as the bias bar

TABLE 18

| parameter | isolated vessel 500 |
|---|---|
| film-forming raw material gas and its flow rate (sccm) | $SiH_4$:260 $H_2$:90 $SiF_4$:8.5 |
| inner pressure (mTorr) | 5.5 |
| microwave power (kW) | 0.60 × 2 |
| inside diameter of curved portion (cm) | φ 22 |
| spacing L (cm) | 3.2 |
| the size of microwave applicator (inside diameter × length) | φ 98 mm × 135 mm |
| microwave propagating waveguide | EIAJ, WRI-26 |
| surface temperature of the substrate web (°C.) | 210 |
| bias voltage | square wave, 500 Hz 180 $V_{P-P}$ |

Note:
as the bias voltage applying means, one shown in FIG. 15(b) was used.

TABLE 19

| parameter | isolated vessel 500-a | 500-b |
|---|---|---|
| film-forming raw material gas and its flow rate (sccm) | $SiH_4$ 32 $H_2$ 100 $PH_3/H_2$ 5 (diluted to 1% by $H_2$ gas) $SiF_4$ 3 | $SiH_4$ 27 $H_2$ 250 $B_2H_6/H_2$ 20 (diluted to 3000 ppm by $H_2$ gas) $SiF_4$ 3 |
| inner pressure (mTorr) | 8.5 | 7.5 |
| microwave power (kW) | 0.63 × 2 | 0.72 × 2 |
| inside diameter of curved portion (cm) | φ 10[*)] | φ 9[*)] |
| spacing L (cm) | 1.0 | 1.0 |
| the size of microwave applicator (inside diameter × length) | φ 95 mm × 125 mm | φ 85 mm × 120 mm |
| microwave propagating waveguide | EIAJ, WRI-26 | EIAJ, WRI-26 |
| surface temperature of the substrate web (°C.) | 210 | 200 |
| DC bias voltage | 80 V/7.2 A | 90 V/7.8 A |

[*)]a substrate cover for finely controlling the thickness of a film to be formed was provided in the curved structure.

TABLE 20

| parameter | semiconductor layer Lower Cell | | |
|---|---|---|---|
| | 500-a | 500 | 500-b |
| film-forming raw material gas and its flow rate (sccm) | SiH₄ 31<br>H₂ 100<br>PH₃/H₂ 5<br>(diluted to 1% by H₂ gas)<br>SiF₄ 3 | SiH₄ 122<br>GeH₄ 98<br>H₂ 120<br>SiF₄ 5 | SiH₄ 26<br>H₂ 250<br>BF₃/H₂ 20<br>(diluted to 3000 ppm by H₂ gas)<br>SiF₄ 3 |
| inner pressure (mTorr) | 8.5 | 9.5 | 7.5 |
| microwave power (kW) | 0.62 × 2 | 0.58 × 2 | 0.72 × 2 |
| inside diameter of curved portion (cm) | φ 10*⁾ | φ 22 | φ 9*⁾ |
| spacing L (cm) | 1.0 | 3.2 | 1.0 |
| the size of microwave applicator (inside diameter × length) | φ 95 mm × 125 mm | φ 98 mm × 135 mm | φ 85 mm × 120 mm |
| microwave propagating waveguide | EIAJ WRI-26 | EIAJ WRI-26 | EIAJ WRI-26 |
| surface temperature of the substrate web (°C.) | 260 | 250 | 240 |
| bias voltage | DC, 70 V/6 A | DC, 50 V/6.4 A | DC, 110 V/7.2 A |
| transportation speed | | 65 cm/min | |

| parameter | semiconductor layer Upper Cell | | |
|---|---|---|---|
| | 500-a' | 500' | 500-b' |
| film-forming raw material gas and its flow rate (sccm) | SiH₄ 29<br>H₂ 95<br>PH₃/H₂ 5<br>(diluted to 1% by H₂ gas)<br>SiF₄ 3 | SiH₄ 230<br>H₂ 75<br>SiF₄ 7 | SiH₄ 23<br>H₂ 220<br>BF₃/H₂ 18<br>(diluted to 3000 ppm by H₂ gas)<br>SiF₄ 2 |
| inner pressure (mTorr) | 8.5 | 5.5 | 7.5 |
| microwave power (kW) | 0.62 × 2 | 0.62 × 2 | 0.72 × 2 |
| inside diameter of curved portion (cm) | φ 10*⁾ | φ 22 | φ 9*⁾ |
| spacing L (cm) | 1.0 | 3.2 | 1.0 |
| the size of microwave applicator (inside diameter × length) | same as in the case of the 500-a | same as in the case of the 500 | same as in the case of the 500-b |
| microwave propagating waveguide | EIAJ WRI-26 | EIAJ WRI-26 | EIAJ WRI-26 |
| surface temperature of the substrate web (°C.) | 240 | 230 | 230 |
| bias voltage | DC, 70 V/6 A | 500 Hz square wave 170 V$_{p-p}$ | DC, 110 V/7.1 A |
| transportation speed | | 65 cm/min | |

*⁾a substrate cover for finely controlling the thickness of a film to be formed was provided in the curved structure.

TABLE 21

| parameter | semiconductor layer Lower Cell | | |
|---|---|---|---|
| | 500-a | 500 | 500-b |
| film-forming raw material gas and its flow rate (sccm) | SiH₄ 31<br>H₂ 100<br>PH₃/H₂ 5<br>(diluted to 1% by H₂ gas)<br>SiF₄ 3 | SiH₄ 280<br>H₂ 100<br>SiF₄ 10 | SiH₄ 27<br>H₂ 250<br>BF₃/H₂ 20<br>(diluted to 3000 ppm by H₂ gas)<br>SiF₄ 3 |
| inner pressure (mTorr) | 8.5 | 5.5 | 7.5 |
| microwave power (kW) | 0.63 × 2 | 0.68 × 2 | 0.73 × 2 |
| inside diameter of curved portion (cm) | φ 10*⁾ | φ 22 | φ 9*⁾ |
| spacing L (cm) | 1.0 | 3.2 | 1.0 |
| the size of microwave applicator (inside | φ 95 mm × 125 mm | φ 98 mm × 135 mm | φ 85 mm × 120 mm |

TABLE 21-continued

| | | | |
|---|---|---|---|
| diameter × length) | | | |
| microwave propagating waveguide | EIAJ WRI-26 | EIAJ WRI-26 | EIAJ WRI-26 |
| surface temperature of the substrate web (°C.) | 270 | 260 | 260 |
| bias voltage | DC, 70 V/6 A | 500K Hz sine wave 180 $V_{p\text{-}p}$ | DC, 110 V/7.1 A |
| transportation speed | | 68 cm/min | |

| | semiconductor layer Upper Cell | | |
|---|---|---|---|
| parameter | 500-a' | 500' | 500-b' |
| film-forming raw material gas and its flow rate (sccm) | SiH$_4$  30<br>H$_2$  95<br>PH$_3$/H$_2$  5<br>(diluted to 1% by H$_2$ gas)<br>SiF$_4$  3 | SiH$_4$  185<br>CH$_4$  30<br>H$_2$  400<br>SiF$_4$  10 | SiH$_4$  24<br>H$_2$  220<br>BF$_3$/H$_2$  18<br>(diluted to 3000 ppm by H$_2$ gas)<br>SiF$_4$  2 |
| inner pressure (mTorr) | 8.5 | 22 | 7.5 |
| microwave power (kW) | 0.63 × 2 | 1.2 × 2 | 0.73 × 2 |
| inside diameter of curved portion (cm) | φ 10*⁾ | φ 22 | φ 9*⁾ |
| spacing L (cm) | 1.0 | 3.2 | 1.0 |
| the size of microwave applicator (inside diameter × length) | same as in the case of the 500-a | same as in the case of the 500 | same as in the case of the 500-b |
| microwave propagating waveguide | EIAJ WRI-26 | EIAJ WRI-26 | EIAJ WRI-26 |
| surface temperature of the substrate web (°C.) | 250 | 250 | 240 |
| bias voltage | DC, 70 V/6 A | 1M Hz pulse 165 $V_{p\text{-}p}$ (reference voltage −20 V) | DC, 110 V/7.2 A |
| transportation speed | | 68 cm/min | |

*⁾a substrate cover for finely controlling the thickness of a film to be formed was provided in the curved structure.

TABLE 22

| | semiconductor layer Lower Cell | | |
|---|---|---|---|
| parameter | 500-a | 500 | 500-b |
| film-forming raw material gas and its flow rate (sccm) | SiH$_4$  32<br>H$_2$  100<br>PH$_3$/H$_2$  5<br>(diluted to 1% by H$_2$ gas)<br>SiF$_4$  3 | SiH$_4$  135<br>GeH$_4$  110<br>H$_2$  150<br>SiF$_4$  5 | SiH$_4$  26<br>H$_2$  250<br>BF$_3$/H$_2$  20<br>(diluted to 3000 ppm by H$_2$ gas)<br>SiF$_4$  3 |
| inner pressure (mTorr) | 8.5 | 10.5 | 7.5 |
| microwave power (kW) | 0.62 × 2 | 0.60 × 2 | 0.72 × 2 |
| inside diameter of curved portion (cm) | φ 10*⁾ | φ 22.5 | φ 9*⁾ |
| spacing L (cm) | 1.0 | 3.5 | 1.2 |
| the size of microwave applicator (inside diameter × length) | φ 95 mm × 125 mm | φ 98 mm × 135 mm | φ 85 mm × 120 mm |
| microwave propagating waveguide | EIAJ WRI-26 | EIAJ ERI-32 | EIAJ WRI-26 |
| surface temperature of the substrate web (°C.) | 280 | 280 | 270 |
| bias voltage | 1M Hz pulse 180 $V_{p\text{-}p}$ (reference voltage −20 V) | DC, 50 V/6.5 A | DC, 110 V/7 A |
| transportation speed | | 69 cm/min | |

TABLE 22-continued

| parameter | semiconductor layer Middle Cell | | |
|---|---|---|---|
| | 500-a' | 500' | 500-b' |
| film-forming raw material gas and its flow rate (sccm) | $SiH_4$ 29<br>$H_2$ 95<br>$PH_3/H_2$ 5<br>(diluted to 1% by $H_2$ gas)<br>$SiF_4$ 3 | $SiH_4$ 260<br>$H_2$ 90<br>$SiF_4$ 8 | $SiH_4$ 23<br>$H_2$ 220<br>$BF_3/H_2$ 18<br>(diluted to 3000 ppm by $H_2$ gas)<br>$SiF_4$ 2 |
| inner pressure (mTorr) | 7.5 | 6.5 | 7.5 |
| microwave power (kW) | 0.63 × 2 | 0.68 × 2 | 0.72 × 2 |
| inside diameter of curved portion (cm) | φ 10*⁾ | φ 22 | φ 9*⁾ |
| spacing L (cm) | 1.0 | 3.5 | 1.0 |
| the size of microwave applicator (inside diameter × length) | same as in the case of the 500-a | same as in the case of the 500 | same as in the case of the 500-b |
| microwave propagating waveguide | EIAJ WRI-26 | EIAJ ERI-32 | EIAJ WRI-26 |
| surface temperature of the substrate web (°C.) | 270 | 260 | 260 |
| bias voltage | 1K Hz pulse 180 $V_{p-p}$ (reference voltage −20 V) | DC, 80 V/6.9 A | 1M Hz sine wave 160 $V_{p-p}$ |
| transportation speed | 69 cm/min | | |

| parameter | semiconductor layer Upper Cell | | |
|---|---|---|---|
| | 500-a" | 500" | 500-b" |
| film-forming raw material gas and its flow rate (sccm) | $SiH_4$ 28<br>$H_2$ 90<br>$PH_3/H_2$ 4<br>(diluted to 1% by $H_2$ gas)<br>$SiF_4$ 3 | $SiH_4$ 190<br>$CH_4$ 30<br>$H_2$ 400<br>$SiF_4$ 10 | $SiH_4$ 22<br>$H_2$ 200<br>$BF_3/H_2$ 16<br>(diluted to 3000 ppm by $H_2$ gas)<br>$SiF_4$ 2 |
| inner pressure (mTorr) | 7.5 | 21 | 6.5 |
| microwave power (kW) | 0.63 × 2 | 1.2 × 2 | 0.67 × 2 |
| inside diameter of curved portion (cm) | φ 10*⁾ | φ 19 | φ 9*⁾ |
| spacing L (cm) | 1.0 | 3.2 | 1.2 |
| the size of microwave applicator (inside diameter × length) | same as in the case of the 500-a | same as in the case of the 500 | same as in the case of the 500-b |
| microwave propagating waveguide | EIAJ WRI-26 | EIAJ WRI-26 | EIAJ WRI-26 |
| surface temperature of the substrate web (°C.) | 250 | 250 | 240 |
| bias voltage | DC, 70 V/6 A | 1.5K Hz square wave 190 $V_{p-p}$ | 500 Hz pulse 140 $V_{p-p}$ (reference voltage 0 V) |
| transportation speed | 69 cm/min | | |

*⁾a substrate cover for finely controlling the thickness of a film to be formed was provided in the curved structure.

What we claimed is:

1. A method for continuously forming a functional deposited film by a microwave plasma chemical vapor deposition process, which comprises:

continuously moving a substrate web supported by an internal supporting means in the longitudinal direction while guiding said substrate web by means of a guiding and internal supporting means for said substrate web;

establishing a substantially enclosed film-forming chamber having a film-forming space by curving and projecting said moving substrate web by means of said guiding and internal supporting means to form a columnar portion to be the cylindrical wall of said film-forming chamber and;

introducing a film-forming raw material gas through a gas feed means into said film-forming space while simultaneously radiating microwaves using a microwave applicator means into said film-forming space and directing said microwaves in a direction that is substantially parallel to a width direction of the substrate web and perpendicular to the circumference of the cylindrical wall of said film-forming chamber to generate a microwave plasma in said film-forming space, said plasma being confined in said film-forming space and maintaining the film-forming space at a pressure which is lower than atmospheric pressure such that the inside of said film-forming chamber communicates with the space outside said film-forming chamber, thereby continuously forming a functional deposited film on the inner face of said continuously moving cylindrical wall which is exposed to said plasma.

2. The method according to claim 1, wherein the columnar portion is formed by curving the moving substrate web by means of a pair transporting rollers while leaving a spacing in the longitudinal direction of the substrate web between said pair of rollers.

3. The method according to claim 1, wherein said microwave applicator means is provided to at least one side face of the film-forming chamber.

4. The method according to claim 1, wherein the microwave energy is radiated through a microwave transmissive member fixed to the microwave applicator means into the film-forming chamber.

5. The method according to claim 4, wherein the microwave transmissive member is hermetically connected to at least one side face of the film-forming chamber.

6. The method according to claim 1, wherein at least a first microwave applicator means is provided to one of the side faces of the film-forming chamber and at least a second microwave applicator means is provided to the other side face of the film-forming chamber.

7. The method according to claim 6, wherein said at least first microwave applicator means is connected to one side face of the film-forming chamber and said second microwave applicator means is connected to the opposite side face of the film-forming chamber such that said first microwave applicator means does not receive microwaves radiated from said second microwaves applicator means and said second microwave applicator means does not receive microwave radiated from said first microwave applicator means.

8. The method according to claim 1, wherein said microwaves radiated into the film-forming space are prevented from leaking out of the film-forming chamber.

9. The method according to clam 1, wherein the surface of the substrate web is electorconductive.

10. The method according to claim 1, wherein the microwave applicator means contains a rectangular waveguide or an elliptical waveguide.

11. The method according to claim 10, wherein at least a first microwave applicator means containing a first waveguide is provided to one of the faces of the film-forming chamber and at least a second microwave applicator means containing a second waveguide is provided to the other side face of the film-forming chamber, said first and second waveguides being selected from the group consisting of a rectangular waveguide and an elliptical waveguide.

12. The method according to claim 11, wherein said at least first microwave applicator means is connected to one side face of the film-forming chamber and said at least second microwave applicator means is connected to an opposite surface of the film-forming chamber such that a face containing the major edge or the major axis of said first waveguide of said at least first microwave applicator means is not in parallel to a face containing the major edge or the major axis of the waveguide of said at least second microwave applicator means.

13. The method according to claim 1, which further comprises a step of adjusting the potential of the microwave plasma.

14. The method according to claim 13, wherein the step of adjusting the potential of the microwave plasma is carried out by using a voltage means isolated from the substrate web.

15. The method according to claim 14, wherein a voltage means is placed in the film-forming space such that at least part of said means comes to contact with the microwave plasma generated.

16. The method according to claim 15, wherein a voltage of DC or AC is further applied onto the voltage means.

17. The method according to claim 15, wherein a pulsating voltage is further applied onto the voltage means.

18. The method according to claim 14, wherein the voltage means serves also as the gas feed means.

19. The method according to claim 14, wherein the voltage means comprises one or more bias bars.

20. The method according to claim 13, wherein the step of adjusting the potential of the microwave plasma is carried out by applying a voltage onto the substrate web.

21. The method according to claim 20, wherein the gas feed means is electrically grounded and is placed in the film-forming space such that at least part of said means comes to contact with the microwave plasma generated.

* * * * *

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMNM 1

Line 24, "as" should read --as a--.
    Line 30, "the" should be deleted.
    Line 37, "occurence" " should read --occurrences--.
    Line 38, "on" should read --of--.
    Line 49, "to" should be deleted.

COLUMN 2

Line 7, "the" should be deleted.

COLUMN 3

Line 17, "the" (first occurrence) should be deleted.
    Line 66, "portions" should read --portion--.

COLUMN 4

Line 14, "utilizes" should read --utilizes a--.
    Line 46, "any" should read --each--.

COLUMN 5

Line 23, "discloses:" should read --discloses--.
    Line 41, "that:" should read --that--.
    Line 57, "proposal" should read --proposed--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 6

Line 10, "before hand such that" should read --beforehand such as,--.
Line 18, "Further in addition," should read --In addition,--.
Line 25, "space" should read --space,--.
Line 36, "any" should read --none--.
Line 37, "method is not" should read --methods is--.
Line 41, "was," should read --was--.
Line 60, "enable to continuously deposit" should read --enables continuously depositing--.

COLUMN 7

Line 3, "to mass-produce" should read --mass-producing--.
Line 20, "to" should be deleted.
Line 56, "substrate" should read --substrate web--.

COLUMN 8

Line 44, "film The" should read --film. The--.

COLUMN 11

Line 40, "contacted" should read --contact--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 12

Line 23, "supportingly" should read --supporting and curving--.
Line 24, "1 moved" should read --moving--.
Line 32, "be" should read --to be--.

COLUMN 13

Line 42, "in" should read --an--.
Line 57, "Enbodiment" should read --Embodiment--.

COLUMN 14

Line 58, "wave as" should read --wave--.

COLUMN 15

Line 18, "those" should read --those pressures--.

COLUMN 17

Line 5, "gas" (second occurrence) should read --gases--.
Line 9, "SiH$_4$gas" should read --SiH$_4$ gas--.
Line 55, "effect" should read --affect--.
Line 56, "to" should be deleted.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.     Page 4 of 13

It is certified that error appears in the above-indentified patent and that said Letters Patent is hereby corrected as shown below:

COLUMN 19

Line 20, "surving" should read --serving--.
   Line 33, "tungusten" should read --tungsten--.
   Line 58, "supportingly" should read --supporting and--.

COLUMN 20

Line 53, "Table" should read --Table 8--.

COLUMN 21

Line 2, "potential" should read --potential can--.
   Line 3, "can be" should be deleted.
   Line 31, "a" should read --an--.
   Line 49, "surving" should read --serving--.

COLUMN 22

Line 42, "Firstly," should read --First,--.
   Line 44, "to stably maintain" should read --stably maintaining--.
   Line 56, "to attain" should read --attaining--.

COLUMN 23

Line 13, "supportingly" should read --supporting and--.

COLUMN 24

Line 37, "TE mode," should read --$TE_{10}$ mode,--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 25

Line 5, "supporting," should read --supporting--.
Line 18, "to" should read --to the--.
Line 39, "less ½" should read --less than ½--.

COLUMN 26

Line 33, "columnar" should read --columnar shape--.

COLUMN 27

Line 1, "is" should be deleted.
Line 4, "as to" should read --as to the--.
line 41, "provided" should read --provided such--.

COLUMN 28

Line 5, "is" (second occurrence) should read --be--.
Line 9, ".such" should read --such--.
Line 45, "fill-forming" should read --film-forming--.
Line 46, "fill-forming" should read --film-forming--.

COLUMN 29

Line 1, "supporting" should read --supporting,--.

COLUMN 30

Line 60, "chamber" should read --chambers--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 32

Line 19, "to" should be deleted.
Line 22, "The" should read --Each of the--.
Line 60, "developes" should read --develops--.
Line 63, "and" should be deleted and "corrosin" should read --corrosion--.

COLUMN 33

Line 5, "of one" should read --of one of--.
Line 26, "to to" should read --to--.
Line 48, "determine" should read --determines--.

COLUMN 34

Lines 24-25, "$S_nO_2-In_2O_3(ITO)$" should read --$S_nO_2-In_2O_3(ITO)$--.
Line 28, "intermitently" should read --intermittently--.

COLUMN 35

Line 38, "member," should read --member;--.

COLUMN 37

Line 25, "to" should be deleted.
Line 64, "perforation each perforations," should read --perforations, each perforation--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 38

Line 31, "sources. A" should read --sources, a--.

COLUMN 39

Line 14, "one" should read --one of--.
Line 17, "to of preventing" should read --to prevent-.
Line 31, "have be" should read --have been--.

COLUMN 40

Line 59, "taking-up" should read --taking up--.
Line 62, "fluorine containing" should read --fluorine-containing--.

COLUMN 41

Line 35, "roller" should read --rollers--.

COLUMN 42

Line 9, "aparted" should read --parted--.
Lines 36-37, "semiconductor film as hydrides," should read --semiconductor film such as hydrides,--.

COLUMN 43

Line 10, "supported" should read --supported,--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 45

Line 5, "prismatic - shaped" should read --prismatic-shaped--.
Line 7, "maybe be" should read --may be--.
Line 10, "may" should read --may be--.
Line 27, "a" should read --an--.

COLUMN 47

Line 11, "supported" should read --supported,--.
Line 12, "supportingly" should read --supporting--.
Line 55, "218" should read --218 is--.

COLUMN 48

Line 57, "may" should read --may be--.

COLUMN 49

Line 32, "chamber" should read --chambers--.

COLUMN 52

Line 31, "or/and" should read --and/or--.
Line 65, "to mass-produce" should read --mass-producing--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 53

Line 12, "following:." should read --following:--.
Lines 16-17, "member is used or an opaque member" should read --member or an opaque member is used--.
Line 45, "element in" should read --element. In--.

COLUMN 54

Line 35, "be" should read --is--.
Line 37, "be" should read --is--.

COLUMN 55

Line 32, "web." should read --web--.

COLUMN 59

Line 11, "supportingly" should read --supporting--.

COLUMN 60

Line 43, "a" (second occurrence) should read --an--.

COLUMN 62

Line 65, "Firstly," should read --First,--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 63

Line 10, "a" should read --an--.
Lines 40-41, "configulation" should read --configuration--.
Line 41, "used" should read --prepared--.
Line 60, "a" should read --an--.

COLUMN 64

Line 25, "configulation" should read --configuration--.

COLUMN 66

Line 43, "a" should read --an--.

COLUMN 67

Line 35, "spins/cm" should read --spins/cm$^3$--.
Line 45, "Tort." should read --Torr.--.

COLUMN 68

Line 42, "cm$^{-1}$" (first occurrence) should read --cm$^{-1}$, and--.
Line 56, "Format ion" should read --Formation--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

It is certified that error appears in the above-indentified patent and that said Letters Patent is hereby corrected as shown below:

COLUMN 69

Line 15, "found:" should read --found.--.
Line 18, "$cm^{-1}$," should read --$cm^{-1}$, and at--.
Line 19, "a" should read --an--.
Line 41, "of," should read --was provided,--.
Line 43, "a" (first occurrence) should read --at--.
Line 59, "found:" should read --found.--.
Line 62, "$cm^{-1}$" (first occurrence) should read --$cm^{-1}$,--.

COLUMN 70

Line 53, "there was provided" should be deleted.

COLUMN 71

Line 32, "the" (second occurrence) should be deleted.
Line 40, "later" should read --layer--.
Line 56, "flown." should read --flowed.--.

COLUMN 72

Line 7, "a" should read --an--.
Line 19, "formation" should read --Formation--.
Line 26, "a" (second occurrence) should read --an--.
Line 49, "was" should read --were--.

COLUMN 73

Line 4, "a of" should read --a plurality of--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.

Page 12 of 13

It is certified that error appears in the above-indentified patent and that said Letters Patent is hereby corrected as shown below:

COLUMN 74

Line 8, "in stead" should read --instead--.
Line 37, "obtained" should read --obtained in--.
Line 62, "vesseles" should read --vessels--.

COLUMN 75

Line 1, "a" should read --an--.
Line 39, "Format" should read --Format- --.
Line 51, "a" should read --an--.

COLUMN 76

Line 24, "connected" should read --connected to--.

COLUMN 77

Line 44, "microwave" should read --microwave,--.

COLUMN 79

Line 5, "curbed" should read --curved--.

COLUMN 81

Line 37, "curbed" should read --curved--.

COLUMN 87

Line 34, "curbed" should read --curved--.

UNITED STATES PATENT AND TRADEMARK OFFICE
CERTIFICATE OF CORRECTION

PATENT NO. : 5,510,151
DATED : April 23, 1996
INVENTOR(S) : JINSHO MATSUYAMA ET AL.     Page 13 of 13

It is certified that error appears in the above-indentified patent and that said Letters Patent is hereby corrected as shown below:

<u>COLUMN 93</u>

Line 59, "1M Hz" should read --1K Hz--.

<u>COLUMN 95</u>

Line 53, "claimed" should read --claim--.
Line 67, "chamber and;" should read --chamber; and--.

<u>COLUMN 97</u>

Line 5, "pair" should read --pair of--.
Line 29, "microwaves" should read --microwave--.
Line 30, "microwave" (second occurrence) --microwaves--.
Line 36, "electorconductive." should read --electroconductive.--.

<u>COLUMN 98</u>

Line 36, "the" (first occurrence) should read --a--.

Signed and Sealed this

Tenth Day of December, 1996

Attest:

BRUCE LEHMAN

Attesting Officer    Commissioner of Patents and Trademarks